(12) United States Patent
Otake

(10) Patent No.: US 11,398,769 B2
(45) Date of Patent: Jul. 26, 2022

(54) SEMICONDUCTOR DEVICE COMPRISING SWITCHING ELEMENTS AND CAPACITORS

(71) Applicant: ROHM CO., LTD., Kyoto (JP)

(72) Inventor: Hirotaka Otake, Kyoto (JP)

(73) Assignee: ROHM CO., LTD., Kyoto (JP)

(*) Notice: Subject to any disclaimer, the term of this patent is extended or adjusted under 35 U.S.C. 154(b) by 92 days.

(21) Appl. No.: 16/954,817

(22) PCT Filed: Jan. 17, 2019

(86) PCT No.: PCT/JP2019/001359
§ 371 (c)(1),
(2) Date: Jun. 17, 2020

(87) PCT Pub. No.: WO2019/163343
PCT Pub. Date: Aug. 29, 2019

(65) Prior Publication Data
US 2021/0099071 A1      Apr. 1, 2021

(30) Foreign Application Priority Data

Feb. 23, 2018  (JP) ............................. JP2018-031148

(51) Int. Cl.
*H01L 25/16*  (2006.01)
*H02M 1/08*  (2006.01)
(Continued)

(52) U.S. Cl.
CPC .............. *H02M 1/08* (2013.01); *H01L 25/16* (2013.01); *H01L 25/18* (2013.01); *H02M 7/003* (2013.01);
(Continued)

(58) Field of Classification Search
CPC ...... H02M 1/08; H02M 1/0054; H02M 7/003; H02M 7/53871; H01L 25/16; H01L 25/18;
(Continued)

(56) References Cited

U.S. PATENT DOCUMENTS

| 10,200,028 B2* | 2/2019 | Laven .................... H01L 25/072 |
| 2019/0181854 A1* | 6/2019 | Shimomura ............ H02M 1/08 |
| 2020/0035656 A1* | 1/2020 | Miyazaki ............... H01L 25/072 |

FOREIGN PATENT DOCUMENTS

| JP | 2008017237 | 1/2008 |
| JP | 2013099133 | 5/2013 |

(Continued)

OTHER PUBLICATIONS

International Search Report and Written Opinion issued for International Patent Application No. PCT/JP2019/001359, dated Apr. 2, 2019, 13 pages including English translation of Search Report.

(Continued)

*Primary Examiner* — Adolf D Berhane
*Assistant Examiner* — Jye-June Lee
(74) *Attorney, Agent, or Firm* — Hamre, Schumann, Mueller & Larson, P.C.

(57) ABSTRACT

A semiconductor device includes an upper switching element, a lower switching element, an upper capacitor, and a lower capacitor. The upper switching element is formed by a wide-gap semiconductor and includes a first upper terminal, a second upper terminal, and an upper control terminal. The lower switching element is formed by a wide-gap semiconductor and includes a first lower terminal, a second lower terminal, and a lower control terminal. The upper capacitor is provided between the first upper terminal and the upper control terminal separately from the upper switching element. The lower capacitor is provided between the (Continued)

first lower terminal and the lower control terminal separately from the lower switching element. The second upper terminal and the first lower terminal are electrically connected.

27 Claims, 33 Drawing Sheets

(51) Int. Cl.
   *H01L 25/18* (2006.01)
   *H02M 7/00* (2006.01)
   *H02M 7/5387* (2007.01)
   *H02P 27/06* (2006.01)
   *H02M 1/00* (2006.01)

(52) U.S. Cl.
   CPC ...... *H02M 7/53871* (2013.01); *H02M 1/0054* (2021.05); *H02P 27/06* (2013.01)

(58) Field of Classification Search
   CPC ........... H01L 25/072; H01L 2224/0603; H01L 2224/48227; H01L 2224/4903; H01L 2224/49113; H01L 2224/49431; H01L 2224/49433; H01L 2924/19107; H02P 27/06; Y02B 70/10; H03K 17/165

See application file for complete search history.

(56) References Cited

FOREIGN PATENT DOCUMENTS

| | | |
|---|---|---|
| JP | 2015095946 | 5/2015 |
| WO | 2016030954 | 3/2016 |
| WO | 2017216974 | 12/2017 |

OTHER PUBLICATIONS

Office Action issued for German Patent Application No. 11 2019 000 291.0, dated Mar. 1, 2022, 11 pages including partial English translation.

* cited by examiner (Comparative Example)

Fig.13
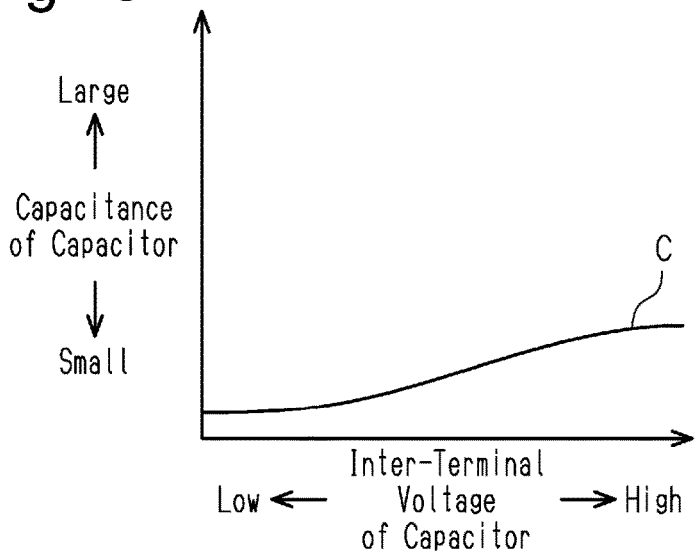
Fig.14
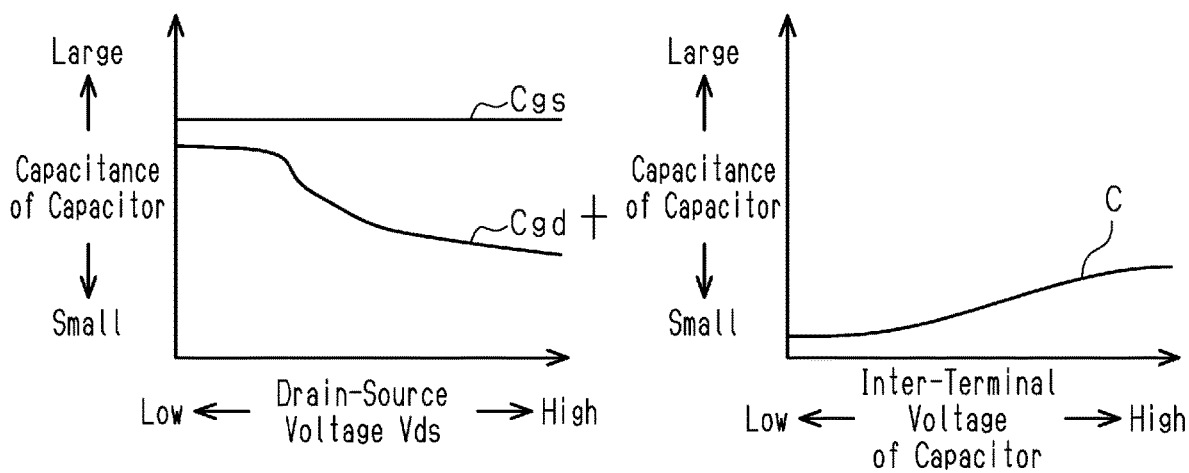
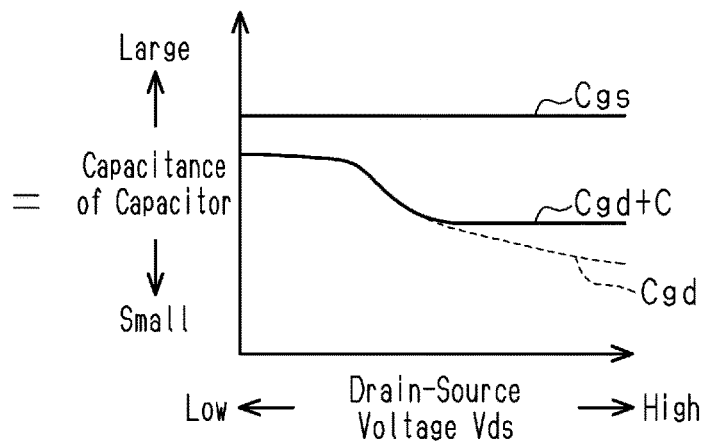

(Comparative example)

(Present embodiment)

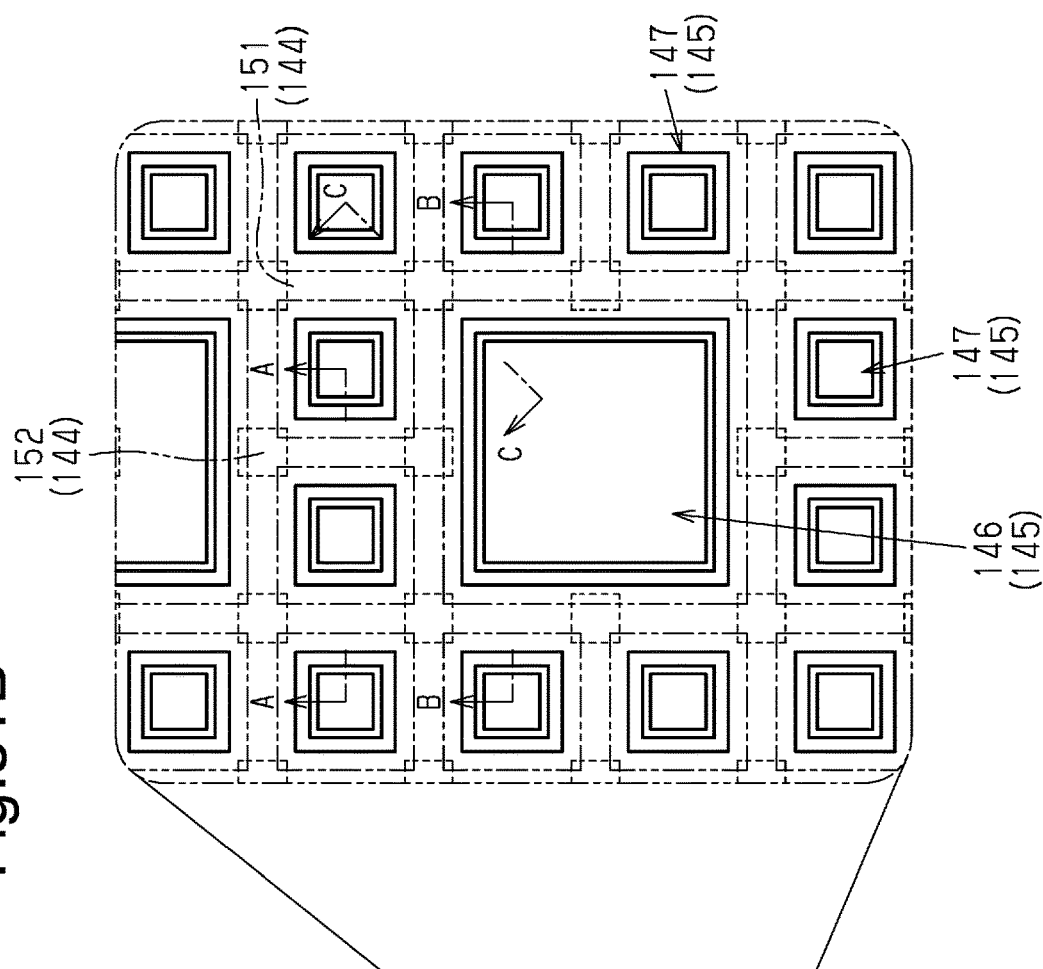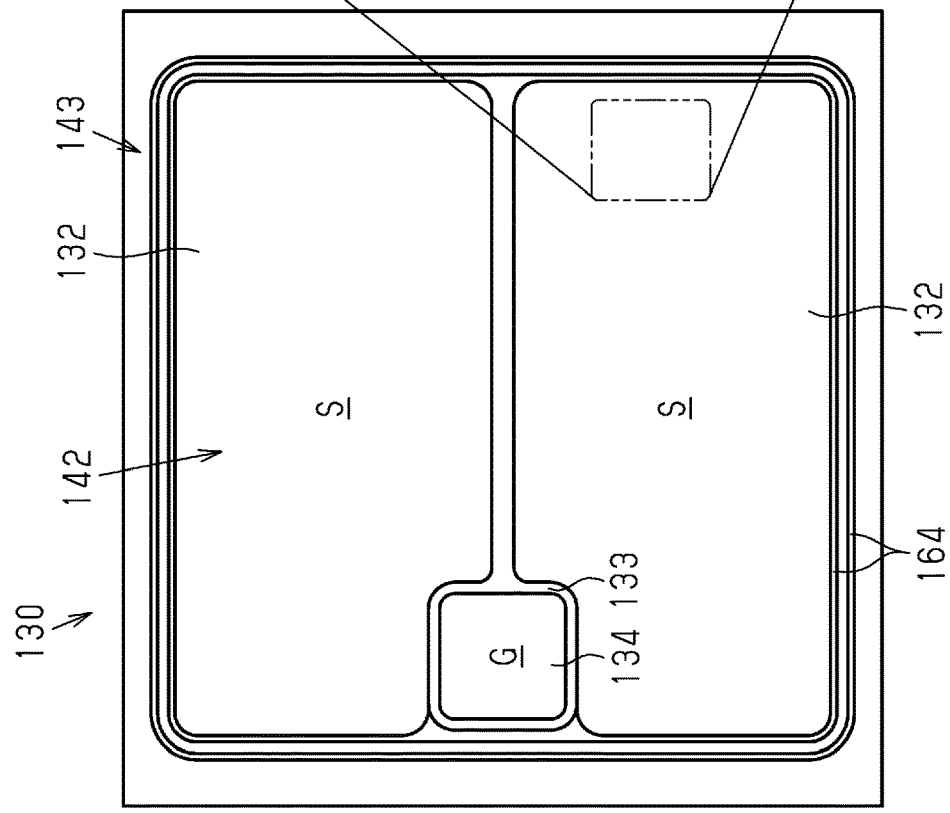

Fig.32
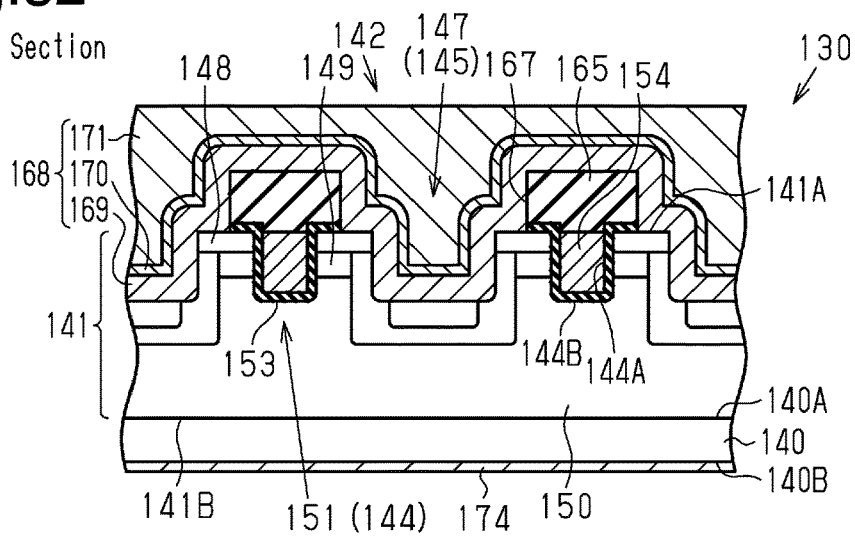
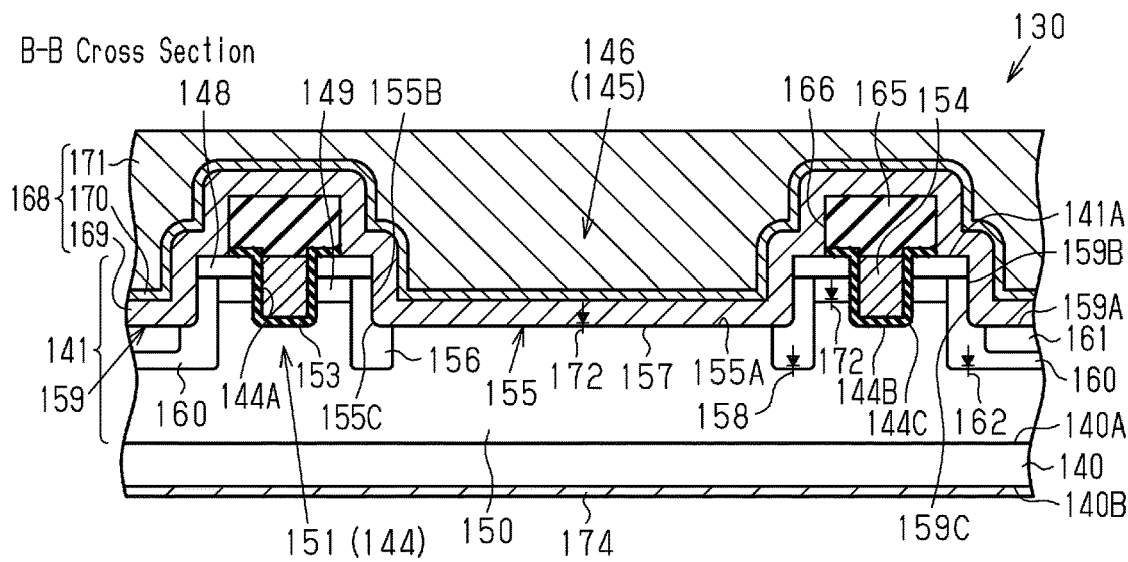
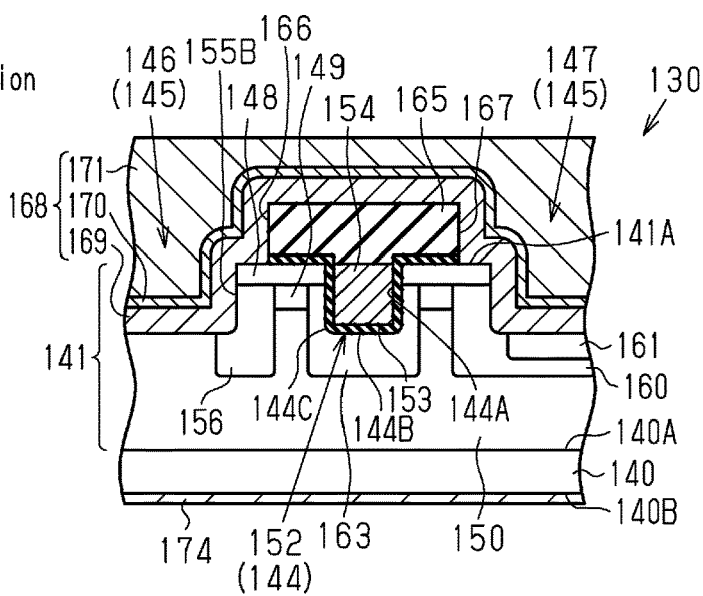

SEMICONDUCTOR DEVICE COMPRISING SWITCHING ELEMENTS AND CAPACITORS

TECHNICAL FIELD

The present invention relates to a semiconductor device and a power module.

BACKGROUND ART

In a half-bridge circuit formed by switching elements, for example, when the lower switching element is turned on from a dead time state, a drain-source voltage Vds of the upper switching element resulting from a drain-source voltage Vds of the lower switching element may fluctuate a gate-source voltage Vgs of the upper switching element and erroneously turn on a gate (see, for example, Patent Document 1).

PRIOR ART DOCUMENTS

Patent Documents

Patent DOCUMENT 1: Japanese Laid-Open Patent Publication No. 2013-99133

SUMMARY OF INVENTION

Problems that are to be Solved by the Invention

Wide-gap semiconductors using silicon carbide (SiC: silicon carbide) or the like having higher withstand voltage, lower on-resistance, higher speed switching, and higher-operation temperature than a semiconductor using silicon (Si) are now being researched, manufactured, and sold. In such a wide-gap semiconductor, the plateau voltage (gate-source voltage in the Miller effect region) in a low-current region is low and the ratio Cgs/Cgd of the gate-source capacitance Cgs to the gate-drain capacitance Cgd is small. Accordingly, time change dVds/dt of the drain-source voltage Vds has a great influence on the gate-source voltage Vgs via the gate-drain capacitance Cgd. As a result, the gate-source voltage Vgs fluctuates greatly. Therefore, if the voltage surge is applied in the positive direction, so-called self-turn-on of the switching element, that is, activation of the switching element even though the switching element is deactivated, is likely to occur, and a through current flows between the upper side and the lower side of the half bridge. Also, if the voltage surge is applied in the negative direction, there is possibility that the voltage will exceed the negative gate voltage rating. In a SiC MOSFET (metal-oxide-semiconductor field effect transistor), the negative gate voltage rating is often set to be small from the viewpoint of gate threshold shift. This effect is likely to be particularly problematic.

An object of the present invention is to provide a semiconductor device and a power module capable of reducing fluctuation in gate-source voltage.

Means for Solving the Problems

A semiconductor device that solves the above problem includes an upper switching element formed by a wide-gap semiconductor and including a first upper terminal, a second upper terminal, and an upper control terminal; a lower switching element formed by a wide-gap semiconductor and including a first lower terminal, a second lower terminal, and a lower control terminal; an upper capacitor provided between the first upper terminal and the upper control terminal separately from the upper switching element; and a lower capacitor provided between the first lower terminal and the lower control terminal separately from the lower switching element. The second upper terminal and the first lower terminal are electrically connected.

According to this configuration, for example, when the lower switching element changes from an on state to an off state, the lower capacitor decreases the changing rate of the drain-source voltage of the lower switching element. This decreases the changing rate of the drain-source voltage of the upper switching element. Thus, the changing rate of the gate-source voltage of the upper switching element decreases. Therefore, since increases in the surge voltage of the gate-source voltage of the upper switching element are limited, fluctuation of the gate-source voltage of the upper switching element can be reduced. Further, for example, in a case where the upper switching element changes from an on state to an off state, increases in the surge voltage of the gate-source voltage of the lower switching element are limited in the same manner. Therefore, fluctuation of the gate-source voltage of the lower switching element can be reduced.

Further, a power module that solves the above problem includes a substrate; an upper switching element mounted on the substrate, formed by a wide-gap semiconductor, and including a first upper terminal, a second upper terminal, and an upper control terminal; a lower switching element mounted on the substrate, formed by a wide-gap semiconductor, and including a first lower terminal, a second lower terminal, and a lower control terminal; an upper capacitor provided between the first upper terminal and the upper control terminal separately from the upper switching element; a lower capacitor provided between the first lower terminal and the lower control terminal separately from the lower switching element; and an encapsulation resin encapsulating the upper switching element, the lower switching element, the upper capacitor, and the lower capacitor. The second upper terminal and the first lower terminal are electrically connected.

According to this configuration, for example, when the lower switching element changes from an on state to an off state, the lower capacitor decreases the changing rate of the drain-source voltage of the lower switching element. This decreases the changing rate of the drain-source voltage of the upper switching element. Thus, the changing rate of the gate-source voltage of the upper switching element decreases. Therefore, since increases in the surge voltage of the gate-source voltage of the upper switching element are limited, fluctuation of the gate-source voltage of the upper switching element can be reduced. Further, for example, in a case where the upper switching element changes from an on state to an off state, increases in the surge voltage of the gate-source voltage of the lower switching element are limited in the same manner. Therefore, fluctuation of the gate-source voltage of the lower switching element can be reduced.

In addition, a power module that solves the above problem includes: a substrate; a switching element formed by a wide-gap semiconductor and including a first terminal, a second terminal, a control terminal controlling switching between the first terminal and the second terminal; a capacitor provided between the first terminal and the control terminal separately from the switching element; and an encapsulation resin encapsulating the switching element and the capacitor.

A power module that solves the above problem includes an upper switching element formed by a wide-gap semiconductor and including a first upper terminal, a second upper terminal, and an upper control terminal; a lower switching element formed by a wide-gap semiconductor and including a first lower terminal, a second lower terminal, and a lower control terminal; an upper diode formed by a wide-gap semiconductor and including an anode connected to the second upper terminal and a cathode connected to the first upper terminal; a lower diode formed by a wide-gap semiconductor and including an anode connected to the second lower terminal and a cathode connected to the first lower terminal; and a substrate on which the upper switching element, the lower switching element, the upper diode, and the lower diode are mounted. A forward threshold voltage of the upper diode is lower than a forward threshold voltage of a body diode of the upper switching element, and a tolerable DC rated current of the upper diode is less than a tolerable DC rated current of the body diode of the upper switching element. A forward threshold voltage of the lower diode is lower than a forward threshold voltage of a body diode of the lower switching element, and a tolerable DC rated current of the lower diode is less than a tolerable DC rated current of the body diode of the lower switching element.

A power module that solves the above problem includes a switching element formed by a wide-gap semiconductor and including a first terminal, a second terminal, and a control terminal; a diode formed by a wide-gap semiconductor and including an anode connected to the second terminal and a cathode connected to the first terminal; and a substrate on which the switching element and the diode are mounted. A forward threshold voltage of the diode is lower than a forward threshold voltage of a body diode of the switching element, and a tolerable DC rated current of the diode is less than a tolerable DC rated current of the body diode of the switching element.

According to this configuration, for example, when the lower switching element changes from an on state to an off state, even if the drain-source voltage of the upper switching element decreases to the negative side, a decrease in the drain-source voltage of the upper switching element is clamped at the forward threshold voltage of the upper diode. This shortens the fluctuation period of the drain-source voltage. Thus, the fluctuation period of the gate-source voltage is shortened. Accordingly, fluctuation of the gate-source voltage can be reduced.

Effect of Invention

According to the above semiconductor device and power module, fluctuation in the gate-source voltage can be reduced.

BRIEF DESCRIPTION OF DRAWINGS

FIG. 13 is a graph illustrating the relationship between the inter-terminal voltage and capacitance of a capacitor in an upper capacitor and a lower capacitor.

FIG. 14 is a graph illustrating the gate-source capacitance and the gate-drain capacitance of the upper switching element and the lower switching element, and capacitor capacitance including the upper capacitor and the lower capacitor, in the power module.

FIG. 31A is a plan view of a MIS transistor, and FIG. 31B is a partially enlarged view of FIG. 31A, with respect to a power module according to a third embodiment.

FIG. 32 illustrates cross-sectional views taken along line A-A, line B-B, and line C-C in FIG. 31.

EMBODIMENTS OF INVENTION

Hereinafter, embodiments of a semiconductor device and a power module will be described with reference to the drawings. Each of the embodiments described below exemplify the configuration and the method for embodying technical ideas, and material, shape, structure, arrangement, size, and the like of each component is not limited to those described below. Various modifications can be added to the following embodiments.

In the present description, "state where member A is connected to member B" includes a case where member A and member B are physically and directly connected, and a case where member A and member B are indirectly connected via another member that does not affect the electrical connection state.

Similarly, "state where member C is provided between member A and member B" includes a case where member A and member C, or member B and member C are directly connected, and a case where member A and member C, or member B and member C are indirectly connected via another member that does not affect the electrical connection state.

First Embodiment

Figure 1:
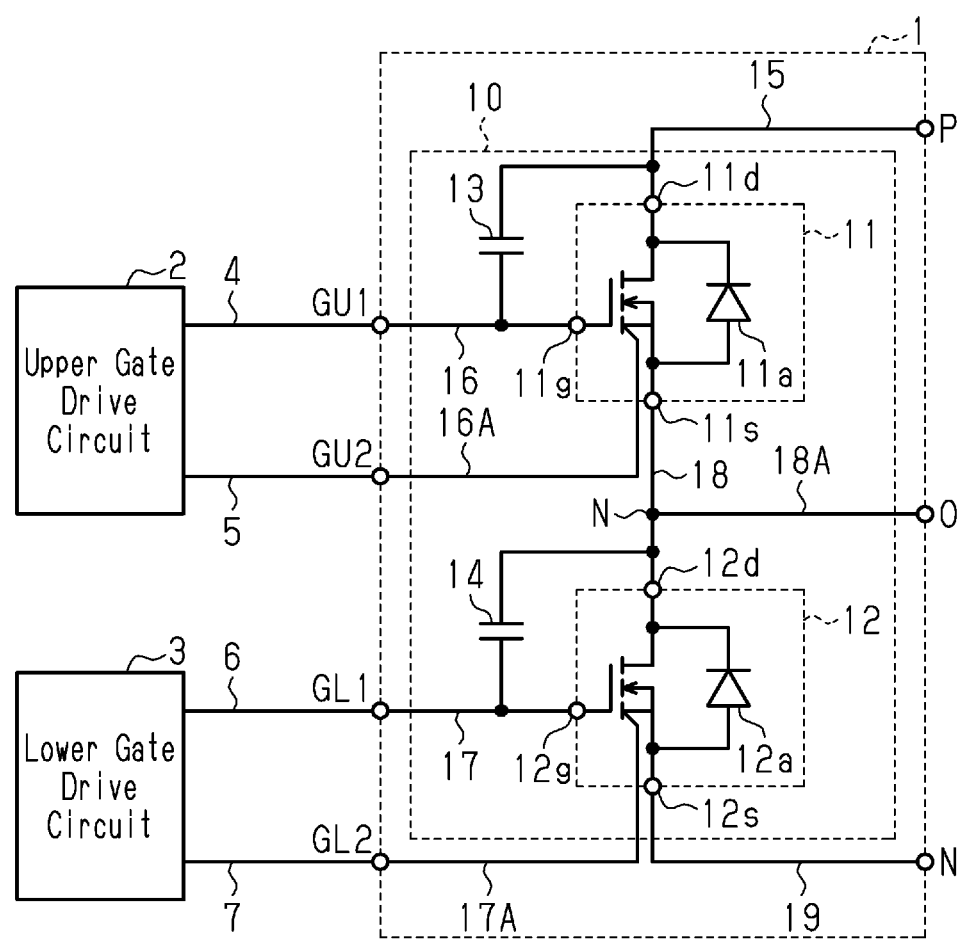
FIG. 1 is a schematic circuit diagram illustrating a power module including a semiconductor device and a drive circuit for the power module according to a first embodiment.

As illustrated in FIG. 1, in a power module 1 and its drive circuits, the power module 1 has a plurality of terminals. As illustrated as a plurality of terminals in FIG. 1, the power module 1 has a first input terminal P serving as a positive side, a second input terminal N serving as a negative side, an output terminal O, a first upper control terminal GU1, a second upper control terminal GU2, a first lower control terminal GL1, and a second lower control terminal GL2. The first input terminal P can be electrically connected to a power supply (not illustrated) for generating a power-supply voltage VDD. The second input terminal N can be electrically connected to ground.

A semiconductor device 10 includes a half-bridge circuit in which an upper switching element 11 and a lower switching element 12 are connected in series. Each of the upper switching element 11 and the lower switching element 12 is a 4H—SiC (wide bandgap semiconductor having an electric breakdown field of about 2.8 MV/cm and a bandgap width of about 3.26 eV). The wide bandgap semiconductor used for the upper switching element 11 and the lower switching element 12 is not limited to silicon carbide (SiC), and may be gallium nitride (GaN), gallium oxide ($Ga_2O_3$), diamond, or the like. Gallium nitride (GaN) has an electric breakdown field of about 3 MV/cm and a bandgap width of about 3.42 eV. Gallium oxide ($Ga_2O_3$) has an electric breakdown field of about 8 MV/cm and a bandgap width of about 4.8 eV. Diamond has an electric breakdown field of about 8 MV/cm and a bandgap width of about 5.47 eV. An example of the upper switching element 11 and the lower switching element 12 is a SiC MOSFET (metal-oxide-semiconductor field-effect transistor).

The upper switching element 11 has a drain terminal 11d which is an example of a first upper terminal, a source terminal 11s which is an example of a second upper terminal, and a gate terminal 11g which is an example of an upper control terminal. The lower switching element 12 has a drain terminal 12d which is an example of a first lower terminal, a source terminal 12s which is an example of a second lower terminal, and a gate terminal 12g which is an example of a lower control terminal.

The number of each of the upper switching elements 11 and the lower switching elements 12 can be freely changed. For example, the number of each of the upper switching elements 11 and the lower switching elements 12 is set so that on-resistance thereof becomes on-resistance that is set in advance. In a case where a plurality of upper switching elements 11 is provided, the plurality of upper switching elements 11 is connected in parallel to each other. That is, the drain terminals 11d of the plurality of upper switching elements 11 are connected to each other, the source terminals 11s of the plurality of upper switching elements 11 are connected to each other, and the gate terminals 11g of the plurality of upper switching elements 11 are connected to each other. In addition, in a case where a plurality of lower switching elements 12 is provided, the plurality of lower switching elements 12 is connected in parallel to each other. That is, the drain terminals 12d of the plurality of lower switching elements 12 are connected to each other, the source terminals 12s of the plurality of lower switching elements 12 are connected to each other, and the gate terminals 12g of the plurality of lower switching elements 12 are connected to each other. In the present embodiment, two upper switching elements 11 are provided, and two lower switching elements 12 are provided.

The drain terminal 11d of the upper switching element 11 is electrically connected to the first input terminal P via first wiring 15. As a result, the power-supply voltage VDD is supplied to the drain terminal 11d of the upper switching element 11. The source terminal 11s of the upper switching element 11 is connected to the drain terminal 12d of the lower switching element 12 via fourth wiring 18. A node N between the source terminal 11s of the upper switching element 11 and the drain terminal 12d of the lower switching element 12 in the fourth wiring 18 is electrically connected to the output terminal O via output wiring 18A. The gate terminal 11g of the upper switching element 11 is electrically connected to the first upper control terminal GU1 via second wiring 16. The first upper control terminal GU1 is electrically connected to an upper gate drive circuit 2 via first upper wiring 4. The upper gate drive circuit 2 outputs a gate driving signal for operating the upper switching element 11 to the gate terminal 11g in accordance with a command from a control circuit, not illustrated. The source of the upper switching element 11 is electrically connected to the second upper control terminal GU2 via upper sense wiring 16A. The second upper control terminal GU2 is connected to the upper gate drive circuit 2 by second upper wiring 5.

The source terminal 12s of the lower switching element 12 is electrically connected to the second input terminal N via fifth wiring 19. As a result, the source terminal 12s of the lower switching element 12 is electrically connected to ground. The gate terminal 12g of the lower switching element 12 is electrically connected to the first lower control terminal GL1 via third wiring 17. The first lower control terminal GL1 is electrically connected to a lower gate drive circuit 3 via first lower wiring 6. The lower gate drive circuit 3 outputs a gate driving signal for operating the lower switching element 12 to the gate terminal 12g in accordance with a command from a control circuit, not illustrated. The upper gate drive circuit 2 and the lower gate drive circuit 3 control the upper switching element 11 and the lower switching element 12 in a complementary manner turn on and off the upper switching element 11 and the lower switching element 12. The source of the lower switching element 12 is electrically connected to the second lower control terminal GL2 via lower sense wiring 17A. The second lower control terminal GL2 is connected to the lower gate drive circuit 3 by second lower wiring 7.

As illustrated in FIG. 1, the upper gate drive circuit 2, the lower gate drive circuit 3, the first upper wiring 4, the second upper wiring 5, the first lower wiring 6, and the second lower wiring 7 are provided outside the power module 1. At least one of the upper gate drive circuit 2 and the lower gate drive circuit 3 may be provided inside the power module 1. In addition, the power module 1 may be configured by combining two upper and lower power modules.

Figure 3:
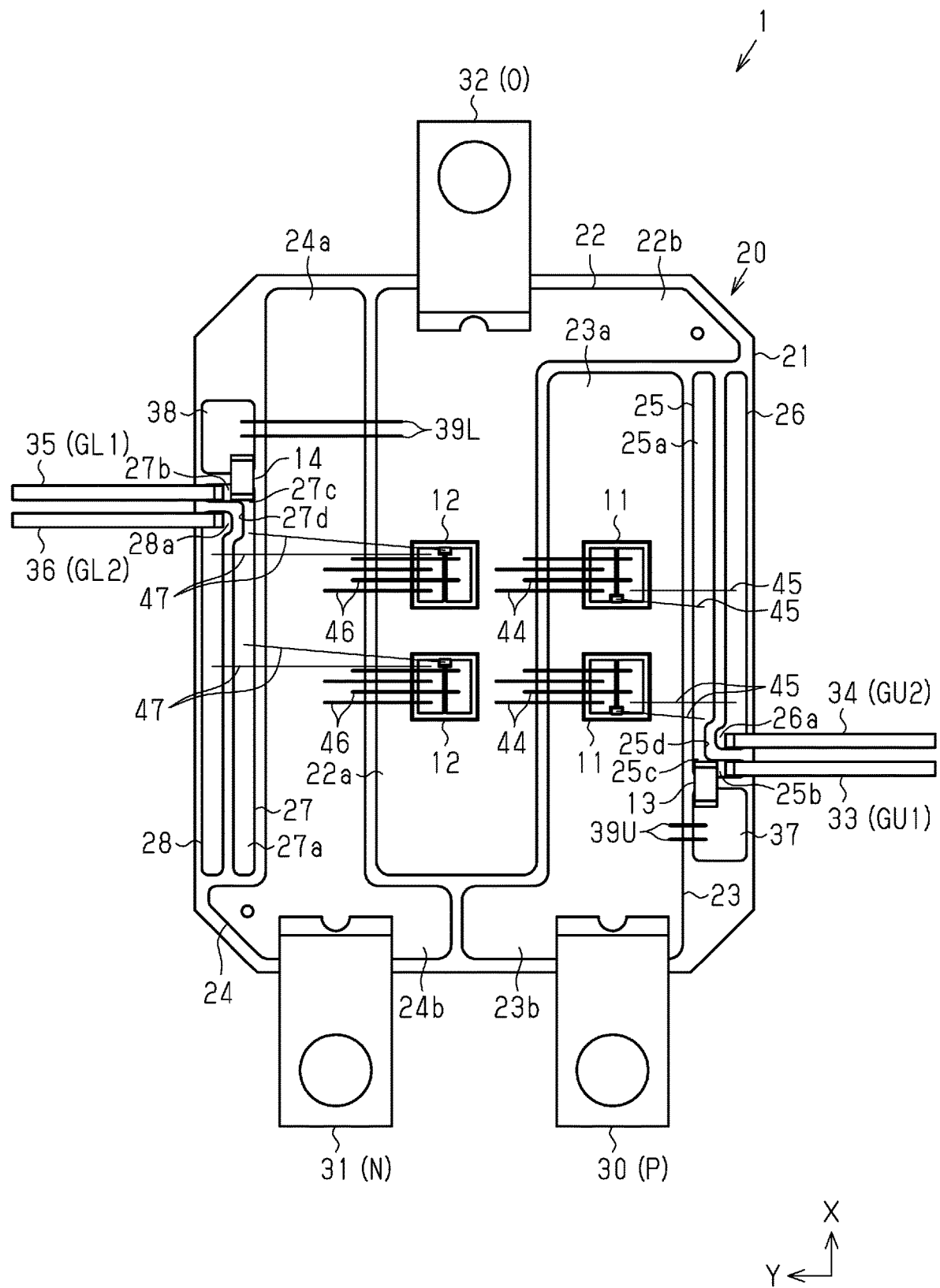
FIG. 3 is a plan view illustrating an internal configuration of the power module.

The semiconductor device 10 has an upper capacitor 13 and a lower capacitor 14. As illustrated in FIGS. 1 and 3, the upper capacitor 13 is provided separately from the upper switching element 11. The lower capacitor 14 is provided separately from the lower switching element 12. One example of the upper capacitor 13 and the lower capacitor 14 is a ceramic capacitor, a film capacitor, an anti-ferroelectric capacitor or the like but may be formed by stray capacitance in the power module 1. The capacitance of each of the upper capacitor 13 and the lower capacitor 14 is about several tens of pF. The upper capacitor 13 is preferably configured such that the capacitance thereof increases in a case where a drain-source voltage Vdsu, which is a voltage between the drain terminal 11d and the source terminal 11s of the upper switching element 11, is a positive value. The lower capacitor 14 is preferably configured such that the capacitance thereof increases in a case where a drain-source voltage Vds1, which is a voltage between the drain terminal 12d and the source terminal 12s of the lower switching element 12 is a positive value. From this viewpoint, an anti-ferroelectric capacitor is used for the upper capacitor 13 and the lower capacitor 14 of the present embodiment. An anti-ferroelectric capacitor has such a characteristic in which its capacitance increases when a positive voltage is applied.

The upper capacitor 13 is provided between the drain terminal 11d and the gate terminal 11g of the upper switching element 11. More specifically, a first terminal of the upper capacitor 13 is connected to the first wiring 15 connecting the drain terminal 11d and the first input terminal P. A second terminal of the upper capacitor 13 is connected to the second wiring 16 connecting the gate terminal 11g and the first upper control terminal GU1.

The lower capacitor 14 is provided between the drain terminal 12d and the gate terminal 12g of the lower switching element 12. More specifically, a first terminal of the lower capacitor 14 is connected between the drain terminal 12d and the source terminal 11s of the upper switching element 11. More specifically, the first terminal of the lower capacitor 14 is connected to the portion in the fourth wiring 18 between the node N and the drain terminal 12d of the lower switching element 12. The second terminal of the lower capacitor 14 is connected to the third wiring 17 connecting the gate terminal 12g and the first lower control terminal GL1.

Figure 2:
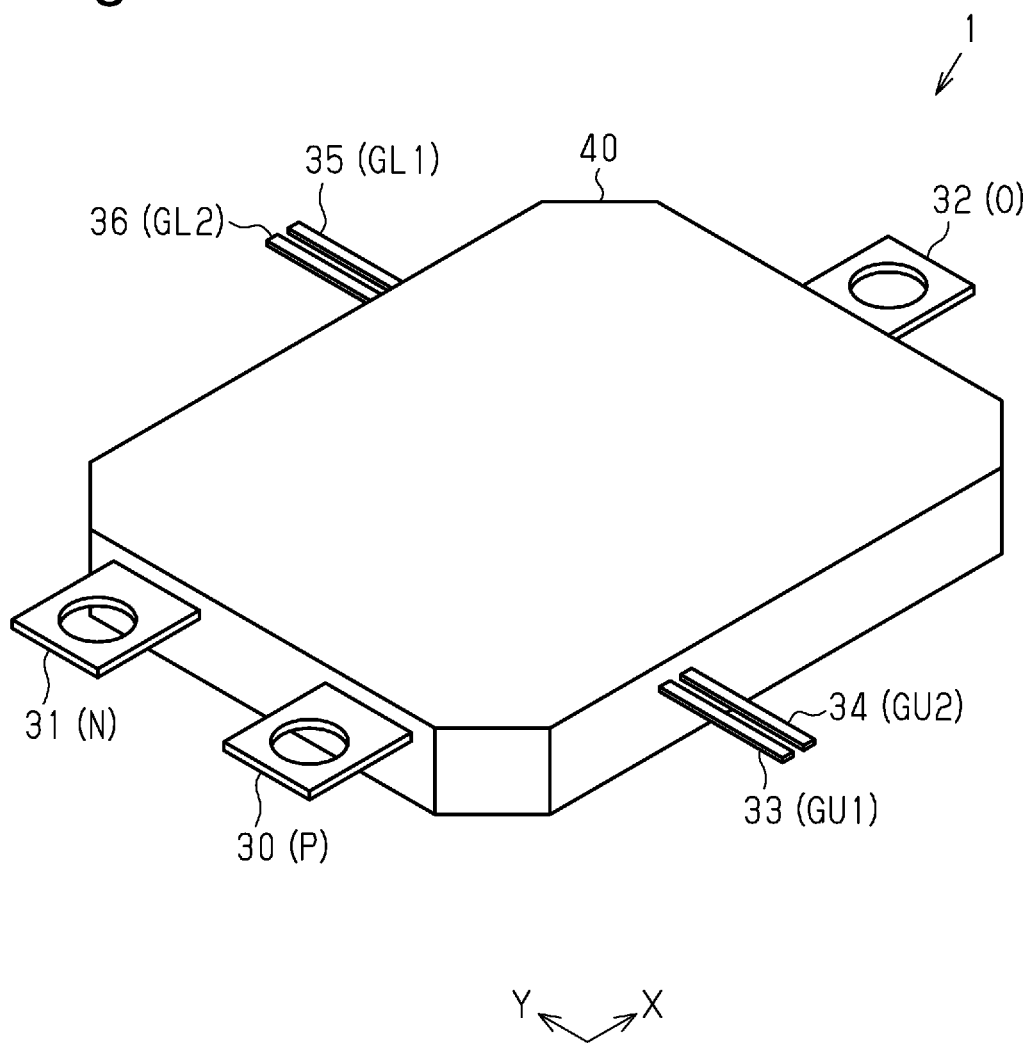
FIG. 2 is a perspective view of the power module.
Figure 4:
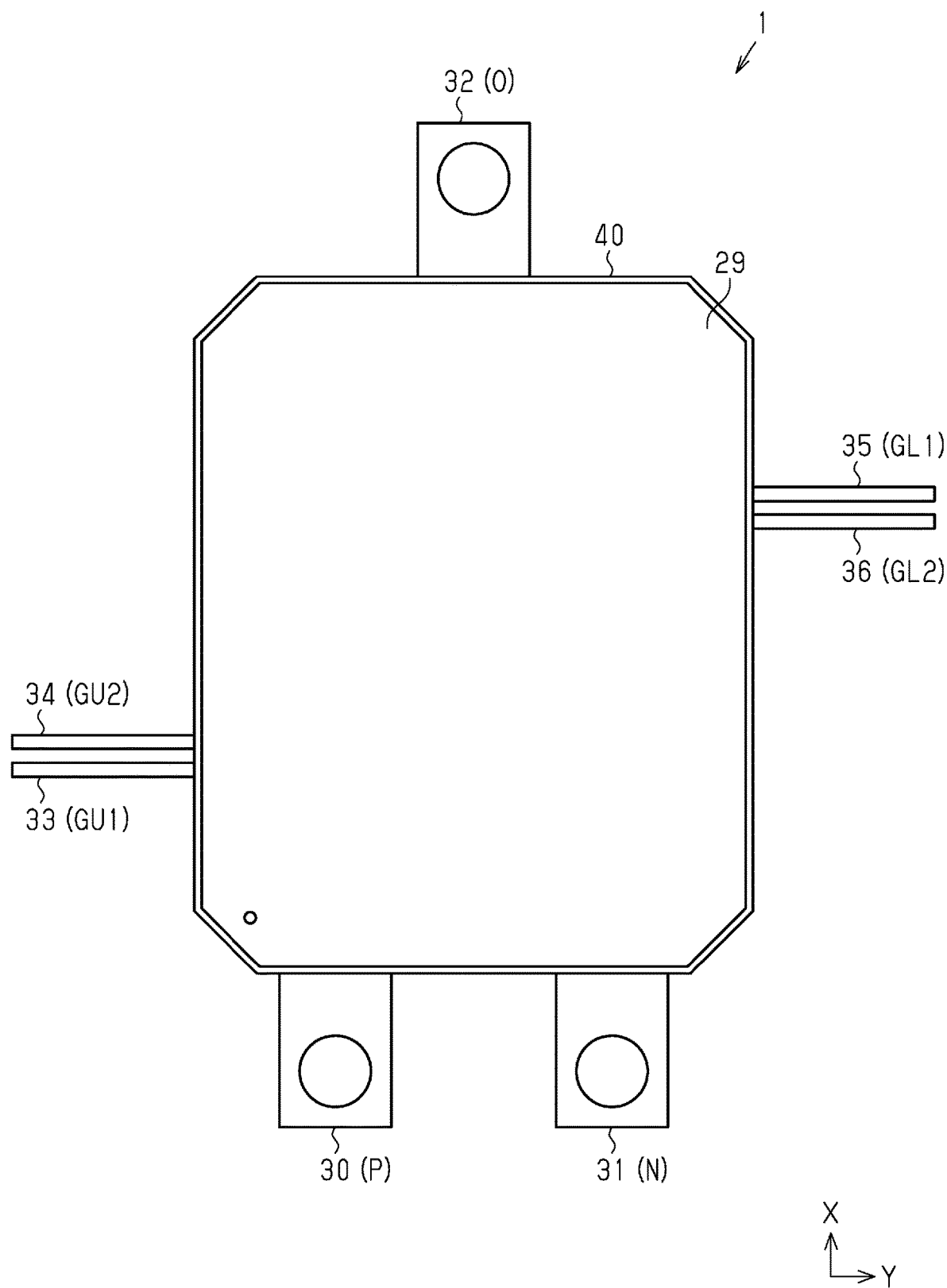
FIG. 4 is a bottom view of the power module.

FIGS. 2 to 4 illustrate an example of the configuration of the power module 1. The configuration of the power module 1 is not limited to the configuration illustrated in FIGS. 2 to 4, and various modifications are possible.

As illustrated in FIGS. 2 to 4, the power module 1 includes a substrate 20 on which the upper switching element 11, the lower switching element 12, the upper capacitor 13, and the lower capacitor 14 are mounted; and the encapsulation resin 40 encapsulating the upper switching element 11, the lower switching element 12, the upper capacitor 13, the lower capacitor 14, and part of the substrate 20. In addition, the power module 1 includes, as an example of terminal members, a first input terminal member 30 configuring the first input terminal P, a second input terminal member 31 configuring the second input terminal N, an output terminal member 32 configuring the output terminal O, a first upper control terminal member 33 configuring the first upper control terminal GU1, a second upper control terminal member 34 configuring the second upper control terminal GU2, a first lower control terminal member 35 configuring the first lower control terminal GL1, and a second lower control terminal member 36 configuring the second lower control terminal GL2.

The substrate 20 has a planar ceramic substrate 21 which is an example of a supporting substrate. On the front-surface side of the ceramic substrate 21, an output wiring portion 22, a first input wiring portion 23 serving as a positive side, a second input wiring portion 24 serving as a negative side, a first upper control wiring portion 25, a second upper control wiring portion 26, a first lower control wiring portion 27, and a second lower control wiring portion 28 are provided. Each of the wiring portions 22 to 28 is made of copper (Cu). In the following description, the longitudinal direction of the substrate 20 is defined as "first direction X", and the lateral direction of the substrate 20 is defined as "second direction Y". The second direction Y is a direction orthogonal to the first direction X in a plan view of the power module 1.

The output wiring portion 22 is provided at the center of the ceramic substrate 21 in the second direction Y. The output wiring portion 22 is formed in a substantially L shape in a plan view. The output wiring portion 22 has a first portion 22a extending in the first direction X and a second portion 22b extending in the second direction Y. The second portion 22b is provided at an end portion of the first portion 22a in the first direction X. The width dimension of the first portion 22a (length of the first portion 22a in the second direction Y) is greater than the width dimension of the second portion 22b (length of the second portion 22b in the first direction X). The first portion 22a is located at the center of the ceramic substrate 21 in the second direction Y. The second portion 22b is located at an end portion of the ceramic substrate 21 in the first direction X and extends from the first portion 22a in the second direction Y toward the side where the upper control terminal members 33, 34 are located. An output terminal member 32 is connected to the second portion 22b. The output terminal member 32 is located at the center of the ceramic substrate 21 in the second direction Y.

The first input wiring portion 23 is provided so as to be adjacent to the output wiring portion 22. The first input wiring portion 23 is formed to be substantially L-shaped in a plan view. The first input wiring portion 23 has a first portion 23a extending in the first direction X and a second portion 23b extending in the second direction Y. The first portion 23a is arranged on the side of the first portion 22a of the output wiring portion 22 where the upper control terminal members, 33, 34 are located to be adjacent to the first portion 22a with a gap in between in the second direction Y. The end portion of the first portion 23a on an output terminal member 32 side is located so as to be adjacent to the second portion 22b of the output wiring portion 22 in the first direction X with a gap in between. The second portion 23b is provided at an end portion of the first portion 23a in the first direction X. The second portion 23b covers from the first direction X part of an end portion on the first portion 22a of the output wiring portion 22 on the side opposite to the side on which the output terminal member 32 is arranged. The first input terminal member 30 is connected to the second portion 23b. The width dimension of the first portion 23a (length of the first portion 23a in the second direction Y) is greater than the width dimension of the second portion 23b (length of the second portion 23b in the first direction X). The width dimension of the first portion 23a is smaller than the width dimension of the first portion 22a of the output wiring portion 22.

The second input wiring portion 24 is provided so as to be adjacent to the output wiring portion 22. The second input wiring portion 24 is formed to be substantially T-shaped in a plan view. The second input wiring portion 24 has a first portion 24a extending in the first direction X and a second portion 24b extending in the second direction Y. The first portion 24a is arranged on the side of the first portion 22a of the output wiring portion 22 where the lower control terminal members 35, 36 are located so as to be adjacent to the first portion 22a via a gap in between in the second direction Y. As illustrated in FIG. 3, in the second direction Y, the first portion 22a of the output wiring portion 22 is arranged so as to be sandwiched between the first portion 23a of the first input wiring portion 23 and the first portion 24a of the second input wiring portion 24. The second portion 24b is provided at an end portion of the first portion 24a in the first direction X. The second portion 24b protrudes from both sides of the first portion 24a in the second direction Y. The width dimension of the first portion 24a (length of the first portion 24a in the second direction Y) is greater than the width dimension of the second portion 24b (length of the second portion 24b in the first direction X). The width dimension of the first portion 24a is smaller than each of the width dimension of the first portion 22a of the output wiring portion 22 and the width dimension of the first portion 23a of the first input wiring portion 23. The length of the first portion 24a in the first direction X is longer than each of the length of the first portion 22a of the output wiring portion 22 in the first direction X and the length of the first portion 23a of the first input wiring portion 23 in the first direction X. The position of the second portion 24b in the first direction X is the same as the position of the second portion 23b of the first input wiring portion 23 in the first direction X. A portion of the second portion 24b protruding toward a first input wiring portion 23 side more than the first portion 24a covers from the first direction X part of the end portion of the first portion 22a of the output wiring portion 22 on the side opposite to the side on which the output terminal member 32 is arranged.

The first upper control wiring portion 25 is provided at an end portion of the ceramic substrate 21 on the side where the upper control terminal members 33, 34 are arranged. The first upper control wiring portion 25 is provided so as to be adjacent to the first portion 23a in the second direction Y on the side of the first portion 23a of the first input wiring portion 23 where the upper control terminal members 33, 34 are arranged. The first upper control wiring portion 25 has a first portion 25a extending in the first direction X, a second portion 25b extending in the second direction Y, and a bent portion 25c connecting the first portion 25a and the second portion 25b. A recessed portion 25d recessed toward the first input wiring portion 23 in the second direction Y is formed at an end portion of the first portion 25a on a bent portion 25c side. That is, the width dimension of the portion of the first portion 25a where the recessed portion 25d is formed (length of the first portion 25a in the second direction Y) is smaller than the width dimension of the other portion of the first portion 25a (length of the first portion 25a in the second direction Y). The length of the first portion 25a in the first direction X is shorter than the length of the first portion 23a of the first input wiring portion 23 in the first direction X. The first upper control terminal member 33 is connected to a front end portion of the second portion 25b. The first upper control terminal member 33 extends in the second direction Y.

The second upper control wiring portion 26 is provided at an end portion of the ceramic substrate 21 on the side where the upper control terminal members 33, 34 are arranged. The second upper control wiring portion 26 is arranged adjacent to the first upper control wiring portion 25 in the second direction Y on the side where the upper control terminal members 33, 34 are arranged with respect to the first upper control wiring portion 25. In a portion of the second upper control wiring portion 26 opposed to the recessed portion 25d of the first upper control wiring portion 25 in the second direction Y, a connecting portion 26a extending toward the recessed portion 25d is provided. The connecting portion 26a is covered with the second portion 25b of the first upper control wiring portion 25 in the first direction X. A second upper control terminal member 34 is connected to the connecting portion 26a. The second upper control terminal member 34 extends in the second direction Y.

The first lower control wiring portion 27 is provided at an end portion of the ceramic substrate 21 on the side where the lower control terminal members 35, 36 are arranged. The first lower control wiring portion 27 is provided so as to be adjacent to the first portion 24a of the second input wiring portion 24 in the second direction Y on the side of the first portion 24a where the lower control terminal members 35, 36 are arranged. The first lower control wiring portion 27 includes a first portion 27a extending in the first direction X, a second portion 27b extending in the second direction Y, and a bent portion 27c connecting the first portion 27a and the second portion 27b with each other. A recessed portion 27d recessed toward the second input wiring portion 24 in the second direction Y is formed at an end portion on a bent portion 27c side in the first portion 27a. That is, the width dimension of the portion where the recessed portion 27d is formed in the first portion 27a (length of the first portion 27a in the second direction Y) is smaller than the width dimension of the other portion of the first portion 27a (length of the first portion 27a in the second direction Y). The length of the first portion 27a in the first direction X is shorter than each of the length of the first portion 24a of the second input wiring portion 24 in the first direction X and the length of the first portion 22a of the output wiring portion 22 in the first direction X. The first lower control terminal member 35 is connected to the front end portion of the second portion 27b. The first lower control terminal member 35 extends in the second direction Y.

The second lower control wiring portion 28 is provided at an end portion of the ceramic substrate 21 on the side where the lower control terminal members 35, 36 are arranged. The second lower control wiring portion 28 is arranged adjacent to the first lower control wiring portion 27 in the second direction Y on the side of the first lower control wiring portion 27 where the lower control terminal members 35, 36 are arranged. In a portion of the second lower control wiring portion 28 opposed to the recessed portion 27d of the first lower control wiring portion 27 in the second direction Y, a connecting portion 28a extending toward the recessed portion 27d is provided. The connecting portion 28a is covered with the second portion 27b of the first lower control wiring portion 27 in the first direction X. The second lower control terminal member 36 is connected to the connecting portion 28a. The second lower control terminal member 36 extends in the second direction Y.

An upper island portion 37 and a lower island portion 38 are provided on the front-surface side of the ceramic substrate 21. The shape of each of the upper island portion 37 and the lower island portion 38 is a rectangle in which the first direction X is the longitudinal direction. The upper island portion 37 and the lower island portion 38 are made of, for example, copper (Cu).

The upper island portion 37 is provided at the end portion of the ceramic substrate 21 on the side where the upper control terminal members 33, 34 are arranged. The upper island portion 37 is provided on a first input terminal member 30 side of the upper control wiring portions 25, 26 in the first direction X. More specifically, the upper island portion 37 is provided so as to be adjacent to the second portion 25b and the bent portion 25c of the first upper control wiring portion 25 in the first direction X with a gap in between, and adjacent to the first portion 23a of the first input wiring portion 23 in the second direction Y with a gap in between. The upper island portion 37 and the first input wiring portion 23 are electrically connected by one or more upper connecting wires 39U. In the present embodiment, the upper island portion 37 and the first input wiring portion 23 are electrically connected by the two upper connecting wires 39U. The upper connecting wire 39U is made of, for example, aluminum (Al). The wire diameter of the upper connecting wire 39U is preferably greater than the wire diameter of an upper control wire 45 (lower control wire 47), and is equal to, for example, the wire diameter of an upper power wire (lower power wire 46).

The lower island portion 38 is provided at an end portion on the ceramic substrate 21 on the side where the lower control terminal members 35, 36 are arranged. The lower island portion 38 is provided on an output terminal member 32 side of the lower control wiring portions 27, 28 in the first direction X. More specifically, the lower island portion 38 is provided so as to be adjacent to the second portion 27b and the bent portion 27c of the first lower control wiring portion 27 in the first direction X with a gap in between, and adjacent to the first portion 24a of the second input wiring portion 24 in the second direction Y with a gap in between. The lower island portion 38 and the output wiring portion 22 are electrically connected by one or more lower connecting wires 39L. In the present embodiment, the lower island portion 38 and the output wiring portion 22 are electrically connected by the two lower connecting wires 39L. The lower connecting wire 39L is provided across the first portion 24a of the second input wiring portion 24 in the second direction Y. The lower connecting wire 39L is made of, for example, aluminum (Al). The wire diameter of the lower connecting wire 39L is preferably greater than the wire diameter of the upper control wire 45 (lower control wire 47), and, for example, equal to the wire diameter of an upper power wire 44 (lower power wire 46).

Each of the two upper switching elements 11 is formed to be chip-shaped and is mounted on the first portion 23a of the first input wiring portion 23. The two upper switching elements 11 are positioned with a gap in between in the first direction X. That is, the two upper switching elements 11 are mounted on the first input wiring portion 23 and spaced apart from each other in the first direction X. Each upper switching element 11 is located at the center in the second direction Y of the first portion 23a of the first input wiring portion 23. In addition, each upper switching element 11 is positioned on an output terminal member 32 side of the upper control terminal members 33, 34 in the first direction X. More specifically, each upper switching element 11 is located on an output terminal member 32 side of the recessed portion 25d of the first upper control wiring portion 25 in the first direction X.

Figure 5B:
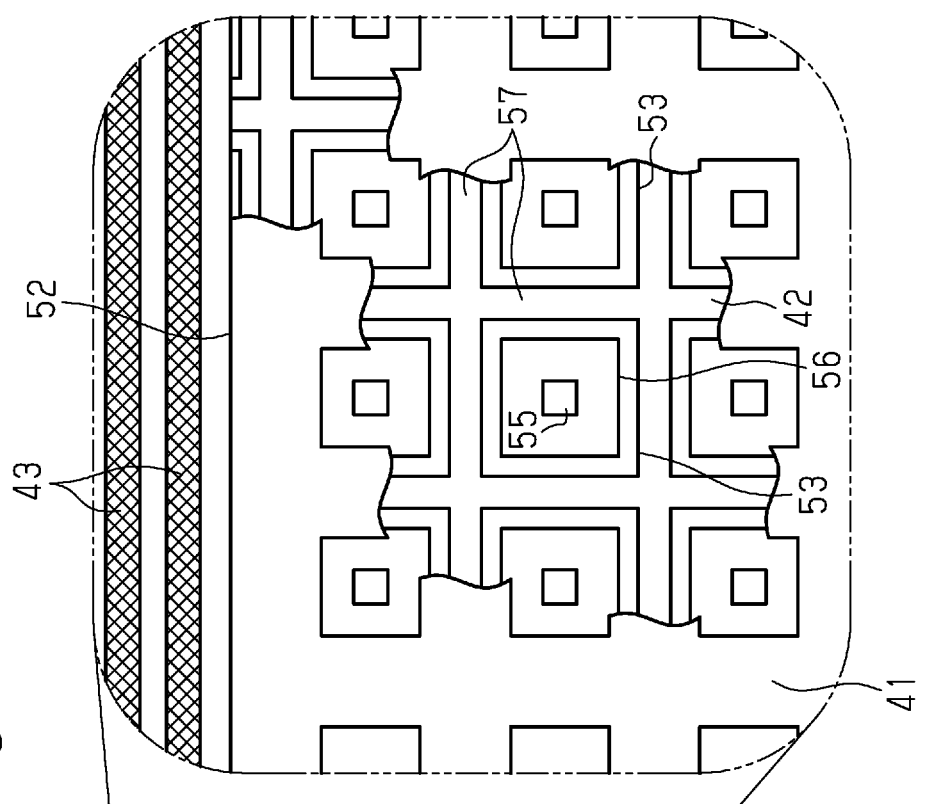
FIG. 5B is a partially enlarged view of the inside of FIG. 5A.
Figure 5A:
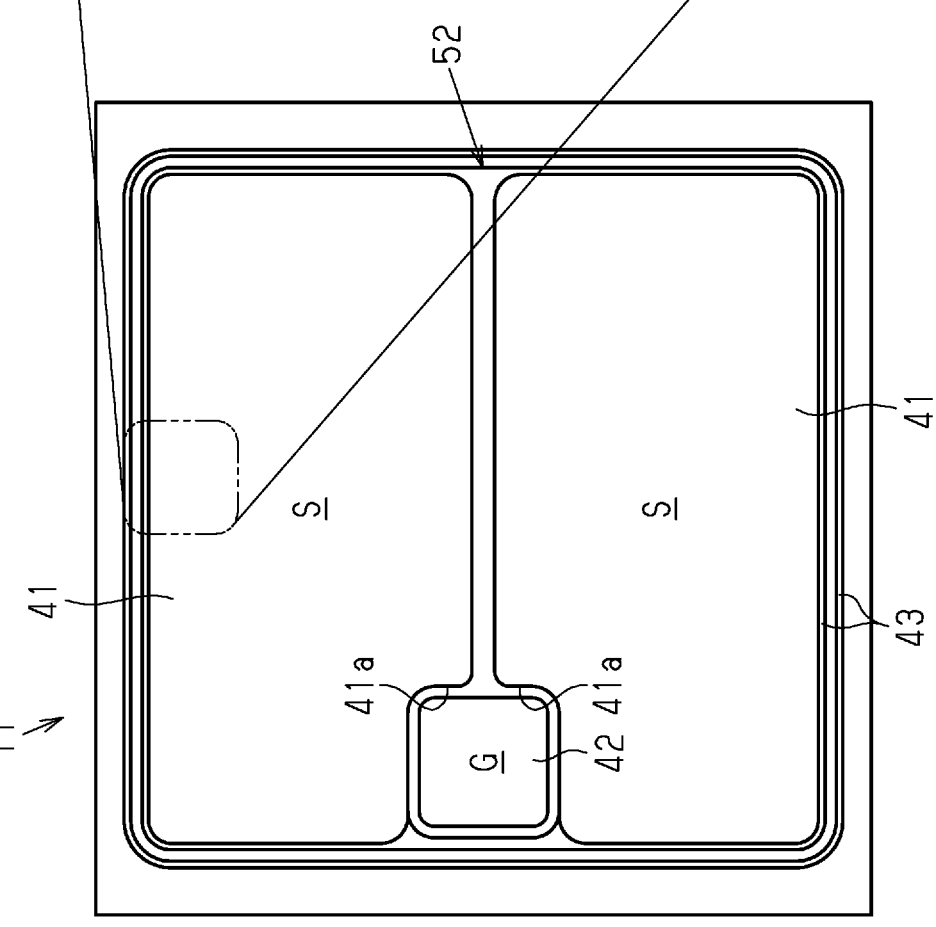
FIG. 5A is a plan view of a switching element.

Each upper switching element 11 has a drain electrode (not illustrated) configuring the first upper terminal (drain terminal), a source electrode 41 configuring the second upper terminal (source terminal), and a gate electrode 42 configuring the upper control terminal (gate terminal) (see FIG. 5A). The drain electrode is provided on the back surface of the upper switching element 11 mounted on the first input wiring portion 23. The source electrode 41 and the gate electrode 42 are provided on the front surface opposite to the back surface of the upper switching element 11. As illustrated in FIG. 5A, a guard ring 43 is provided on the outer peripheral portion of the front surface of the upper switching element 11. The source electrode 41 and the gate electrode 42 are provided inside the guard ring 43. The source electrode 41 occupies most of the area inside the guard ring 43. The source electrode 41 is separated into two electrodes. The source electrode 41 has a recessed portion 41a recessed so as to be separated from the guard ring 43. In the region surrounded by the recessed portion 41a and the guard ring 43, the gate electrode 42 is provided.

As illustrated in FIG. 3, the source electrode 41 (see FIG. 5A) of each upper switching element 11 is electrically connected to the first portion 22a of the output wiring portion 22 by the plurality of upper power wires 44 serving as examples of an upper power connecting members. In the present embodiment, the source electrode 41 of the upper switching element 11 and the output wiring portion 22 are electrically connected by the four upper power wires 44. The upper power wire 44 is made of, for example, aluminum (Al). In addition, the source electrode 41 of each upper switching element 11 is electrically connected to the second upper control wiring portion 26 by the one or more upper control wires 45 serving as examples of upper control connecting members. The upper control wire 45 is provided across the first portion 25a of the first upper control wiring portion 25 in the second direction Y. The upper control wire 45 is made of, for example, aluminum (Al). The wire diameter of the upper power wire 44 is greater than the wire diameter of the upper control wire 45. An example of the wire diameter of the upper power wire 44 is φ 400 μm and an example of the wire diameter of the upper control wire 45 is φ 150 μm. The gate electrode 42 of each upper switching element 11 is electrically connected to the first portion 25a of the first upper control wiring portion 25 by the one or more upper control wires 45. In this manner, the drains of the two upper switching elements 11 are electrically connected to the same first input wiring portion 23, and the source electrodes 41 of the two upper switching elements 11 are electrically connected to the same output wiring portion 22. Thus, the two upper switching elements 11 are connected in parallel to each other. The upper power connecting member may be a lead frame of CIC (Cu/Inver/Cu), for example.

Each of the two lower switching elements 12 is formed to be chip-shaped and mounted on the first portion 22a of the output wiring portion 22. The two lower switching elements 12 are positioned along the first direction X with a gap in between. That is, the two lower switching elements 12 are mounted on the output wiring portion 22 and spaced apart from each other in the first direction X. The two lower switching elements 12 are mounted so as to be located at the same positions as the two upper switching elements 11 in the first direction X. Each lower switching element 12 is positioned on a second input wiring portion 24 side of the first portion 22a of the output wiring portion 22 in the second direction Y. Thus, in the first portion 22a of the output wiring portion 22, it is possible to secure a region to which the plurality of upper power wires 44 is connected.

The two lower switching elements 12 have structures similar to the upper switching elements 11. That is, each lower switching element 12 has a drain electrode (not illustrated), a source electrode 41, a gate electrode 42, and a guard ring 43.

As illustrated in FIG. 3, the source electrode 41 of each lower switching element 12 is electrically connected to the first portion 24a of the second input wiring portion 24 by the plurality of lower power wires 46 serving as examples of lower power connecting members. In the present embodiment, the source electrode 41 of the lower switching element 12 and the second input wiring portion 24 are electrically connected by the four lower power wires 46. The lower power wire 46 is made of, for example, aluminum (Al). The wire diameter of the lower power wire 46 is equal to the wire diameter of the upper power wire 44. In addition, the source electrode 41 of each lower switching element 12 is electrically connected to the second lower control wiring portion 28 by one or more lower control wires 47 as examples of lower control connecting members. The lower control wire 47 is made of, for example, aluminum (Al). The wire diameter of the lower control wire 47 is equal to the wire diameter of the upper control wire 45. The lower control wire 47 connected to the source electrode 41 of each lower switching element 12 is provided across the first portion 24a of the second input wiring portion 24 and the first portion 27a of the first lower control wiring portion 27 in the second direction Y. The gate electrode 42 of each lower switching element 12 is electrically connected to the first portion 27a of the first lower control wiring portion 27 by the one or more lower control wires 47. The lower control wire 47 connected to the gate electrode 42 is provided across the first portion 24a of the second input wiring portion 24. In this manner, the drains of the two lower switching elements 12 are electrically connected to the same output wiring portion 22, and the source electrodes 41 of the two lower switching elements 12 are electrically connected to the same second input wiring portion 24. Thus, the two lower switching elements 12 are connected in parallel to each other. The lower power connecting member may be a lead frame of CIC (Cu/Inver/Cu), for example.

The upper capacitor 13 is mounted on the bent portion 25c of the first upper control wiring portion 25 and the upper island portion 37. More specifically, the first terminal of the upper capacitor 13 is mounted on the bent portion 25c of the first upper control wiring portion 25, and the second terminal of the upper capacitor 13 is mounted on the upper island portion 37. As illustrated in FIG. 3, the second terminal of the upper capacitor 13 is located at the end portion of the upper island portion 37 on the side of the first portion 23a of the first input wiring portion 23. In this manner, the upper capacitor 13 electrically connects the drain terminal 11d (drain) shared by the upper switching elements 11 and the gate terminal 11g (gate) shared by the upper switching elements 11.

The lower capacitor 14 is mounted on the bent portion 27c of the first lower control wiring portion 27 and the lower island portion 38. More specifically, the first terminal of the lower capacitor 14 is mounted on the bent portion 27c of the first lower control wiring portion 27, and the second terminal of the lower capacitor 14 is mounted on the lower island portion 38. As illustrated in FIG. 3, the second terminal of the lower capacitor 14 is located at the end portion of the lower island portion 38 on the side of the first portion 24a of the second input wiring portion 24. In this manner, the lower capacitor 14 electrically connects the drain terminal 12d (drain) shared by the lower switching elements 12 and the gate terminals 12g (gates) shared by the lower switching elements 12.

As illustrated in FIG. 4, a heat radiation plate 29 exposed from the encapsulation resin 40 is provided on the back-surface side of the ceramic substrate 21. The heat radiation plate 29 is made of copper (Cu). The plate thickness of the heat radiation plate 29 is thicker than the plate thickness of the ceramic substrate 21. The heat radiation plate 29 is formed to have a shape similar to the shape of the ceramic substrate 21. The outer peripheral edge of the heat radiation plate 29 is located inside the outer peripheral edge of the ceramic substrate 21. As a result, the encapsulation resin 40 goes around to the back-surface side of the ceramic substrate 21 so that adhesion between the ceramic substrate 21 and the encapsulation resin 40 is improved. The surface of the heat radiation plate 29 may be plated with nickel (Ni) or silver (Ag) assuming that the heat radiation plate 29 is connected to a cooler or the like.

Structure of Upper Switching Element and Lower Switching Element

Figure 6:
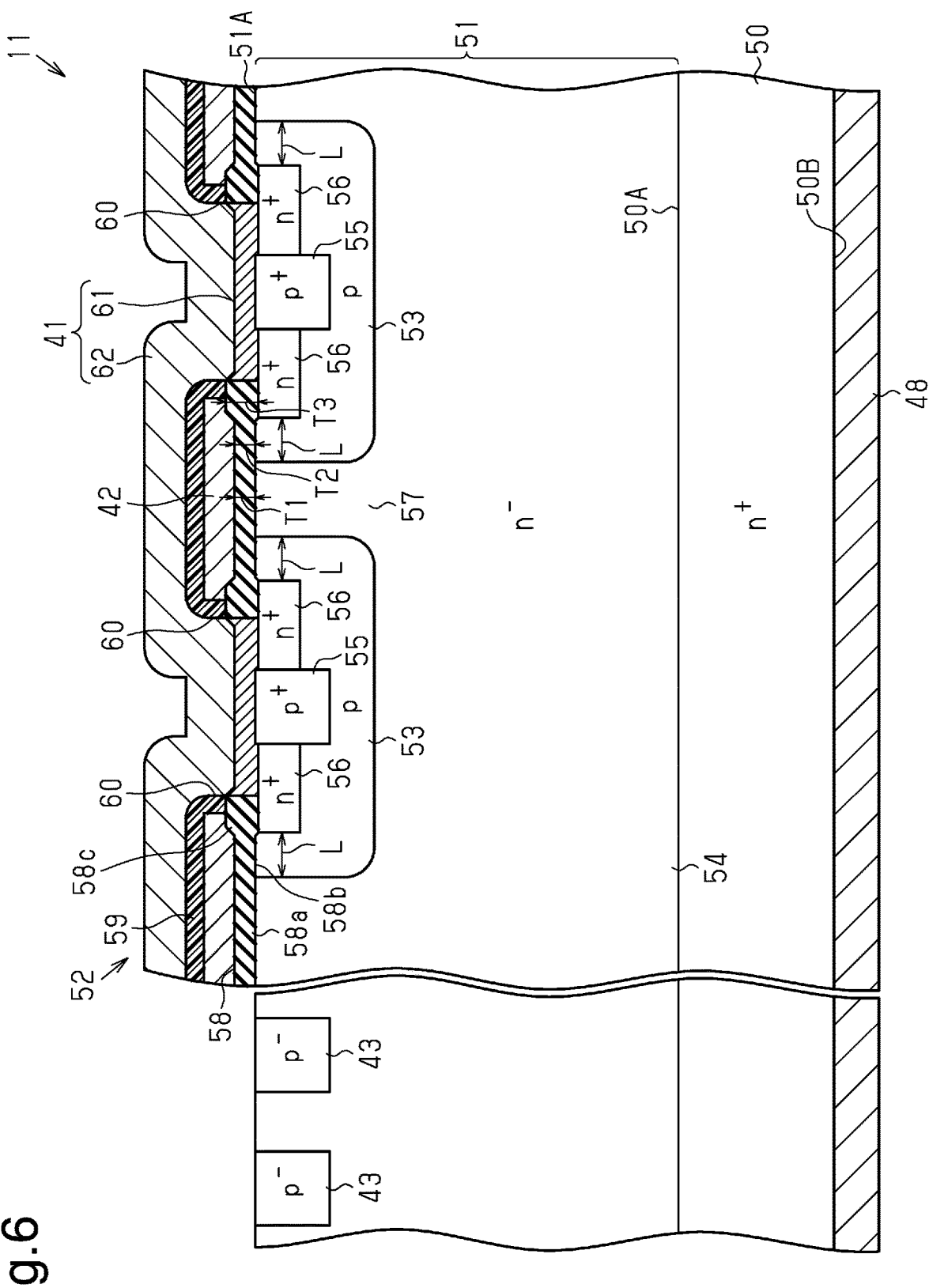
FIG. 6 is a cross-sectional view of the switching element.

Next, the structures of the upper switching element 11 and the lower switching element 12 will be described. FIGS. 5 and 6 illustrate an example of the structure of the upper switching element 11. The upper switching element 11 and the lower switching element 12 have identical structures. Therefore, FIGS. 5 and 6 also illustrate an example of the structure of the lower switching element 12. In addition, hereinafter, the structure of the upper switching element 11 will be described, and the description of the structure of the lower switching element 12 will be omitted. The structure of each of the upper switching element 11 and the lower switching element 12 is not limited to the structure illustrated in FIGS. 5 and 6, and various modifications are possible.

The upper switching element 11 is a planar gate type VDMOSFET (Vertical Double implanted MOSFET) using silicon carbide (SiC) and has the shape of a square chip in a plan view as illustrated in FIG. 5A.

As illustrated in FIG. 6, the upper switching element 11 has an $n^+$-type SiC substrate 50. In the present embodiment, the SiC substrate 50 functions as the drain of the upper switching element 11, a front surface 50A (upper surface) that is a silicon surface (Si surface), and a back surface 50B (lower surface) that is a carbon surface (C surface).

On the SiC substrate 50, an epitaxial layer 51 made of $n^-$-type SiC having a concentration lower than that of the SiC substrate 50 is laminated. The epitaxial layer 51 as a semiconductor layer is grown with the Si surface as a growth main surface. Therefore, a front surface 51A of the epitaxial layer 51 formed by epitaxial growth is a Si surface in the same manner as the front surface 50A of the SiC substrate 50.

As illustrated in FIG. 5A, in the upper switching element 11, an active region 52 is formed which is arranged in the center portion on the epitaxial layer 51 (see FIG. 6) in a plan view and functions as a field effect transistor. In the epitaxial layer 51, the guard rings 43 (cross hatched in FIG. 5B) are formed so as to surround the active region 52 at a distance from the active region 52. In the present embodiment, two guard rings 43 are formed.

As illustrated in FIG. 6, the interval between the active region 52 and the guard ring 43 is substantially constant over the entire circumference. The guard ring 43 is a $p^-$-type low concentration region formed by implanting a p-type impurity into the epitaxial layer 51.

In the active region 52, on a front surface 51A side (Si surface side) of the epitaxial layer 51, a large number of p-type body regions 53 are arranged in a matrix (matrix form) at a constant pitch in the row direction and the column direction. The shape of each body region 53 is, for example, a square in a plan view. The p-type impurity may be, for example, aluminum (Al). In contrast, the region of the epitaxial layer 51 on a SiC substrate 50 side (C surface side) of the body region 53 is an $n^-$-type drift region 54 in which the condition after epitaxial growth is maintained.

A $p^+$-type body contact region 55 is formed in a center portion of a front-surface layer portion of each body region 53, and an $n^+$-type source region 56 is formed so as to surround the body contact region 55. The shape of the body contact region 55 is, for example, a square in a plan view. The source region 56 has, for example, a square frame shape in a plan view. An example of the n-type impurity concentration is phosphorus (P).

In addition, in the active region 52, the region between the body regions 53 arranged in a matrix at a constant pitch (interbody region 57 sandwiched between the side surfaces of the adjacent body regions 53) is in the form of a lattice having a constant width.

A lattice-shaped gate insulating film 58 (not illustrated in FIG. 5B) is formed on the interbody region 57 along the interbody region 57. The gate insulating film 58 extends across the space between the adjacent body regions 53, and covers a portion (peripheral portion of the body region 53) surrounding the source region 56 in the body region 53 and an outer peripheral edge of the source region 56. In the present embodiment, the gate insulating film 58 is made of an oxide film containing nitrogen (N), for example, a silicon nitride oxide film formed by thermal oxidation using gases containing nitrogen and oxygen.

The gate insulating film 58 includes a first portion 58a in contact with the epitaxial layer 51 outside the body region 53, a second portion 58b in contact with the body region 53, and a third portion 58c in contact with the source region 56. As illustrated in FIG. 6, film thickness T3 of the third portion 58c is greater than film thickness T1 of the first portion 58a and film thickness T2 of the second portion 58b. More specifically, a lower interface (interface with the source region 56) of the third portion 58c is located downward from a lower interface (interface with the epitaxial layer 51) of the first portion 58a and a lower interface (interface with the body region 53) of the second portion 58b, that is, located on a SiC substrate 50 side and deeper than the front surface 51A of the epitaxial layer 51. In addition, an upper interface (interface with the gate electrode 42) of the third portion 58c is located upward from an upper interface (interface with the gate electrode 42) of the first portion 58a and an upper interface (interface with the gate electrode 42) of the second portion 58b, that is, located on a gate electrode 42 side and farther from the front surface 51A of the epitaxial layer 51.

On the gate insulating film 58, the gate electrode 42 is formed. The gate electrode 42 is formed in a lattice shape along the lattice-shaped gate insulating film 58 and faces the peripheral portion of each body region 53 with the gate insulating film 58 interposed in between. More specifically, the gate electrode 42 faces a region extending across the epitaxial layer 51 outside the body region 53, the body region 53, and the source region 56, with the gate insulating film 58 in between. Therefore, the gate electrode 42 overlaps the source region 56 in a plan view. For example, the gate electrode 42 protrudes slightly from the boundary line between the body region 53 and the source region 56 toward the source region 56 in a plan view. As a result, it is possible to reliably make the gate electrode 42 face the body region 53 between the source region 56 and the epitaxial layer 51. Therefore, it is possible to reliably control formation of a channel in the body region 53. The gate electrode 42 is made of, for example, polysilicon. In the gate electrode 42, for example, a p-type impurity is introduced at a high concentration to reduce resistance.

In the upper switching element 11, a boundary between unit cells is set at the center in the width direction of the interbody region 57. In each unit cell, an annular channel is formed at the peripheral portion of the body region 53 of each unit cell by controlling the voltage to be applied to the gate electrode 42 (for example, by applying a voltage of 6V or higher). A drain current flowing to the front surface 51A side of the epitaxial layer 51 along the four side surfaces of each body region 53 in the drift region 54 can flow through the annular channel to the source region 56. The channel length L is defined by the width of the body region 53 immediately below the gate electrode 42.

On the epitaxial layer 51, an interlayer insulating film 59 made of, for example, silicon oxide ($SiO_2$) is laminated so as to cover the gate electrode 42. In the interlayer insulating film 59, a contact hole 60 is formed. In the contact hole 60, the center portion of the source region 56 and the entire body contact region 55 are exposed.

On the epitaxial layer 51, a source electrode 41 is formed. The source electrode 41 is collectively brought into contact through the respective contact holes 60. That is, the source electrode 41 is wiring shared by all of the unit cells. An interlayer insulating film (not illustrated) is formed on the source electrode 41. By forming a region from which the interlayer insulating film is removed, that is, forming the region where the source electrode 41 is exposed, the source electrode 41 configures a source electrode pad.

The source electrode 41 has a structure in which a Ti/TiN layer 61 and the Al layer 62 are laminated in order from a side in contact with the epitaxial layer 51. The Ti/TiN layer 61 is a laminated film in which a Ti layer as an adhesion layer is provided on a epitaxial layer 51 side and a TiN layer as a barrier layer is laminated on the Ti layer. The barrier layer limits diffusion of the atoms (Al atoms) of the Al layer 62 toward the epitaxial layer 51 side.

On the back surface 50B of the SiC substrate 50, the drain electrode 48 is formed so as to cover the entirety of the back surface 50B. The drain electrode 48 is shared by all of the unit cells. As the drain electrode 48, for example, a laminated structure (Ti/Ni/Au/Ag) in which titanium (Ti), nickel (Ni), gold (Au), and silver (Ag) are laminated in order from the SiC substrate 50 side can be applied.

Comparative Example

Figure 7:
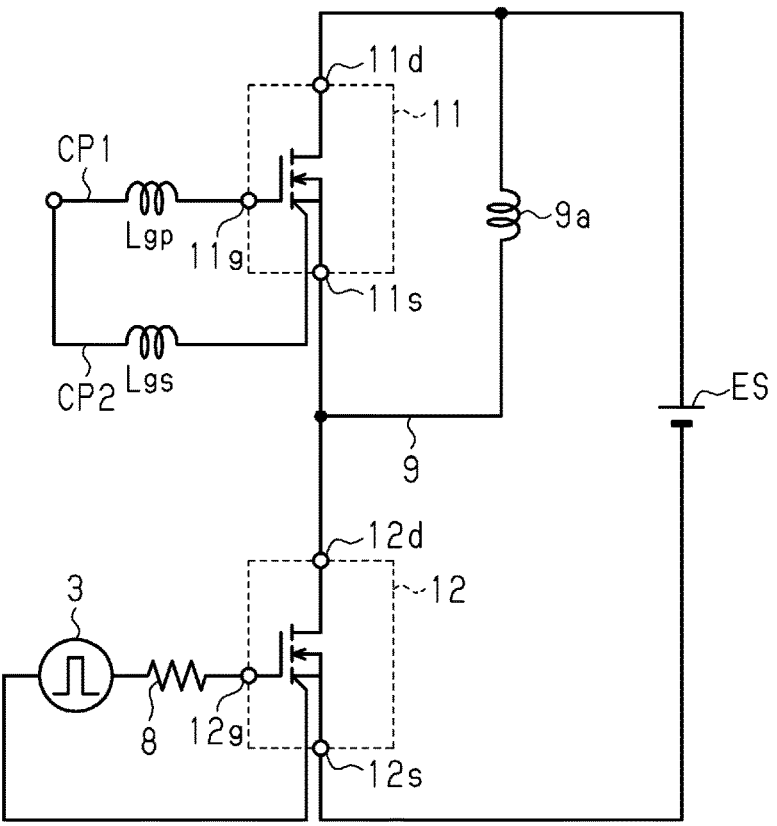
FIG. 7 is a schematic circuit diagram illustrating application of a power module of a comparative example.

FIG. 7 illustrates the circuit configuration of a power module of a comparative example. In a circuit of the power module of the comparative example, a case where an upper switching element 11 is turned off and a lower switching element 12 is turned on and off is illustrated.

In the power module of the comparative example, the upper capacitor 13 and the lower capacitor 14 are omitted from the circuit configuration of the power module 1 of the present embodiment illustrated in FIG. 1, and illustration of body diodes 11a, 12a is omitted. In addition, in the power module of the comparative example, a positive terminal of a power supply ES is connected to a drain terminal 11d of the upper switching element 11, and a negative terminal of the power supply ES is connected to a source terminal 12s of the lower switching element 12. In addition, wiring 9 connecting the drain terminal 11d and a source terminal 11s of the upper switching element 11 is provided. The wiring 9 has an inductor load 9a. In the circuit configuration of the power module of the comparative example, the gate terminal 11g and the source terminal 11s of the upper switching element 11 short-circuits first connecting wiring CP1 having parasitic inductance Lgp based on a first upper control wiring portion 25 and second upper connecting wiring CP2 having parasitic inductance Lgs based on a second upper control wiring portion 26. The gate terminal 12g of the lower switching element 12 is connected to a lower gate drive circuit 3. A gate resistor 8 is provided between the gate terminal 12g and the lower gate drive circuit 3.

Since a SiC MOSFET is used for each of the upper switching element 11 and the lower switching element 12 having such a configuration, each of the upper switching element 11 and the lower switching element 12 has a high electric breakdown field. Therefore, by reducing the thickness and increasing the concentration of a drift region 54 of each of the switching elements 11, 12, low on-resistance can be realized. In contrast, the extension width of a depletion layer is limited since the concentration of the drift region 54 of each switching element 11, 12, is increased. Therefore, the gate-drain capacitance Cgd hardly decreases. As a result, as illustrated in FIG. 8, in a case where the gate-source capacitance is Cgs, the value of Cgs/Cgd tends to be small.

Figure 8:
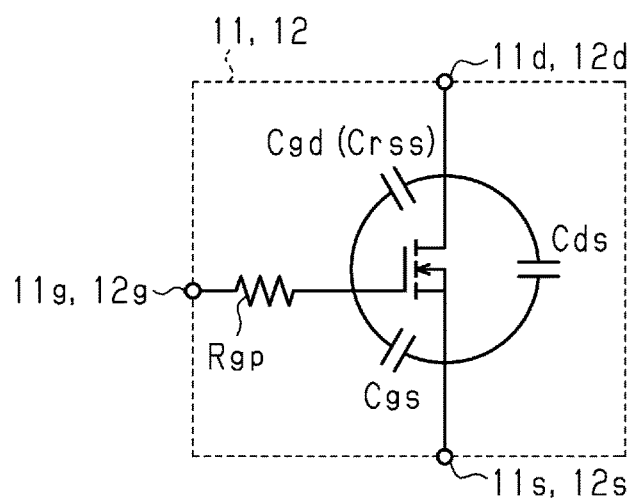
FIG. 8 is a schematic diagram illustrating parasitic capacitance and parasitic resistance of an upper switching element and a lower switching element.
Figure 9:
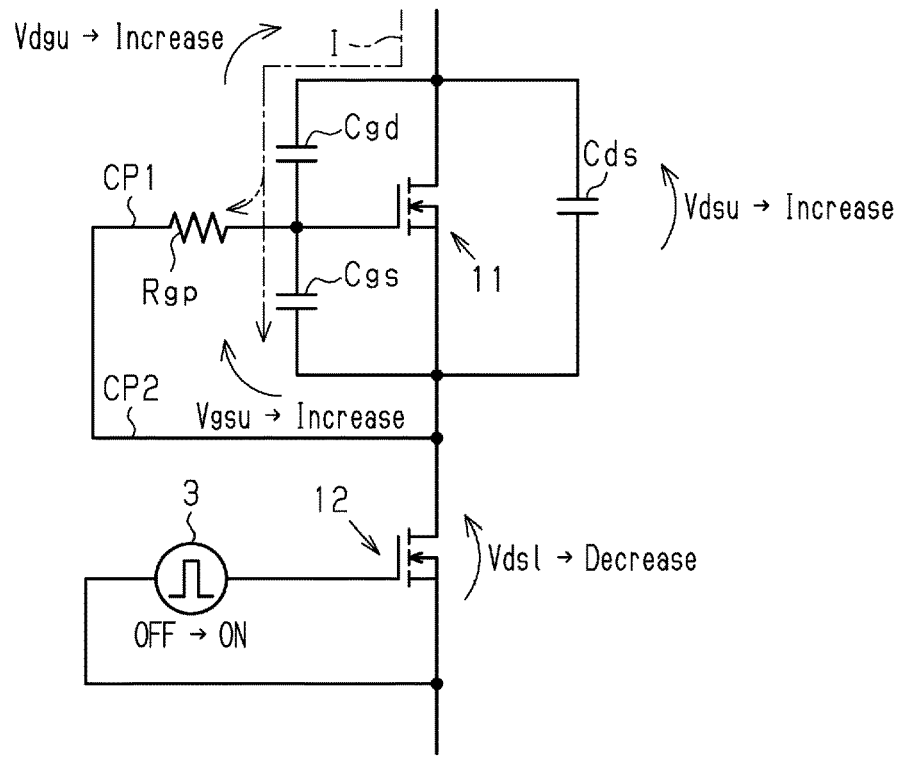
FIG. 9 is a schematic circuit diagram illustrating a change in drain-source voltage of the lower switching element and changes in drain-source voltage, drain-gate voltage, and gate-source voltage of the upper switching element, when the lower switching element is changed from an off state to an on state.
Figure 10:
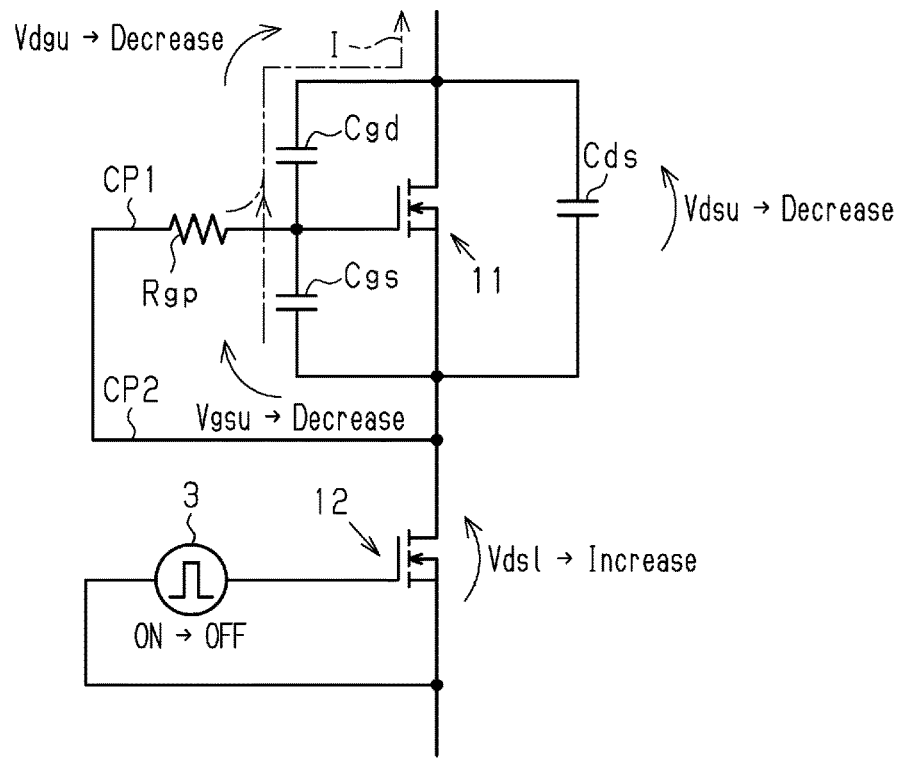
FIG. 10 is a schematic circuit diagram illustrating a change in drain-source voltage of the lower switching element when the lower switching element is changed from the on state to the off state, and changes in drain-source voltage, drain-gate voltage, and gate-source voltage of the upper switching element.

FIGS. 9 and 10 are circuit diagrams based on FIGS. 7 and 8, and illustrate schematic circuit diagrams illustrating a change in the drain-source voltage Vds1 of the lower switching element 12 and changes in the drain-source voltage Vdsu, the drain-gate voltage Vdgu, and the gate-source voltage Vgsu of the upper switching element 11 when the state of the lower switching element 12 is changed.

In the power module of the comparative example, in a case where the lower switching element 12 is changed from the off state to the on state, as illustrated in FIG. 9, the drain-source voltage Vds1 of the lower switching element 12 decreases and the drain-source voltage Vdsu and the drain-gate voltage Vdgu of the upper switching element 11 increase. In such a transient response, since the gate and the source of the upper switching element 11 are short-circuited by the connecting wirings CP1 and CP2, the gate-source voltage Vgsu would not change. However, since the above inductance components (Lgp+Lgs) and parasitic gate resistance Rgp exist between the gate and the source of the upper switching element 11, a divided voltage is instantaneously generated in the gate-source capacitance Cgs. In other words, a positive surge voltage is instantaneously generated between the gate and the source. As a result, the gate-source voltage Vgsu is sharply increased by a change dVds/dt of the drain-source voltage Vds, thereby exceeding a threshold voltage so that self-turn-on may occur.

In order to limit the occurrence of such self-turn-on, a countermeasure of applying a negative bias to the gate of the upper switching element 11 is known. That is, by maintaining the gate-source voltage Vgsu on the negative side in advance, the difference between the gate-source voltage Vgsu and the gate threshold voltage is increased. As a result, even if a positive surge voltage is applied to the gate, the voltage will hardly exceed the gate threshold voltage.

In each switching element 11, 12, the negative absolute maximum rated value of the gate-source voltage Vgs is smaller than the positive absolute maximum rated value of the gate-source voltage Vgs caused by the characteristics of the SiC MOSFET. In one example, the negative absolute maximum rated value of the gate-source voltage Vgs of each switching element 11, 12 is −10 V and the positive absolute maximum rated value of the gate-source voltage Vgs is 26 V. Therefore, if the gate negative bias is applied, the difference from the negative absolute maximum rated value of the gate-source voltage Vgs becomes small, and the range on the negative side of the tolerable gate-source voltage Vgs becomes narrower.

Here, in a case where the lower switching element 12 is changed from the on state to the off state, as illustrated in FIG. 10, the drain-source voltage Vds1 of the lower switching element 12 increases and the drain-source voltage Vdsu and the drain-gate voltage Vdgu of the upper switching element 11 decrease. Similarly, in such a transient response, caused by the inductance components (Lgp+Lgs) and the parasitic gate resistance Rgp, a divided voltage is instantaneously generated in the gate-source capacitance Cgs. That is, a negative surge voltage is instantaneously generated between the gate and the source. As a result, there is a possibility that the gate-source voltage Vgsu sharply decreases caused by the change dVds/dt of the drain-source voltage Vds and therefore the gate-source voltage Vgsu may be lower than a negative-side absolute maximum rated value. In particular, in a case of applying a negative bias to the gate of the upper switching element 11, the difference between the gate-source voltage Vgsu and the negative absolute maximum rated value becomes small. Thus, the negative surge voltage results in the gate-source voltage Vgsu to easily fall below the negative absolute maximum rated value.

Figure 11:
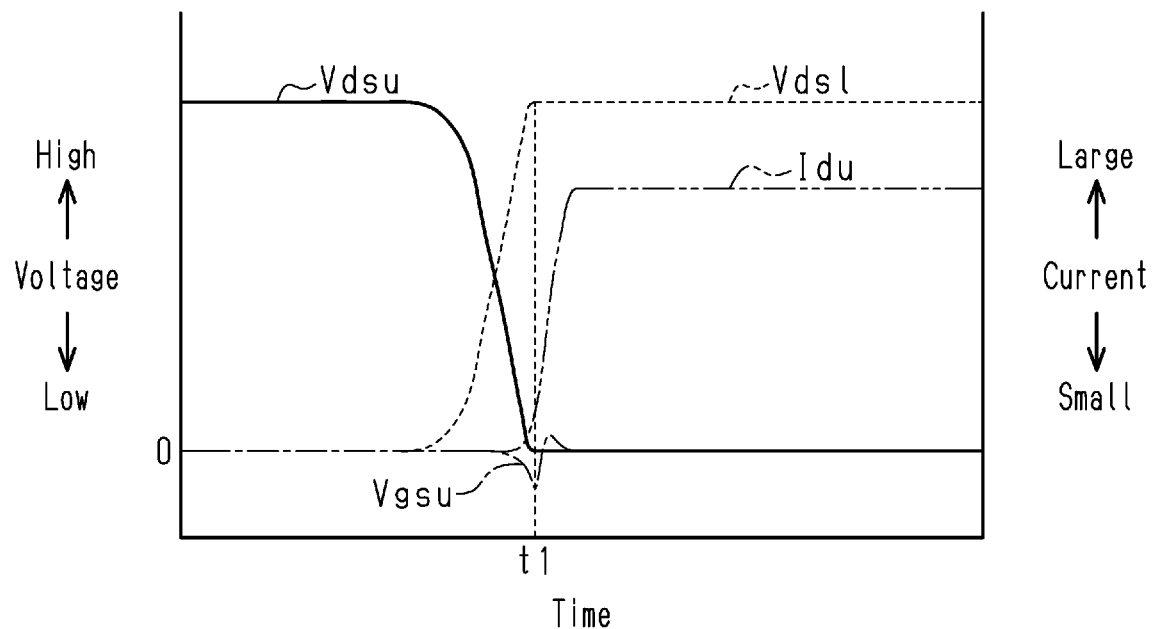
FIG. 11 is a graph illustrating transitions of the drain-source voltage of the lower switching element and the drain-source voltage and the gate-source voltage of the upper switching element, when the lower switching element is changed from the on state to the off state.

FIG. 11 illustrates transitions of the drain-source voltage Vdsu, the gate-source voltage Vdsu, the gate-source Vgsu, and the drain current Idu of the upper switching element 11, and the drain-source voltage Vds1 of the lower switching element 12 in a case where the lower switching element 12 in the power module of the comparative example is changed from the on state to the off state.

As can be seen from FIG. 11, the gate-source voltage Vgsu, which is a divided voltage of the gate-source capacitance Cgs, becomes greatest on the negative side at time t1 when the drain-source voltage Vdsu of the upper switching element 11 most decreases. In other words, the gate-source voltage Vgsu becomes greatest on the negative side when the drain-source voltage Vds1 of the lower switching element 12 becomes highest. In this manner, when the lower switching element 12 is driven and the upper switching element 11 is not driven, the drain-source voltage Vdsu of the upper switching element 11 is determined by the drain-source voltage Vds1 of the lower switching element 12.

Figure 12:
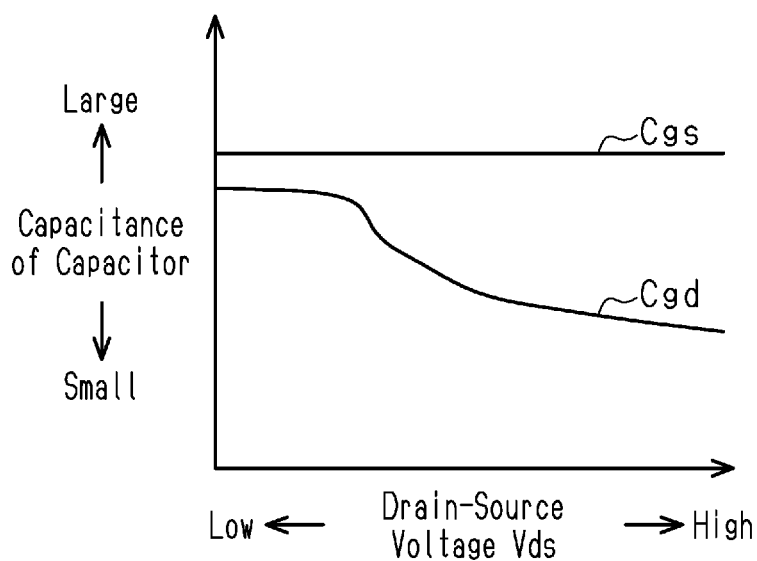
FIG. 12 is a graph illustrating the relationship between the drain-source voltage and the capacitance with respect to the gate-source capacitance and the gate-drain capacitance of the upper switching element and the lower switching element.

In addition, the divided pressure of the gate-source capacitance Cgs is determined by the inverse ratio of Cgs/Cgd. That is, the divided pressure of the gate-source capacitance Cgs increases as Cgs/Cgd decreases. In other words, the divided pressure of the gate-source capacitance Cgs decreases as Cgs/Cgd increases. In each of the switching elements 11, 12, the relationship between each of the gate-source capacitance Cgs and the gate-drain capacitance Cgd and the drain-source voltage Vdsu is as illustrated in the graph of FIG. 12 caused by the characteristics of the SiC MOSFET. More specifically, the gate-source capacitance Cgs does not substantially change even if the drain-source voltage Vdsu changes. In contrast, the gate-drain capacitance Cgd tends to decrease as the drain-source voltage Vdsu increases. Therefore, Cgs/Cgd decreases in a region where the drain-source voltage Vdsu is relatively low, and Cgs/Cgd increases in a region where the drain-source voltage Vdsu is relatively high. Cgs/Cgd increases as the drain-source voltage Vdsu increases.

Since the gate-source voltage Vgsu of the upper switching element 11 instantaneously changes as the drain-source voltage Vdsu of the upper switching element 11 changes, it is necessary to reduce the changing rate of the drain-source voltage Vdsu. In addition, since the drain-source voltage Vdsu of the upper switching element 11 changes together with the drain-source voltage Vds1 of the lower switching element 12, in order to reduce the surge voltage of the gate-source voltage Vgsu of the upper switching element 11, it is sufficient to reduce the changing rate of the drain-source voltage Vds1 of the lower switching element 12. The changing rate of the drain-source voltage Vds1 of the lower switching element 12 is roughly determined by the gate-drain capacitance Cgd. More specifically, the changing rate of the drain-source voltage Vds1 decreases as the gate-drain capacitance Cgd increases.

Therefore, the power module 1 of the present embodiment has the upper capacitor 13 electrically connected to the gate terminal 11g and the drain terminal 11d of the upper switching element 11, and the lower capacitor 14 electrically connected to the gate terminal 12g and the drain terminal 12d of the lower switching element 12.

According to this configuration, for example, in a case where the lower switching element 12 is changed from the off state to the on state, the changing rate of the drain-source voltage Vds1 is decreased by a gate current charging the lower capacitor 14. Accordingly, the changing rate of the drain-source voltage Vdsu of the upper switching element 11 decreases. Therefore, since changes are limited in the gate-source voltage Vgsu of the upper switching element 11, the occurrence of self-turn-on is limited. In addition, for example, in a case where the lower switching element 12 is switched from the on state to the off state, the changing rate of the drain-source voltage Vds1 of the lower switching element 12 is decreased by the lower capacitor 14 discharging electricity to the gate terminal 12g. Accordingly, the changing rate of the drain-source voltage Vdsu of the upper switching element 11 is decreased thereby limiting changes in the gate-source voltage Vgsu. Therefore, the gate-source voltage Vgsu is prevented from falling below the negative absolute maximum rated value. The upper capacitor 13 is connected also to the upper switching element 11 assuming that the upper switching element 11 is switched between the on state and the off state. However, since the upper capacitor 13 is connected outside the parasitic gate resistance Rgp of the upper switching element 11, the effect of decreasing Cgs/Cgd with respect to instantaneous behavior at the time of switching of the lower switching element 12 is small, and increases in the divided pressure to the gate-source capacitance Cgs are limited. Therefore, the surge voltage of the gate-source voltage Vgsu of the upper switching element 11 can be effectively limited.

In addition, it is preferable that the upper capacitor 13 and the lower capacitor 14 have the relationship of the inter-terminal voltage and capacitance as illustrated in FIG. 13. Specifically, as the inter-terminal voltage of each of the upper capacitor 13 and the lower capacitor 14 increases, the capacitance of each of the upper capacitor 13 and the lower capacitor 14 increases. In the present embodiment, the capacitance in the region where the inter-terminal voltage of the upper capacitor 13 and the lower capacitor 14 is high is of a level that is the same as the gate-drain capacitance Cgd in the region where the drain-source voltage Vdsu is high.

According to this configuration, for example, in a case where the lower switching element 12 is changed from the on state to the off state, the drain-source voltage Vds1 of the lower switching element 12 becomes higher so that the inter-terminal voltage of the lower capacitor 14 becomes higher. In this case, the capacitance of the lower capacitor 14 increases so that the charge amount necessary for the voltage change of the lower capacitor 14 increases. Therefore, changing rate of the drain-source voltage Vds1 of the lower switching element 12 decreases. Accordingly, the changing rate of the drain-source voltage Vdsu of the upper switching element 11 is decreased so that changes in the gate-source voltage Vgsu are further limited.

In addition, for example, in a case where the lower switching element 12 is changed from the on state to the off state, the drain-source voltage Vdsu of the upper switching element 11 becomes higher so that the inter-terminal voltage of the upper capacitor 13 becomes smaller and the capacitance of the upper capacitor 13 becomes smaller. Here, as described above, since the upper capacitor 13 is connected outside the parasitic gate resistance Rgp of the upper switching element 11, the effect of decreasing Cgs/Cgd with respect to instantaneous behavior at the time of switching of the lower switching element 12 is small. However, it cannot be said that there is no effect at all in a case where the parasitic gate resistance Rgp is extremely small, or the like. Therefore, if the capacitance of the upper capacitor 13 at the time of application of a low voltage is great, the divided voltage of the gate-source voltage Vgsu of the upper switching element 11 with respect to the drain-source voltage Vdsu of the upper switching element 11 increases, and a change in the gate-source voltage Vgsu increases. However, as illustrated in FIG. 14, in a case where the drain-source voltage Vdsu of the upper switching element 11 is low, the capacitance of the upper capacitor 13 is small. Therefore, the effect of reducing Cgs/Cgd can be limited.

Simulation Result

Figure 15:
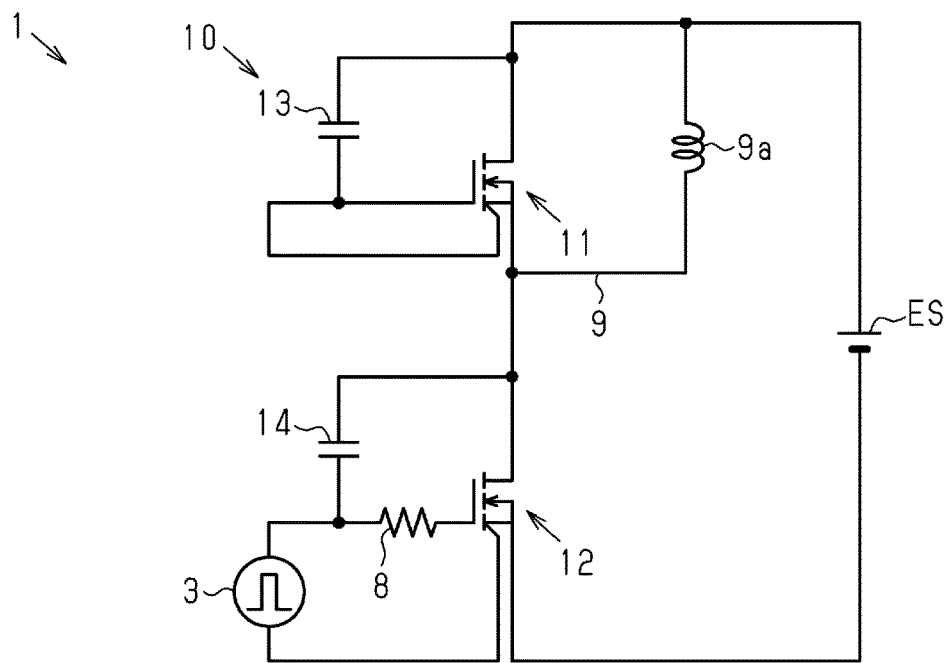
FIG. 15 is a circuit diagram for simulating the power module according to the first embodiment.

Simulation on the relationship between generation of the negative surge voltage and switching loss in a case where the upper switching element 11 is turned off and the lower switching element 12 is turned on and off in the power modules 1 of the comparative example and the present embodiment were carried out based on the schematic circuit configurations illustrated in FIGS. 7 and 15. FIG. 7 illustrates a schematic circuit configuration of a power module of a comparative example, and FIG. 15 illustrates a schematic circuit configuration in the case of performing external connection similar to that of FIG. 7 in the power module 1 of the present embodiment.

In the circuit configuration of FIG. 15, the source and the gate of the upper switching element 11 are short-circuited, and the lower gate drive circuit 3 is electrically connected to the gate of the lower switching element 12. The gate resistor 8 is provided between the gate and the lower gate drive circuit 3. The first terminal of the gate resistor 8 is connected to the gate of the lower switching element 12 and the second terminal of the gate resistor 8 is connected to the lower gate drive circuit 3. The first terminal of the lower capacitor 14 is connected to the drain of the lower switching element 12 and the second terminal of the lower capacitor 14 is connected to the second terminal of the gate resistor 8. The positive terminal of the power supply ES is electrically connected to the drain of the upper switching element 11 and the negative terminal of the power supply ES is electrically connected to the source of the lower switching element 12. The circuit configuration of FIG. 15 has the wiring 9 connecting the section between the positive terminal of the power supply ES and the drain of the upper switching element 11 and the section between the source of the upper switching element 11 and the drain of the lower switching element 12. The wiring 9 has an inductor load 9a.

In the power module of the comparative example, simulations were carried out in cases where the value of the gate resistor 8 was changed to 2 Ω, 3 Ω, 4Ω, and 5Ω. Here, a case where the value of the gate resistor 8 is 2Ω in the circuit configuration of the power module of the comparative example and the present embodiment is defined as a reference condition.

Figure 16:
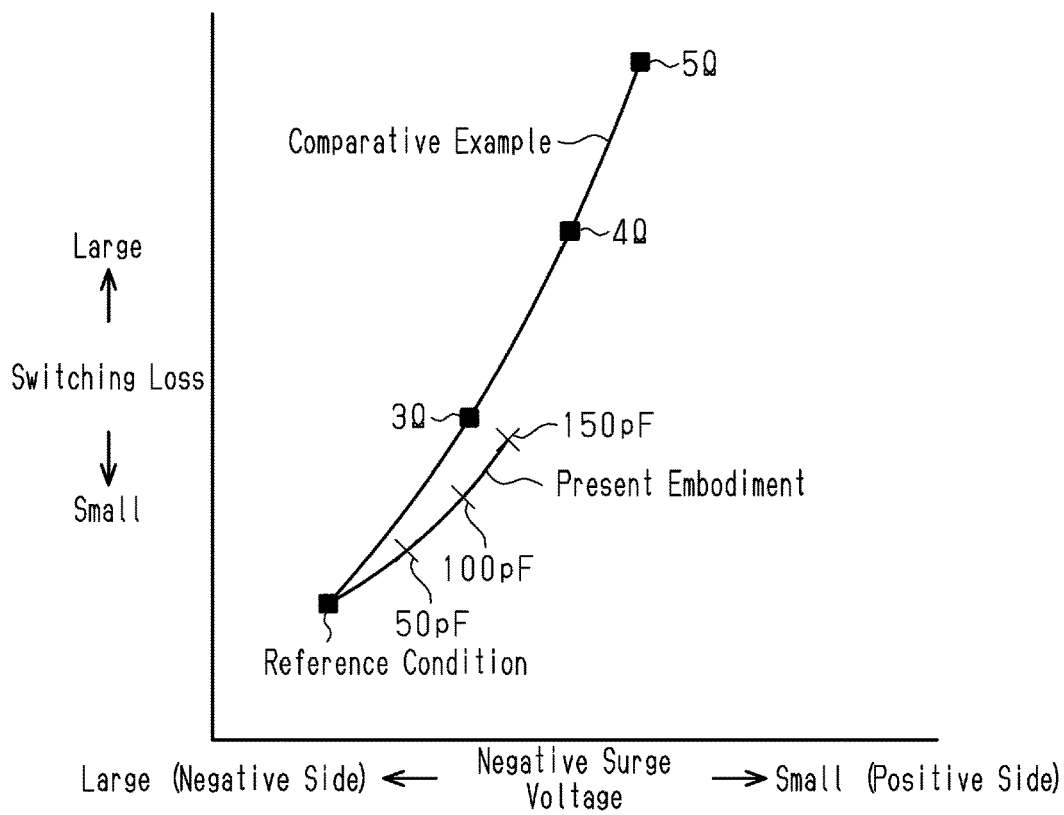
FIG. 16 is a graph illustrating simulation results of the power module of the comparative example of FIG. 7 and the power module of FIG. 15, and illustrating the relationship between a negative surge voltage and switching loss.

As illustrated in FIG. 16, in the power module of the comparative example, an increase in the value of the gate resistor 8 decreases the switching speed of the lower switching element 12 (changing rate of the drain-source voltage Vds1), and thus the absolute value of the negative surge voltage decreases. In contrast, an increase in the value of the gate resistor 8 rapidly increases switching loss.

Simulations were performed in cases where capacitance of the upper capacitor 13 and the lower capacitor 14 were changed to 50 pF, 100 pF, and 150 pF in the power module 1 of the present embodiment.

As illustrated in FIG. 16, in the power module 1 of the present embodiment, the upper capacitor 13 and the lower capacitor 14 results in the absolute value of the negative surge voltage being smaller than the reference condition. As the capacitance of the upper capacitor 13 and the lower capacitor 14 increases, the absolute value of the negative surge voltage decreases. In contrast, even though the switching loss increases as the capacitance of the upper capacitor 13 and the lower capacitor 14 increase, the switching loss becomes smaller as compared with the case of an increase in the value of the gate resistor 8 as in the power module of the comparative example.

According to the present embodiment, the following advantages can be obtained.

(1-1) The power module 1 has the upper capacitor 13 electrically connected to the drain terminal 11d and the gate terminal 11g of the upper switching element 11, and the lower capacitor 14 electrically connected to the drain terminal 12d and the gate terminal 12g of the lower switching element 12. According to this configuration, for example, when the lower switching element 12 changes from the on state to the off state, the lower capacitor 14 decreases the changing rate of the drain-source voltage Vds1 of the lower switching element 12. As a result, since the changing rate of the drain-source voltage Vdsu of the upper switching element 11 decreases, the changing rate of the gate-source voltage Vgsu of the upper switching element 11 decreases. This limits increases in the surge voltage of the gate-source voltage Vgsu of the upper switching element 11. Thus, fluctuation of the gate-source voltage Vgsu of the upper switching element 11 can be reduced. In addition, for example, when the upper switching element 11 changes from the on state to the off state, the upper capacitor 13 decreases the changing rate of the drain-source voltage Vdsu of the upper switching element 11. As a result, since the changing rate of the drain-source voltage Vds1 of the lower switching element 12 decreases, the changing rate of the gate-source voltage Vgs1 of the lower switching element 12 decreases. This limits increases in the surge voltage of the gate-source voltage Vgs1 of the lower switching element 12. Thus, fluctuation of the gate-source voltage Vgs1 of the lower switching element 12 can be reduced.

(1-2) The upper capacitor 13 is configured so that the capacitance increases when the drain-source voltage Vdsu of the upper switching element 11 is a positive value. The lower capacitor 14 is configured so that the capacitance increases in a case where the drain-source voltage Vds1 of the lower switching element 12 is a positive value. According to this configuration, it is possible to further increase the gate-drain capacitance Cgd in a region where the drain-source voltage Vds is high, and it is possible to reduce fluctuation of the gate-source voltage Vgs in a preferred manner.

(1-3) In the power module 1, the plurality of (two) upper switching elements 11 are connected in parallel to each other and the plurality (two) of the lower switching elements 12 are connected in parallel to each other. Therefore, on-resistance of the plurality of upper switching elements 11 and on-resistance of the plurality of lower switching elements 12 become small. Therefore, conduction loss of the power module 1 can be reduced.

(1-4) Since a high voltage is applied as the drain-gate voltage Vdgu of the upper switching element 11 and the drain-gate voltage Vdg1 of the lower switching element 12, the high voltage is applied to the upper capacitor 13 and the lower capacitor 14. Therefore, sufficient withstand voltage and insulation distance are required for the upper capacitor 13 and the lower capacitor 14. In response to such circumstances, the power module 1 of the present embodiment has the encapsulation resin 40 for encapsulating the upper switching element 11, the lower switching element 12, the upper capacitor 13, and the lower capacitor 14 mounted on the substrate 20. Since the creeping discharge can be reduced by the encapsulation resin 40, it is possible to ensure the withstand voltage and the insulation distance of the upper capacitor 13 and the lower capacitor 14.

(1-5) In the second direction Y, the first input wiring portion 23 is arranged on one side of the output wiring portion 22, and the second input wiring portion 24 is arranged on the other side of the output wiring portion 22. The upper switching element 11 is mounted on the first input wiring portion 23, and the lower switching element 12 is mounted on the output wiring portion 22. According to this configuration, it is possible to shorten the length of the upper power wire 44 connecting the source electrode 41 of the upper switching element 11 and the output wiring portion 22 so that the length of the lower power wire 46 connecting the source electrode 41 of the lower switching element 12 and the second input wiring portion 24 can be shortened.

(1-6) The upper capacitor 13 is electrically connected to the upper island portion 37, and the upper island portion 37 is electrically connected to the first input wiring portion 23 by the upper connecting wire 39U. As a result, the upper capacitor 13 can be connected to the bent portion 25c of the first upper control wiring portion 25 in a state where the arrangement direction of the first terminal and the second terminal of the upper capacitor 13 is in the first direction X. Therefore, in the first upper control wiring portion 25, in the range from the portion to which the upper control wire 45 connected to the gate electrode 42 of the upper switching element 11 is connected to the portion to which the first upper control terminal member 33 is connected, the upper capacitor 13 can be connected at a portion other than the recessed portion 25d of the first upper control wiring portion 25.

In addition, the lower capacitor 14 is electrically connected to the lower island portion 38, and the lower island portion 38 is electrically connected to the output wiring portion 22 by the lower connecting wire 39L. As a result, the lower capacitor 14 can be connected to the bent portion 27c of the first lower control wiring portion 27 in a state where the arrangement direction of the first terminal and the second terminal of the lower capacitor 14 is in the first direction X. Therefore, in the first lower control wiring portion 27, in the range from the portion to which the lower control wire 47 connected to the gate electrode 42 of the lower switching element 12 is connected to the portion to which the first lower control terminal member 35 is connected, the lower capacitor 14 can be connected at a portion other than the recessed portion 27d of the first lower control wiring portion 27. In addition, since the lower island portion 38 is electrically connected to the output wiring portion 22 by the lower connecting wire 39L, even if another member (for example, the second input wiring portion 24) exists between the lower island portion 38 and the output wiring portion 22, it is possible to electrically connect them across the other member.

(1-7) The lower switching element 12 is arranged closer to the second input wiring portion 24 in the second direction Y in the first portion 22a of the output wiring portion 22. Therefore, in the first portion 22a of the output wiring portion 22, a space for connecting the upper power wire 44 connected to the upper switching element 11 to the output wiring portion 22 can be secured. Therefore, it is possible to easily connect the upper power wire 44 to the output wiring portion 22.

(1-8) The length of the output wiring portion 22 in the first direction X is set to a length that allows one to five lower switching elements 12 to be arranged. The length of the first input wiring portion 23 in the first direction X is set to a length that allows 1 to 5 upper switching elements 11 to be arranged. According to this configuration, it is possible to provide various power modules 1 of the same size with different on-resistance.

(1-9) The upper switching element 11 and the upper capacitor 13 are provided as separate chips, and the lower switching element 12 and the lower capacitor 14 are provided as separate chips. According to this configuration, since the number and capacitance of the upper capacitors 13 and the lower capacitors 14 can be freely set, it is possible to use an appropriate upper capacitor 13 and lower capacitor 14 in order to reduce surge voltage.

Second Embodiment

With reference to FIG. 17 to FIG. 30, a power module 1 of a second embodiment will now be described. The power module 1 of the present embodiment is different from the power module 1 of the first embodiment in that the upper capacitor 13 and the lower capacitor 14 are omitted and an upper diode 71 and a lower diode 72 are added. In the following description, same reference characters are given to components that are the same as corresponding components of the power module 1 of the first embodiment. Such components will not be described. In addition, FIGS. 18 to 24 illustrate an example of the configuration of the power module 1 of the present embodiment. The configuration of the power module 1 of the present embodiment is not limited to the configurations of FIGS. 18 to 24, and various modifications are possible.

Figure 17:
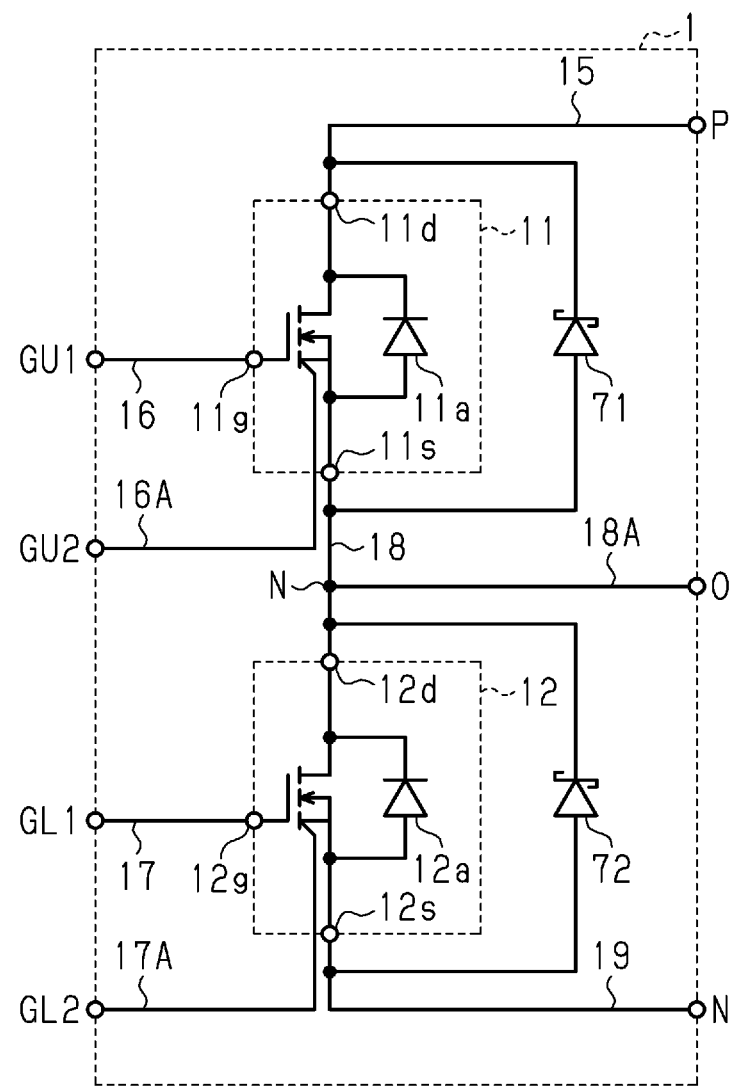
FIG. 17 is a schematic circuit diagram of a power module according to a second embodiment.
Figure 19:
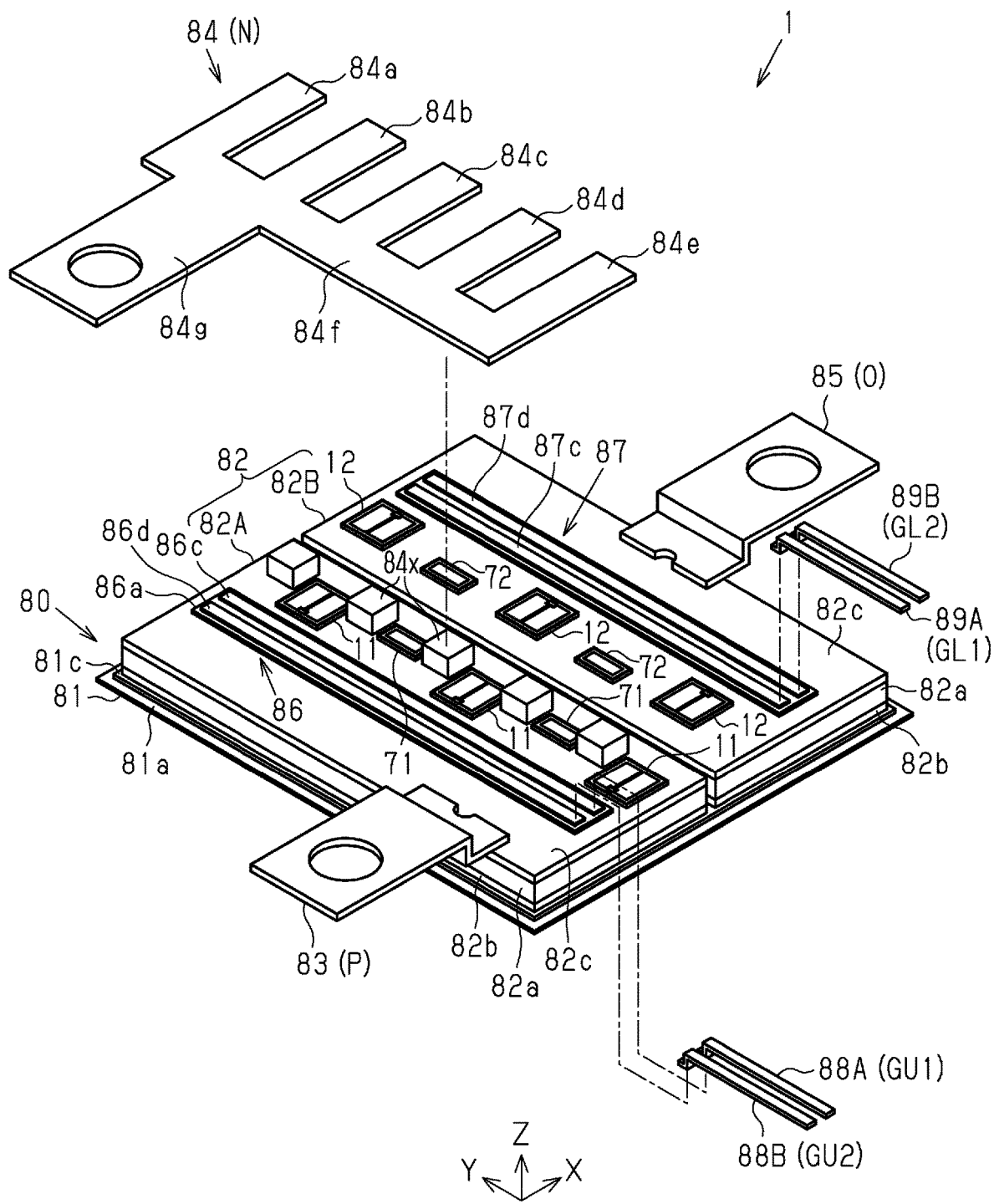
FIG. 19 is an exploded perspective view illustrating the internal configuration of the power module.

As illustrated in FIGS. 17 and 19, the upper diode 71 is provided separately from an upper switching element 11, and the lower diode 72 is provided separately from a lower switching element 12. As illustrated in FIG. 17, the cathode of the upper diode 71 is electrically connected to first wiring 15 connecting a drain terminal 11d of the upper switching element 11 and a first input terminal P. The anode of the upper diode 71 is electrically connected to a portion of fourth wiring 18 connecting a source terminal 11s of the upper switching element 11 and a drain terminal 12d of the lower switching element 12, the portion being located on an upper switching element 11 side of a node N. The cathode of the lower diode 72 is electrically connected to a portion of the fourth wiring 18 on a lower switching element 12 side of the node N. The anode of the lower diode 72 is electrically connected to fifth wiring 19 connecting the source terminal 12s of the lower switching element 12 and a second input terminal N. In the present embodiment, a Schottky barrier diode is used as each of the upper diode 71 and the lower diode 72. The forward threshold voltages of the upper diode 71 and the lower diode 72 are lower than the forward threshold voltages of the body diode 11a of the upper switching element 11 and the body diode 12a of the lower switching element 12, respectively.

The number of each of the upper switching elements 11 and the lower switching elements 12 can be freely changed. For example, the number of each of the upper switching elements 11 and the lower switching elements 12 is set so that its on-resistance becomes on-resistance set in advance. In a case where a plurality of upper switching elements 11 is provided, the upper switching elements 11 are connected in parallel to each other. That is, the drain terminals 11d of the plurality of upper switching elements 11 are connected to each other, the source terminals 11s of the plurality of upper switching elements 11 are connected to each other, and the gate terminals 11g of the plurality of upper switching elements 11 are connected to each other. In addition, in a case where a plurality of lower switching elements 12 is provided, the lower switching elements 12 are connected in parallel to each other. That is, the drain terminals 12d of the plurality of lower switching elements 12 are connected to each other, the source terminals 12s of the plurality of lower switching elements 12 are connected to each other, and the gate terminals 12g of the plurality of lower switching elements 12 are connected to each other. In the present embodiment, three upper switching elements 11 are provided, and three lower switching elements 12 are provided.

In addition, the number of each of the upper diodes 71 and the lower diodes 72 can be freely changed. For example, the number of each of the upper diodes 71 and the lower diodes 72 is set based on magnitude of a reflux current flowing while avoiding the upper switching element 11 and the lower switching element 12. In a case where a plurality of upper diodes 71 is provided, the plurality of upper diodes 71 is connected in parallel to each other. That is, the anodes of the plurality of upper diodes 71 are connected to each other, and the cathodes of the plurality of upper diodes 71 are connected to each other. The cathodes of the plurality of upper diodes 71 are connected to the first wiring 15 and the anodes of the plurality of upper diodes 71 are connected to a portion of the fourth wiring 18 on an upper switching element 11 side with respect to the node N. In a case where a plurality of lower diodes 72 is provided, the plurality of lower diodes 72 is connected in parallel to each other. That is, the anodes of the plurality of lower diodes 72 are connected to each other, and the cathodes of the plurality of lower diodes 72 are connected to each other. The cathodes of the plurality of lower diodes 72 are connected to a portion of the fourth wiring 18 on the lower switching element 12 side with respect to the node N, and the anodes of the plurality of lower diodes 72 are connected to the fifth wiring 19. In the present embodiment, two upper diodes 71 are provided, and two lower diodes 72 are provided.

In the power module 1, the tolerable DC rated current of the upper diode 71 is less than the tolerable DC rated current of the upper switching element 11, and the tolerable DC rated current of the lower diode 72 is less than the tolerable DC rated current of the lower switching element 12. Here, the DC rated current is an absolute maximum rated DC current. In the case where a plurality of upper diodes 71 and a plurality of upper switching elements 11 are provided, the power module 1 is configured such that the sum of the DC rated currents of the plurality of upper diodes 71 is less than the sum of the DC rated currents of the plurality of upper switching elements 11. In addition, in a case where a plurality of lower diodes 72 and a plurality of lower switching elements 12 are provided, the power module 1 is configured such that the sum of the DC rated currents of the plurality of lower diodes 72 is less than the sum of the DC rated currents of the plurality of lower switching elements 12.

In one example, the power module 1 is configured such that the number of upper diodes 71 is smaller than the number of upper switching elements 11 and the number of lower diodes 72 is smaller than the number of lower switching elements 12. As described above, in the present embodiment, as illustrated in FIG. 19, the power module 1 includes three upper switching elements 11, three lower switching elements 12, two upper diodes 71, and two lower diodes 72. In addition, for example, the tolerable DC rated current of one upper diode 71 may be less than the tolerable DC rated current of one upper switching element 11. In addition, the tolerable DC rated current of one lower diode 72 may be less than the tolerable DC rated current of one lower switching element 12. In this case, the number of upper switching elements 11 and the number of upper diodes 71 may be equal to each other. In addition, the number of lower switching elements 12 and the number of lower diodes 72 may be equal to each other.

Figure 18:
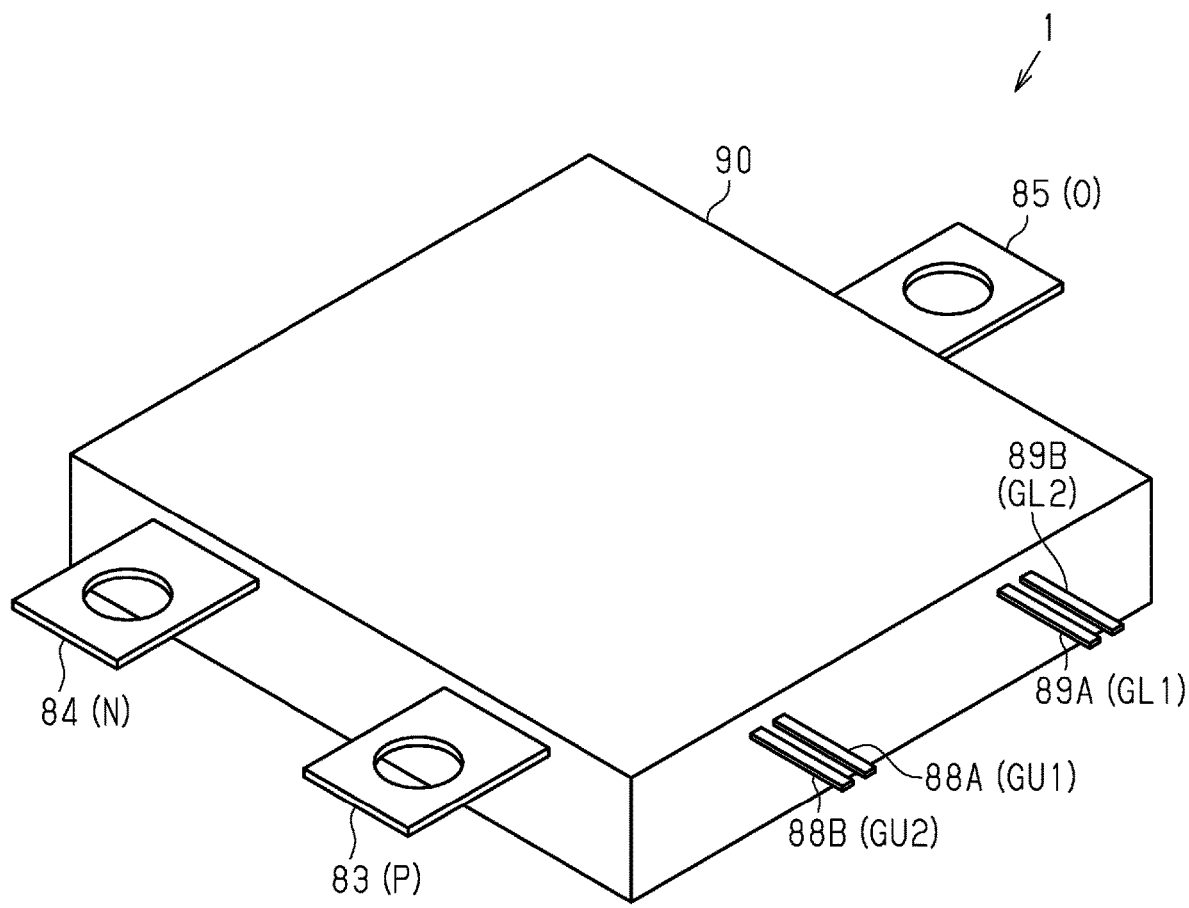
FIG. 18 is a perspective view of the power module.
Figure 20:
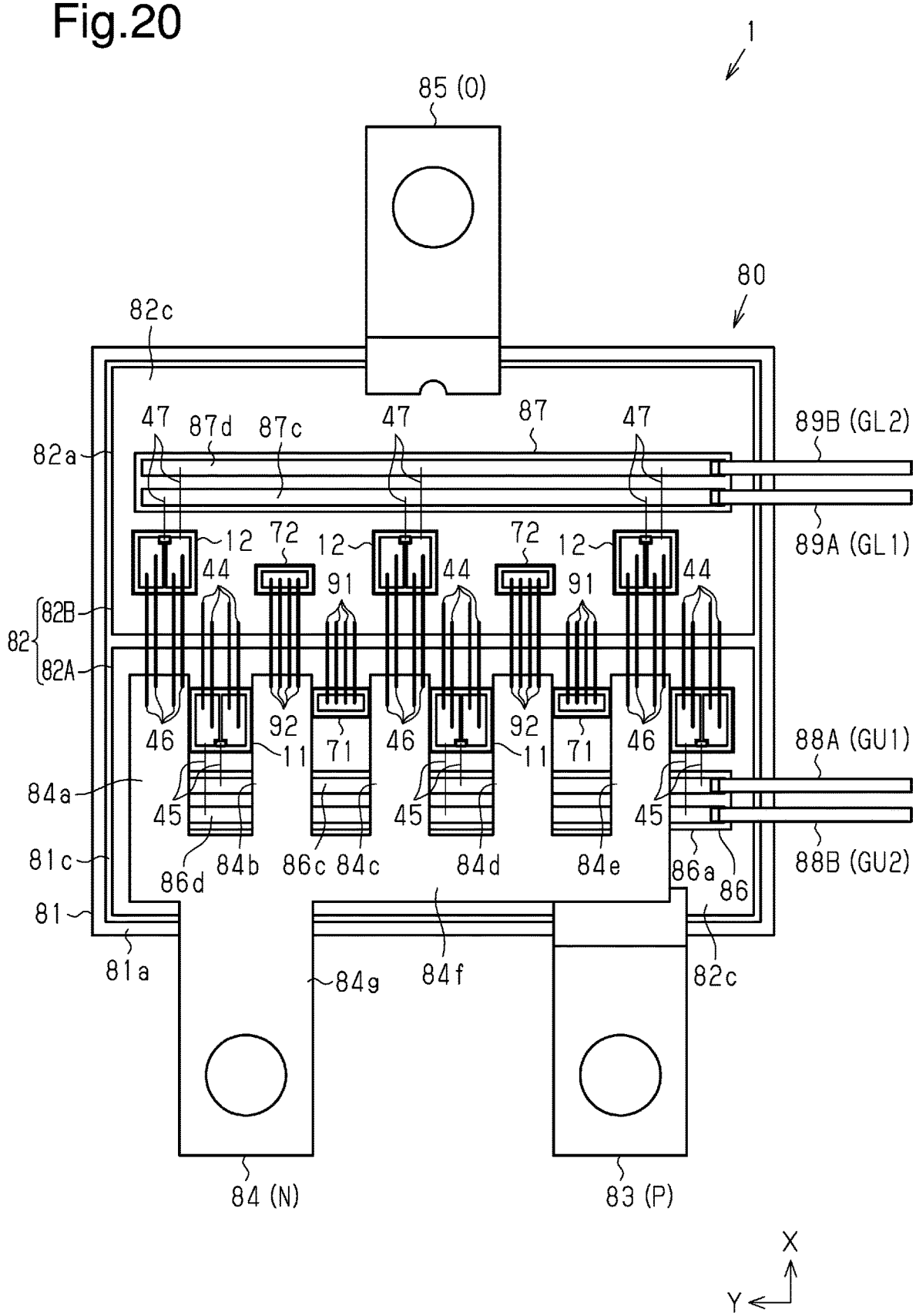
FIG. 20 is a plan view illustrating an internal configuration of the power module.

As illustrated in FIGS. 18 to 20, the power module 1 includes a substrate 80 having a rectangular shape in a plan view and encapsulation resin 90 for encapsulating the switching elements 11, 12 and the diodes 71, 72. In the following description, the longitudinal direction of the substrate 80 is defined as "first direction X", the lateral direction (longitudinal direction) of the substrate 80 is defined as "second direction Y", and the plate thickness direction of the substrate 80 is defined as "third direction Z".

The substrate 80 has a configuration in which a ceramic substrate 81 and a graphite substrate 82 are laminated. The graphite substrate 82 has a first substrate 82A and a second substrate 82B. The first substrate 82A and the second substrate 82B are arranged next to each other in the first direction X with a gap in between. The first substrate 82A and the second substrate 82B are each formed to have a rectangular shape in which the second direction Y is the longitudinal direction.

Figure 21:
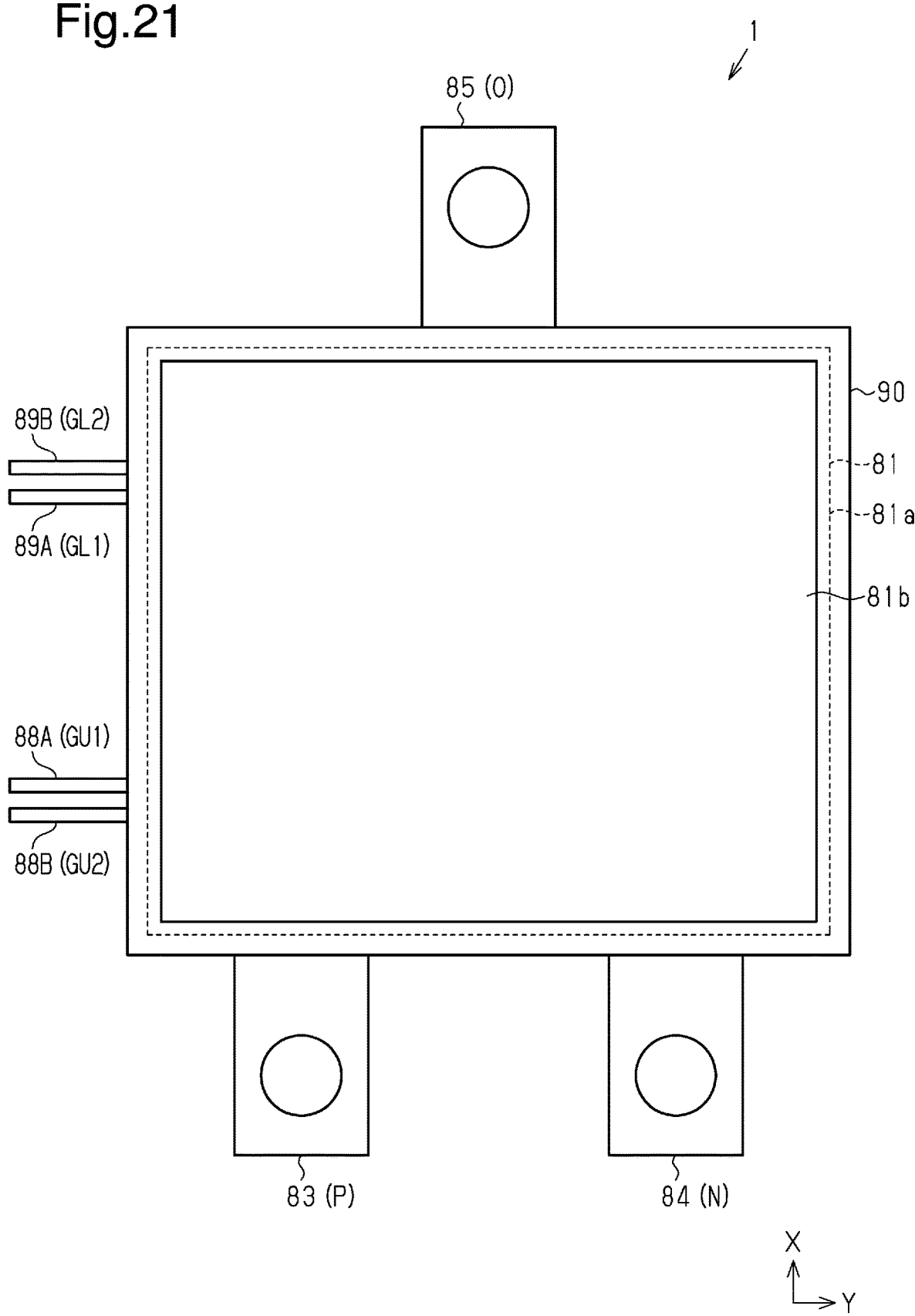
FIG. 21 is a bottom view of the power module.
Figure 22:
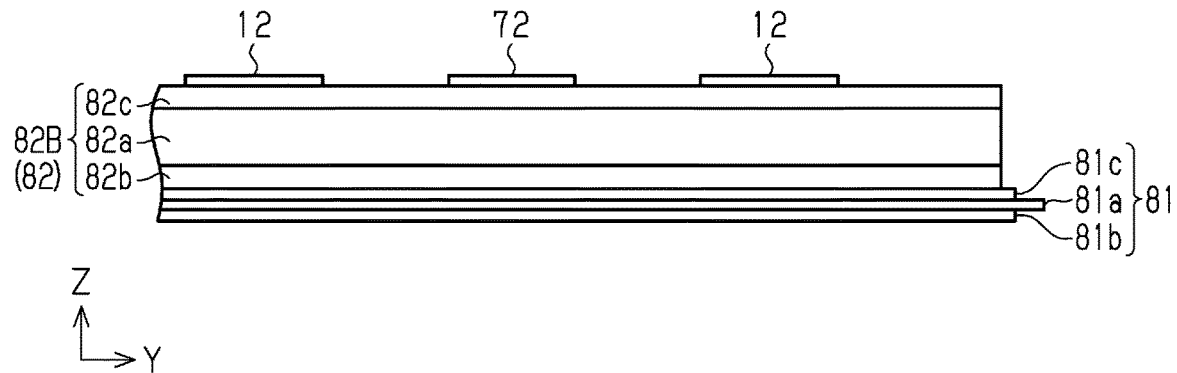
FIG. 22 is a cross-sectional view of part of a second substrate of the power module of FIG. 20, taken along a plane along a second direction and a third direction.

As illustrated in FIGS. 19, 21, and 22, the ceramic substrate 81 has a main body portion 81a made of ceramic material, a back-surface metal layer 81b provided on the back-surface side of the main body portion 81a, and a front-surface metal layer 81c provided on the front-surface side of the main body portion 81a. The back-surface metal layer 81b is made of copper (Cu), for example, and is attached to the back surface of the main body portion 81a with an adhesive or the like. The front-surface metal layer 81c is made of copper (Cu), for example, and is attached to the front surface of the main body portion 81a with an adhesive or the like. As illustrated in FIGS. 20 to 22, the area of the main body portion 81a in a plan view is larger than each of the area of the front-surface metal layer 81c and the area of the back-surface metal layer 81b in a plan view. That is, the outer peripheral edge of the front-surface metal layer 81c is formed inside the outer peripheral edge of the main body portion 81a, and the outer peripheral edge of the back-surface metal layer 81b is formed inside the outer peripheral edge of the main body portion 81a. In addition, for example, the thickness of the main body portion 81a is thinner than the thicknesses of each of the back-surface metal layer 81b and the front-surface metal layer 81c. The thickness of the back-surface metal layer 81b and the thickness of the front-surface metal layer 81c are equal to each other. The shape of the back-surface metal layer 81b in a plan view and the shape of the front-surface metal layer 81c in a plan view are equal to each other. In this manner, the volume of the back-surface metal layer 81b and the volume of the front-surface metal layer 81c are equal to each other. In the present embodiment, the thickness of the main body portion 81a is 0.32 mm, the thickness of the back-surface metal layer 81b is 0.4 mm, and the thickness of the front-surface metal layer 81c is 0.4 mm. The thickness of each of the main body portion 81a, the back-surface metal layer 81b, and the front-surface metal layer 81c can be freely changed. In one example, the thickness of the main body portion 81a, the thickness of the back-surface metal layer 81b, and the thickness of the front-surface metal layer 81c may be equal to one another. As illustrated in FIG. 21, the back-surface metal layer 81b is exposed from the encapsulation resin 90, and the main body portion 81a is not exposed from the encapsulation resin 90. That is, the encapsulation resin 90 covers part of the main body portion 81a on a back-surface metal layer 81b side. As a result, it is possible to limit delamination of the ceramic substrate 81 from the encapsulation resin 90.

As illustrated in FIG. 19, the first substrate 82A and the second substrate 82B are laminated on the front-surface metal layer 81c of the ceramic substrate 81. The first substrate 82A has a main body portion 82a made of graphite, a back-surface metal layer 82b provided on a back-surface side of the main body portion 82a, and a front-surface metal layer 82c provided on a front-surface side of the main body portion 82a. The back-surface metal layer 82b is made of, for example, copper (Cu). The back-surface metal layer 82b is bonded to the front-surface metal layer 81c of the ceramic substrate 81 by soldering or the like. The front-surface metal layer 82c is made of, for example, copper (Cu). As illustrated in FIGS. 19 and 20, the area of the main body portion 82a in a plan view is equal to each of the area of the front-surface metal layer 82c and the area of the back-surface metal layer 82b in a plan view. The outer peripheral edge of the first substrate 82A is formed inside the outer peripheral edge of the front-surface metal layer 81c of the ceramic substrate 81. In addition, for example, the thickness of the main body portion 82a is greater than the thickness of the back-surface metal layer 82b and the thickness of the front-surface metal layer 82c. In one example, the main body portion 82a has a thickness that is at least twice the thickness of each of the back-surface metal layer 82b and the front-surface metal layer 82c. In addition, the thickness of the back-surface metal layer 82b and the thickness of the front-surface metal layer 82c are equal to each other. That is, the volume of the back-surface metal layer 82b and the volume of the front-surface metal layer 82c are equal to each other. In addition, the thickness of the back-surface metal layer 82b and the thickness of the front-surface metal layer 82c are greater than the thickness of the back-surface metal layer 81b and the thickness of the front-surface metal layer 81c of the ceramic substrate 81, respectively. In one example, the thickness of the back-surface metal layer 82b and the thickness of the front-surface metal layer 82c are about twice the thickness of the back-surface metal layer 81b and the thickness of the front-surface metal layer 81c of the ceramic substrate 81, respectively. In the present embodiment, the thickness of the main body portion 82a is 2.0 mm, the thickness of the back-surface metal layer 82b is 0.8 mm, and the thickness of the front-surface metal layer 82c is 0.8 mm.

The main body portion 82a of the first substrate 82A has anisotropic thermal conductivity. More specifically, the main body portion 82a of the first substrate 82A is configured such that thermal conductivity of the main body portion 82a in the second direction Y is lower than thermal conductivity of the main body portion 82a in the first direction X. In other words, the main body portion 82a of the first substrate 82A is configured such that thermal conductivity rate of the main body portion 82a in the second direction Y is lower than the thermal conductivity rate of the main body portion 82a in the first direction X. The main body portion 82a of the first substrate 82A is configured such that thermal conductivity in the third direction Z is equal to the thermal conductivity of the main body portion 82a in the first direction X. The thermal conductivity in the first direction X and the thermal conductivity in the third direction Z may be different from each other in the main body portion 82a of the first substrate 82A. Also in this case, it is preferable that the thermal conductivity in the second direction Y is lower than the thermal conductivity in the first direction X and the thermal conductivity in the third direction Z, in the main body portion 82a of the first substrate 82A.

The structure of the second substrate 82B is identical to the structure of the first substrate 82A and includes a main body portion 82a, a back-surface metal layer 82b, and a front-surface metal layer 82c. The back-surface metal layer 82b of the second substrate 82B is bonded to the front-surface metal layer 81c of the ceramic substrate 81. The outer peripheral edge of the second substrate 82B is formed inside the outer peripheral edge of the front-surface metal layer 81c of the ceramic substrate 81.

The main body portion 82a of the second substrate 82B has anisotropic thermal conductivity. More specifically, the main body portion 82a of the second substrate 82B is configured such that thermal conductivity of the main body portion 82a in the second direction Y is lower than thermal conductivity of the main body portion 82a in the first direction X. In other words, the main body portion 82a of the second substrate 82B is configured such that the thermal conductivity rate of the main body portion 82a in the second direction Y is lower than the thermal conductivity rate of the main body portion 82a in the first direction X. The main body portion 82a of the second substrate 82B is configured such that thermal conductivity in the third direction Z is equal to the thermal conductivity of the main body portion 82a in the first direction X. The thermal conductivity in the first direction X and the thermal conductivity in the third direction Z may be different from each other in the main body portion 82a of the second substrate 82B. Also, in this case, in the main body portion 82a of the second substrate 82B, it is preferable that the thermal conductivity in the second direction Y be lower than the thermal conductivity in the first direction X and the thermal conductivity in the third direction Z.

As illustrated in FIGS. 19 and 20, the power module 1 includes a first input terminal member 83, a second input terminal member 84, an output terminal member 85, an upper signal substrate 86, a lower signal substrate 87, a first upper control terminal member 88A, a second upper control terminal member 88B, a first lower control terminal member 89A, and a second lower control terminal member 89B. The first input terminal member 83 forms the first input terminal P of the power module 1, the second input terminal member 84 forms the second input terminal N of the power module 1, and the output terminal member 85 forms the output terminal O of the power module 1. In addition, the first upper control terminal member 88A forms a first upper control terminal GU1, the second upper control terminal member 88B forms a second upper control terminal GU2, the first lower control terminal member 89A forms a first lower control terminal GL1, and the second lower control terminal member 89B forms a second lower control terminal GL2. Each of the first input terminal member 83, the second input terminal member 84, the output terminal member 85, the first upper control terminal member 88A, the second upper control terminal member 88B, the first lower control terminal member 89A, and the second lower control terminal members 89B is made of copper (Cu).

On the first substrate 82A, the first input terminal member 83, the second input terminal member 84, the upper signal substrate 86, three upper switching elements 11, and the two upper diodes 71 are mounted. The front-surface metal layer 82c of the first substrate 82A configures the first wiring 15 connecting the upper switching element 11 and the first input terminal P (see FIG. 17).

The first input terminal member 83 is positioned at a location which is an end portion of the first substrate 82A on the side opposite to the second substrate 82B in the first direction X and is a portion of the first substrate 82A on an upper control terminal member 88A, 88B side in the second direction Y.

The second input terminal member 84 is provided so as to face the first substrate 82A with a gap in between in the third direction Z. The second input terminal member 84 has a first connecting portion 84a, a second connecting portion 84b, a third connecting portion 84c, a fourth connecting portion 84d, a fifth connecting portion 84e, a coupling portion 84f, and a terminal portion 84g. The first connecting portion 84a, the second connecting portion 84b, the third connecting portion 84c, the fourth connecting portion 84d, the fifth connecting portion 84e, the coupling portion 84f, and the terminal portion 84g are integrally formed.

The coupling portion 84f is arranged in a state of facing the end portion of the first substrate 82A on the side opposite to a second substrate 82B side in the first direction X with a gap in between in the third direction Z. The coupling portion 84f extends in the second direction Y. Part of the coupling portion 84f covers part of the first input terminal member 83 from the third direction Z. Each of the connecting portions 84a and 84b extends in the first direction X from the coupling portion 84f toward the second substrate 82B side. The connecting portions 84a to 84b have identical shapes and are formed to be rectangular with the first direction X being the longitudinal direction. The first connecting portion 84a, the second connecting portion 84b, the third connecting portion 84c, the fourth connecting portion 84d, and the fifth connecting portion 84e are located in order from the end portion on the side opposite to the upper control terminal members 88A, 88B side in the second direction Y, spaced apart in the second direction Y. The connecting portions 84a to 84e are arranged at equal intervals in the second direction Y. The lengths of the connecting portions 84a to 84e in the first direction X are equal to each other. The positions in the first direction X of the front end portions of the connecting portions 84a to 84e are equal to each other. The coupling portion 84f extends in the second direction Y and is connected to the connecting portions 84a to 84e. The terminal portion 84g extends from the coupling portion 84f to the side opposite to the connecting portions 84a to 84e in the first direction X. The terminal portion 84g is provided at a position corresponding to the first connecting portion 84a and the second connecting portion 84b in the second direction Y. The width dimension (the length in the second direction Y of the terminal portion 84g) of the terminal portion 84g is greater than the width dimension of each of the connecting portions 84a to 84e (length of the connecting portions 84a to 84e in the second direction Y). The width dimension of the terminal portion 84g is equal to each of the width dimension of the output terminal member 85 (length of the output terminal member 85 in the second direction Y) and the width dimension of the first input terminal member 83 (length of the first input terminal member 83 in the second direction Y).

Figure 24:
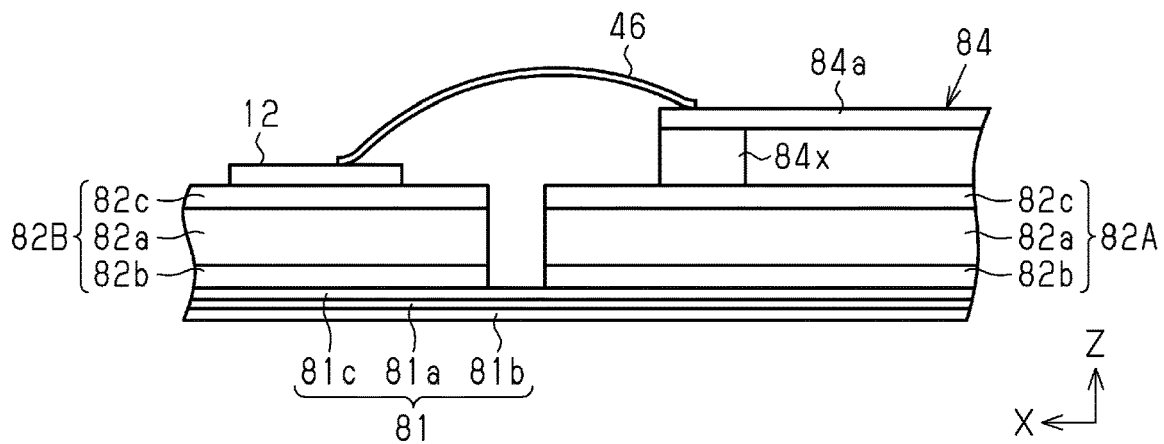
FIG. 24 is a cross-sectional view of part of the power module of FIG. 20, taken along the plane along the first direction and the third direction.

As illustrated in FIGS. 19 and 24, the front end portions of the connecting portions 84a to 84e are attached to the first substrate 82A via an insulating support portion 84x. The insulating support portion 84x is formed of electrically insulative material. Since the second input terminal member 84 is supported by the insulating support portion 84x, the second input terminal member 84 can face the first substrate 82A with a gap in between in the third direction Z. The thickness of the insulating support portion 84x is set so that the second input terminal member 84 can form a gap in the third direction Z between itself and the upper signal substrate 86.

The three upper switching elements 11 and the two upper diodes 71 are located at an end portion of the first substrate 82A on a second substrate 82B side. The three upper switching elements 11 and the two upper diodes 71 are arranged with a gap in between in the second direction Y having a low thermal conductivity rate (thermal conductivity) in the first substrate 82A. More specifically, the upper switching elements 11 and the upper diodes 71 are alternately arranged in the second direction Y. That is, the upper switching elements 11 are positioned on both sides of the upper diode 71 in the second direction Y. The position of the upper switching element 11 and the position of the upper diode 71 in the first direction X are equal to each other. Specifically, in the first direction X, the position of the edge of the upper switching element 11 on a second substrate 82B side is equal to the position of the edge of the upper diode 71 on a second substrate 82B side.

One upper switching element 11 of the three upper switching elements 11 is arranged between the first connecting portion 84a and the second connecting portion 84b in the second direction Y. Another upper switching element 11 of the three upper switching elements 11 is arranged between the third connecting portion 84c and the fourth connecting portion 84d in the second direction Y. The remaining one upper switching element 11 of the three upper switching elements 11 is arranged at a position different from that of the second input terminal member 84 in the second direction Y.

One upper diode 71 of the two upper diodes 71 is arranged between the second connecting portion 84b and the third connecting portion 84c in the second direction Y. The remaining one upper diode 71 of the two upper diodes 71 is arranged between the fourth connecting portion 84d and the fifth connecting portion 84e.

The three upper switching elements 11 and the two upper diodes 71 are positioned on the side opposite to the second substrate 82B with respect to the front edges of the connecting portions 84a to 84e in the first direction X. The three upper switching elements 11 are arranged closer to the upper signal substrate 86 in the first direction X between the edge of the first substrate 82A on a second substrate 82B side and the edge of the upper signal substrate 86 on a second substrate 82B side. In contrast, the two upper diodes 71 are arranged closer to the edge of the first substrate 82A on the second substrate 82B side between the edge of the first substrate 82A on the second substrate 82B side and the edge of the upper signal substrate 86 on the second substrate 82B side in the first direction X.

The upper signal substrate 86 is located in a region between a region where the first input terminal member 83 is arranged and a region where the three upper switching elements 11 and the two upper diodes 71 are arranged in the first substrate 82A. The upper signal substrate 86 is formed to be rectangular in which the second direction Y is the longitudinal direction.

Figure 23:
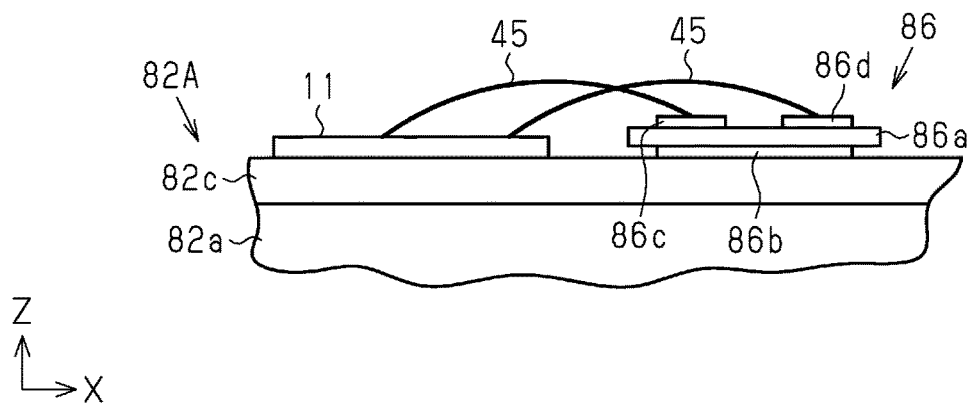
FIG. 23 is a cross-sectional view of part of a first substrate of the power module of FIG. 20, taken along a plane along a first direction and the third direction.

As illustrated in FIG. 23, the upper signal substrate 86 has an insulating substrate 86a, a back-surface metal layer 86b, a first upper control wiring portion 86c, and a second upper control wiring portion 86d. The first upper control wiring portion 86c forms part of the second wiring 16, and the second upper control wiring portion 86d forms part of upper sense wiring 16A.

The insulating substrate 86a is formed of electrically insulative material. The back-surface metal layer 86b is made of copper (Cu), for example, and attached to the back surface of the insulating substrate 86a with an adhesive or the like. Each of the upper control wiring portions 86c, 86d is attached to the front surface of the insulating substrate 86a with an adhesive or the like. Each of the back-surface metal layer 86b and the upper control wiring portions 86c, 86d may be configured as a copper foil pattern formed on the insulating substrate 86a. As illustrated in FIG. 23, the outer peripheral edge of the back-surface metal layer 86b is formed inside the outer peripheral edge of the insulating substrate 86a. As a result, since the encapsulation resin 90 covers the back-surface side of the insulating substrate 86a, it is possible to limit delamination of the upper signal substrate 86 from the first substrate 82A.

The first upper control wiring portion 86c and the second upper control wiring portion 86d are arranged spaced apart next to each other in the first direction X. Each of the upper control wiring portions 86c and 86d extends along the second direction Y. In the first direction X, the first upper control wiring portion 86c is arranged on a side of the three upper switching elements 11 and the two upper diodes 71 with respect to the second upper control wiring portion 86d. The first upper control terminal member 88A is attached to an end portion of the first upper control wiring portion 86c on one side in the second direction Y, and a second upper control terminal member 88B is attached to an end portion of the second upper control wiring portion 86d on one side. Each of the upper control terminal members 88A, 88B protrudes in the second direction Y from the encapsulation resin 90.

On the second substrate 82B, the output terminal member 85, the lower signal substrate 87, the three lower switching elements 12, and the two lower diodes 72 are mounted. The front-surface metal layer 82c of the second substrate 82B configures part of the fourth wiring 18 connecting the source terminal 11s of the upper switching element 11 and the drain terminal 12d of the lower switching element 12.

The output terminal member 85 is attached to the front-surface metal layer 82c of the second substrate 82B. The output terminal member 85 is positioned at a location which is an end portion of the second substrate 82B on the side opposite to the first substrate 82A side in the first direction X and is a center portion of the second substrate 82B in the second direction Y. The output terminal member 85 extends in the first direction X and protrudes to the outside from the encapsulation resin 90 (see FIG. 17).

The three lower switching elements 12 and the two lower diodes 72 are located at an end portion of the second substrate 82B on the first substrate 82A side. The three lower switching elements 12 and the two lower diodes 72 are arranged with a gap in between in the second direction Y having a low thermal conductivity rate (thermal conductivity) in the second substrate 82B. More specifically, the lower switching element 12 and the lower diode 72 are alternately arranged in the second direction Y. That is, the lower switching element 12 is positioned on both sides of the lower diode 72 in the second direction Y. The position of the lower switching element 12 and the position of the lower diode 72 in the first direction X are equal to each other. Specifically, the position of the edge of the lower switching element 12 on a first substrate 82A side and the position of the edge of the lower diode 72 on a first substrate 82A side are equal to each other in the first direction X.

The three lower switching elements 12 are arranged closer to the lower signal substrate 87 in the first direction X between the edge of the second substrate 82B on a first substrate 82A side and the edge of the lower signal substrate 87 on a first substrate 82A side. In contrast, the two lower diodes 72 are arranged closer to the edge of the second substrate 82B on the first substrate 82A side in the first direction X between the edge of the second substrate 82B on the first substrate 82A side and the edge of the lower signal substrate 87 on the first substrate 82A side.

The lower signal substrate 87 is located at a region between the region where the output terminal member 85 is arranged and the region where the three lower switching elements 12 and the two lower diodes 72 are arranged in the second substrate 82B. The lower signal substrate 87 is formed to be rectangular in which the second direction Y is the longitudinal direction.

The electrical connection configuration of each of the switching elements 11, 12 and each of the diodes 71, 72 will now be described.

Each of the three upper switching elements 11 is arranged so that the gate electrode 42 (see FIG. 5A) is located on an upper signal substrate 86 side. The gate electrode 42 is electrically connected to the first upper control wiring portion 86c by one upper control wire 45. The source electrode 41 (see FIG. 5A) is electrically connected to the second upper control wiring portion 86d by one upper control wire 45. In addition, the source electrode 41 is electrically connected to the front-surface metal layer 82c of the second substrate 82B by four upper power wires 44. The drain electrodes 48 (see FIG. 6) of the three upper switching elements 11 are electrically connected to the front-surface metal layer 81c of the first substrate 82A by soldering or the like, respectively.

The cathodes of the two upper diodes 71 are electrically connected to the front-surface metal layer 81c of the first substrate 82A by soldering or the like. The anodes of the two upper diodes 71 are electrically connected to the front-surface metal layer 82c of the second substrate 82B by four upper diode wires 91 as examples of upper diode connecting members. The wire diameter of the upper diode wire 91 of the present embodiment is equal to the wire diameter of the upper power wire 44. It is preferable that the inductance of the four upper diode wires 91 be smaller than the inductance of the four upper power wires 44. In one example, the length of each of the four upper diode wires 91 is shorter than the length of each of the four upper power wires 44. As an example of a configuration in which the inductance of the upper diode wire 91 is smaller than the inductance of the upper power wire 44, the wire diameter of the upper diode wire 91 may be configured to be greater than the wire diameter of the upper power wire 44.

The three lower switching elements 12 are arranged so that the gate electrode 42 is on a lower signal substrate 87 side. The gate electrode 42 is electrically connected to the first lower control wiring portion 87c by one lower control wire 47. The source electrode 41 is electrically connected to the second lower control wiring portion 87d by one lower control wire 47. In addition, the source electrode 41 is electrically connected to the front-surface metal layer 81c of the first substrate 82A by four lower power wires 46. The drain electrodes 48 of the three lower switching elements 12 are electrically connected to the front-surface metal layer 82c of the second substrate 82B by soldering or the like.

The cathodes of the two lower diodes 72 are electrically connected to the front-surface metal layer 82c of the second substrate 82B by soldering or the like. The anodes of the two lower diodes 72 are electrically connected to the front-surface metal layer 81c of the first substrate 82A by four lower diode wires 92 as an example of a lower diode connecting member. The wire diameter of the lower diode wire 92 is equal to the wire diameter of the lower power wire 46. In addition, the wire diameter of the lower diode wire 92 is equal to the wire diameter of the upper diode wire 91. It is preferable that the four lower diode wires 92 are configured such that the inductance is smaller than inductance of the four lower power wires 46. In one example, the length of each of the four lower diode wires 92 is shorter than the length of each of the four lower power wires 46. As an example of a configuration in which the inductance of the lower diode wire 92 is smaller than the inductance of the lower power wire 46, a configuration may be employed in which the wire diameter of the lower diode wire 92 is greater than the wire diameter of the lower power wire 46.

Configuration of Upper Diode and Lower Diode

Figure 25:
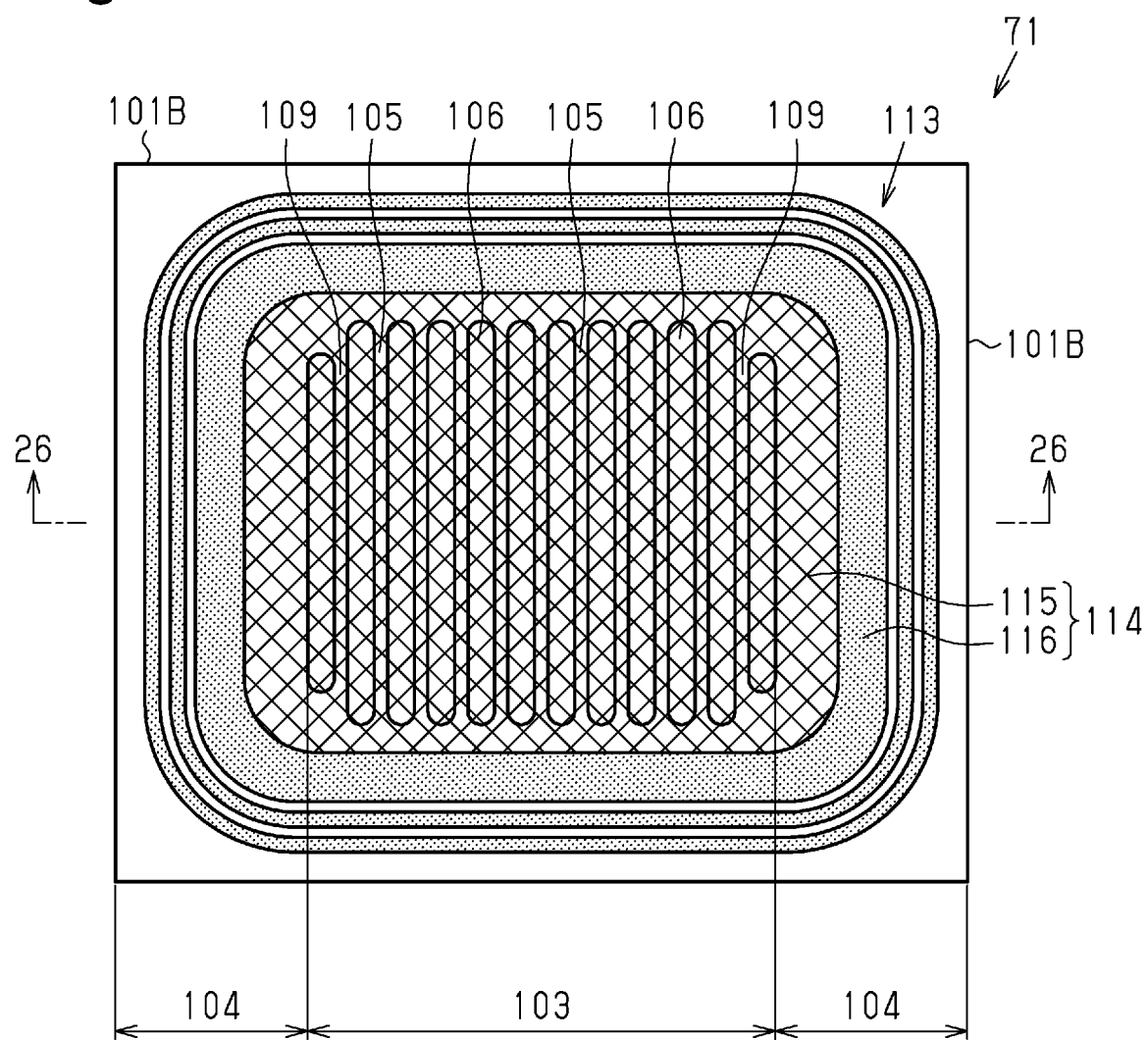
FIG. 25 is a plan view of a diode.
Figure 26:
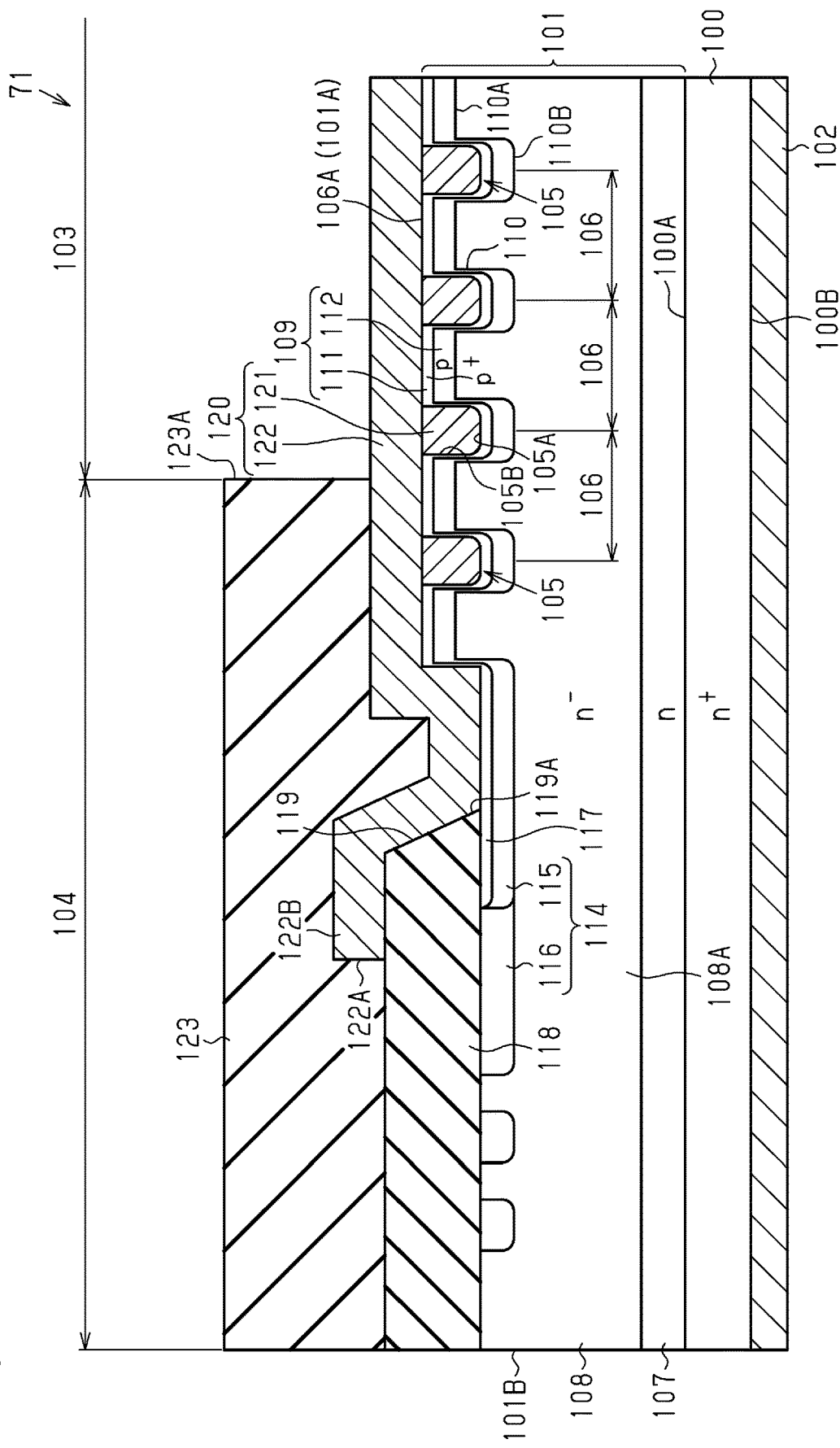
FIG. 26 is a cross-sectional view of part of the diode.

With reference to FIGS. 25 and 26, configurations of the upper diode 71 and the lower diode 72 will be described. Since the upper diode 71 and the lower diode 72 have the same configuration, in the following description, the configuration of the upper diode 71 will be described and the configuration of the lower diode 72 will not be described. In addition, the configurations of the upper diode 71 and the lower diode 72 are not limited to the configurations illustrated in FIGS. 25 and 26, and various modifications are possible.

FIG. 25 illustrates an example of the configuration of the upper diode 71. The upper diode 71 is made of a wide-gap semiconductor. A 4H—SiC (wide bandgap semiconductor having an electric breakdown field of about 2.8 MV/cm and a bandgap width of about 3.26 eV) is used for the upper diode 71. The wide bandgap semiconductor used for the upper diode 71 is not limited to silicon carbide (SiC), and may be gallium nitride (GaN), gallium oxide ($Ga_2O_3$), diamond, or the like. Gallium nitride (GaN) has an electric breakdown field of about 3 MV/cm and a bandgap width of about 3.42 eV. Gallium oxide ($Ga_2O_3$) has an electric breakdown field of about 8 MV/cm and a bandgap width of about 4.8 eV. Diamond has an electric breakdown field of about 8 MV/cm and a bandgap width of about 5.47 eV.

As illustrated in FIG. 26, the upper diode 71 has an $n^+$-type SiC substrate 100 and an epitaxial layer 101 laminated on the surface 100A of the $n^+$-type SiC substrate 100.

On the back surface 100B of the SiC substrate 100, a cathode electrode 102 is arranged so as to cover the entirety of the back surface. The cathode electrode 102 forms an ohmic junction with the SiC substrate 100. For example, a laminated structure (Ti/Ni/Au/Ag) in which titanium (Ti), nickel (Ni), gold (Au), and silver (Ag) are laminated in order from a SiC substrate 50 side can be applied to the cathode electrode 102.

The SiC substrate 100 is a substrate having, for example, a (0001) surface (Si surface) as a main surface. Therefore, the epitaxial layer 101 laminated on the front surface 100A (main surface) of the SiC substrate 100 by epitaxial growth is laminated with the (0001) surface as the main surface. In this case, the back surface 100B of the SiC substrate 100 is the (000-1) surface (C surface). The front surface 100A of the SiC substrate 100 may be a (000-1) surface and the back surface 100B of the SiC substrate 100 may be a (0001) surface. In addition, the SiC substrate 100 preferably has an off angle of 0 to 10 degrees.

In the epitaxial layer 101, an active region 103 and an outer peripheral region 104 surrounding the active region 103 are set.

In the active region 103, the epitaxial layer 101 has a surface 101A in which trenches 105 are formed. The plurality of trenches 105 is formed spaced apart from one another. As a result, the trenches 105 define a plurality of unit cells 106 in the active region 103. In the present embodiment, as illustrated in FIG. 25, the trenches 105 in a stripe pattern define the plurality of linear unit cells 106 in the active region 103. Therefore, the front surface (the surface 101A of the epitaxial layer 101) in which front surfaces 106A of the plurality of unit cells 106 and bottom surfaces 105A and side surfaces 105B of the trench 105 between the front surfaces 106A are continuous in a zig-zagged manner in a cross-sectional view is formed in the surface portion of the epitaxial layer 101. The pattern of the trenches 105 is not limited to the stripe pattern and may be a lattice pattern, for example. In this case, a plurality of mesa-shaped unit cells 106 defined in respective window portions of the trenches 105 of the lattice pattern, and the unit cells 106 are arranged in a row-column (matrix) shape as a whole.

The epitaxial layer 101 has an n-type buffer layer 107, an $n^-$-type drift layer 108, and a p-type layer 109, grown in this order from the SiC substrate 100 side.

The p-type layer 109 is a region continuous over the entirety of the active region 103 (cross-hatched region in FIG. 25 (excluding a region of a p-type JTE structure 114 described later)). The p-type layer 109 is formed along the surface 101A of the epitaxial layer 101 so that the interface 110 with the drift layer 108 extends along the surface 101A of the epitaxial layer 101 and the portion opposite to the interface 110 is exposed from the surface 101A of the epitaxial layer 101. As a result, in the unit cell 106, the interface 110 between the p-type layer 109 and the drift layer 108 is set at positions above and below the bottom surface 105A of the trench 105. Specifically, the interface 110 has a first interface 110A located immediately below the surface 106A of the unit cell 106 and formed at a relatively upper side, and a second interface 110B located immediately below the bottom surface 105A of the trench 105 and formed at a relatively lower side. Therefore, the drift layer 108 selectively enters a portion sandwiched by the adjacent trenches 105 in the epitaxial layer 101.

In addition, the p-type layer 109 has a $p^+$-type region 111 which is a high-concentration region exposed from the surface 101A of the epitaxial layer 101, and a p-type region 112, which is formed at a portion deeper than the $p^+$-type region 111 and is a lower-concentration region than the $p^+$-type region 111. In the present embodiment, the interface of the $p^+$-type region 111 and the p-type region 112 are formed along the surface 101A of the epitaxial layer 101, and the p-type layer 109 has a laminated structure of the $p^+$-type region 111 and the p-type region 112. The $p^+$-type region 111 is not necessarily formed over the entirety of the active region 103, and may be selectively formed in part of the active region 103. For example, the $p^+$-type region 111 may be selectively formed on at least one of the surface 106A of the unit cell 106, the bottom surface 105A of the trench 105, and the side surface 105B of the trench 105.

In addition, the thickness of the p-type layer 109 on the bottom surface 105A of the trench 105 differs from the thickness of the p-type layer 109 on the side surface 105B of the trench 105. Specifically, the portion of the p-type layer 109 on the bottom surface 105A of the p-type layer 109 is thicker than the portion of the p-type layer 109 on the side surface 105B. As a result, a difference in the thickness of the p-type layer 109 is provided between the bottom surface 105A and the side surface 105B of the trench 105.

In the outer peripheral region 104, a removed region 113 is formed in the epitaxial layer 101 by etching the epitaxial layer 101 to a depth where the drift layer 108 is exposed. In the present embodiment, the removed region 113 is formed in an annular shape surrounding the active region 103 so as to cross both end portions in the longitudinal direction of the trenches 105 of the stripe pattern. As a result, the removed region 113 is continuous with the trenches 105 of the stripe pattern. That is, the removed region 113 is formed by an extending portion of the stripe pattern. In addition, as illustrated in FIG. 25, the outer peripheral edge of the removed region 113 may be aligned with an end surface 101B of the epitaxial layer 101, or may be set inside the end surface 101B of the epitaxial layer 101 (not illustrated). The depth of the removed region 113 may be the same as the depth of the trench 105.

Due to formation of the removed region 113, the drift layer 108 has an extended portion 108A extended from the periphery of the active region 103 to the end surface 101B of the epitaxial layer 101 in the lateral direction along the front surface 100A of the SiC substrate 100. The extended portion 108A is a low step portion that is one step lower than the front surface 106A of the unit cell 106.

In addition, in the outer peripheral region 104, a p-type JTE (Junction Termination Extension) structure 114 is formed in the drift layer 108. In the present embodiment, the JTE structure 114 is formed to have an annular shape surrounding the active region 103. Specifically, the JTE structure 114 is integrally formed with the p-type layer 109 across the unit cells 106 and the extended portion 108A. The JTE structure 114 may include a plurality of rings extending outward toward the end surface 101B of the epitaxial layer 101. In this case, impurity concentrations may be equal between the plurality of rings, or impurity concentrations may be decreased toward the outer side.

In the present embodiment, the JTE structure 114 is divided in the circumferential direction depending on the difference in impurity concentration. That is, the JTE structure 114 has a first portion 115 (cross-hatched region in FIG. 25 (excluding the region of the p-type layer 109)) having a relatively higher concentration, and a second portion 116 (dotted region in FIG. 25) having a lower concentration than the first portion 115.

The first portion 115 is arranged on a side of the second portion 116 closer to the active region 103. In the first portion 115, the JTE structure 114 has a p$^+$-type region 117 having higher concentration than other parts of the first portion 115. The p$^+$-type region 117 is formed integrally with the p$^+$-type region 111 along the boundary between the JTE structure 114 and the drift layer 108 from the inner side of the boundary with a space between the p$^+$-type region 117 and the boundary.

The second portion 116 is formed by a plurality of rings. The innermost ring of the second portion 116 is in contact with the first portion 115 as illustrated in FIGS. 25 and 26. The innermost ring of the second portion 116 does not have to be in contact with the first portion 115.

On the epitaxial layer 101, a field insulating film 118 is formed. As the material of the field insulating film 118, for example, silicon oxide (SiO$_2$) or the like can be used. The field insulating film 118 can be formed by, for example, plasma CVD (chemical vapor deposition).

In the field insulating film 118, a contact hole 119 for selectively exposing the entirety of the active region 103 and part of the outer peripheral region 104 is formed. In the present embodiment, the outer peripheral edge 119A of the contact hole 119 is set on the side of the boundary between the first portion 115 and the second portion 116 closer to the active region 103. As a result, the field insulating film 118 covers the entire second portion 116 and part (for example, the peripheral end portion) of the first portion 115. In addition, it is preferable that the contact hole 119 is formed in a tapered shape whose width is widened as it proceeds toward the opening end.

On the field insulating film 118, an anode electrode 120 is formed. The anode electrode 120 is formed so as to cover the entirety of the active region 103 exposed from the contact hole 119 and has an embedded portion 121 embedded in the trench 105, and a planar portion 122 formed along the outermost surface of the epitaxial layer 101 so as to cover the embedded portion 121.

The embedded portion 121 is in contact with the p-type layer 109 on the bottom surface 105A and the side surface 105B of the trench 105, and forms an ohmic junction with the p-type layer 109. As the material of the embedded portion 121, for example, polysilicon, tungsten (W), titanium (Ti), an alloy thereof or the like can be used. Preferably, p-type polysilicon is used. Since these materials have good embeddability, step coverage of the embedded portion 121 can be improved. Therefore, even in a case where the aspect ratio of the trench 105 is high, occurrence of voids at the time of embedding the anode electrode 120 can be reduced.

The planar portion 122, which is in contact with the p-type layer 109 on the front surface 106A of the unit cell 106, forms ohmic junction with the p-type layer 109. As a material of the planar portion 122, for example, a laminated structure of Ti/Ni or the like can be used. In addition, the planar portion 122 bulges outward of the contact hole 119 in a flange shape. In the present embodiment, the outer peripheral edge 122A of the planar portion 122 of the anode electrode 120 is located on the side of the boundary between the first portion 115 and the second portion 116 of the JTE structure 114 that is farther from the active region 103. That is, the planar portion 122 of the anode electrode 120 has an overlapping portion 122B protruding toward a second portion 116 from this boundary.

On the uppermost surface of the upper switching element 11, a surface protective film 123 is formed. As the material of the surface protective film 123, for example, silicon oxide (SiO$_2$), silicon nitride (SiN), polyimide, or the like can be used. In addition, the surface protective film 123 can be formed by, for example, plasma CVD. An example of the film thickness of the surface protective film 123 is about 8000 Å. In the surface protective film 123, a pad opening 123A for selectively exposing part of the anode electrode 120 as a pad is formed. The upper diode wire 91 (see FIG. 20) is joined to the anode electrode 120 through the pad opening 123A.

According to such a configuration of the upper diode 71, a trench 105 is formed in the epitaxial layer 101, the p-type layer 109 is formed along the surface 101A of the epitaxial layer 101 where the trench 105 is formed, and a pn diode including a pn junction portion between the p-type layer 109 and the drift layer 108 is formed. Since the p-type layer 109 is also formed on the side surface 105B of the trench 105, the surface area of the p-type layer 109 is larger than the apparent surface area in a plan view (FIG. 24) perpendicular to the main surface of the epitaxial layer 101. Accordingly, since the area of the anode electrode 120 in contact with the p-type layer 109 is increased, contact resistance between the p-type layer 109 and the anode electrode 120 can be reduced. Therefore, resistance of the upper diode 71 formed with the p-type layer 109 by ion implantation can also be reduced. As a result, it is possible to provide an upper diode 71 including a pn diode which can be easily manufactured as compared with a case of forming the p-type layer 109 by epitaxial growth and which has low on-resistance.

In addition, since the portion of the p-type layer 109 in contact with the anode electrode 120 is the $p^+$-type region 111 having high concentration, it is possible to form satisfactory ohmic junction with the anode electrode 120 in the $p^+$-type region 111. In contrast, since the p-type region 112 having low concentration is formed so as to cover the $p^+$-type region 111, electric field concentration on the bottom portion of the trench 105 can be satisfactorily alleviated. As a result, a forward voltage and a reverse leakage current can be reduced.

In addition, in the upper diode 71, since the JTE structure 114 is formed in the outer peripheral region 104, a depletion layer generated from the pn junction portion of the interface between the JTE structure 114 and the drift layer 108 can reduce electric field concentration in the bottom portion of the trench 105 (especially, the trench 105 arranged on the outermost side). As a result, it is possible to reduce occurrence of a reverse leakage current at the bottom portion of the trench 105.

Operation

Next, operation of the present embodiment will now be described based on comparison with a power module of a comparative example. The power module of the comparative example is configured by omitting the upper diode 71 and the lower diode 72 from the power module 1 of the present embodiment.

Figure 27:
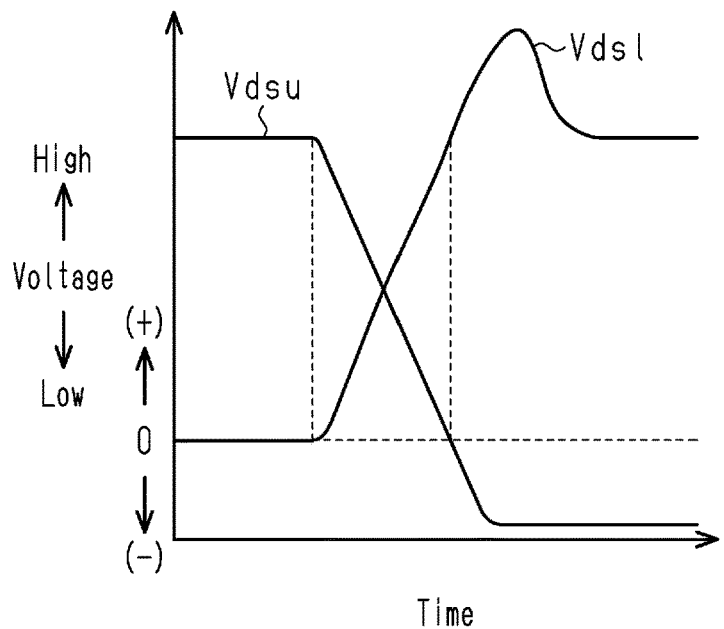
FIG. 27 is a graph illustrating transitions of the drain-source voltages of the upper switching element and the lower switching element, when the lower switching element is changed from the on state to the off state, in the power module of the comparative example.

In the power module of the comparative example, for example, when the lower switching element 12 is changed from the on state to the off state, as illustrated in FIG. 27, the drain-source voltage Vdsu of the lower switching element 12 increases, while the drain-source voltage Vdsu of an upper switching element 11 decreases. This drain-source voltage Vdsu drops to the negative side and stops decreasing when reaching a forward threshold voltage of the body diode of the upper switching element 11. As the drain-source voltage Vds1 fluctuates in this manner, the gate-source voltage Vgsu of the upper switching element 11 also fluctuates. Therefore, the surge voltage generated in the gate-source voltage Vgsu increases. Similarly, for example, when the upper switching element 11 is changed from the on state to the off state, the drain-source voltage Vds1 of the lower switching element 12 drops to the forward threshold voltage of the body diode of the lower switching element 12, the surge voltage generated in the gate-source voltage Vgs1 of the lower switching element 12 increases.

Figure 28:
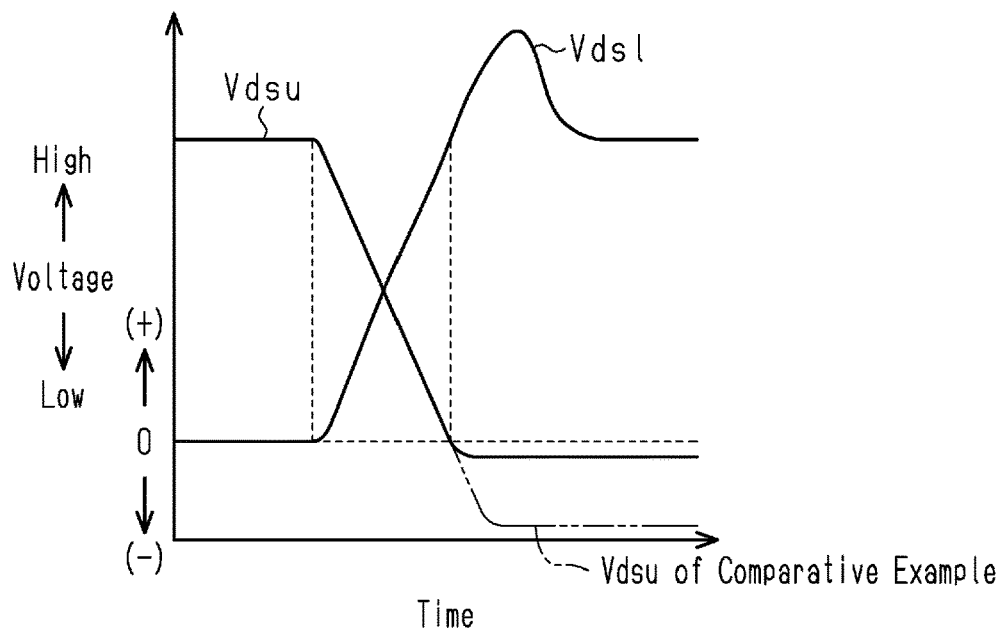
FIG. 28 is a graph illustrating transitions of the drain-source voltages of the upper switching element and the lower switching element, when the lower switching element is changed from the on state to the off state, in the power module according to the second embodiment.

In contrast to such a power module of the comparative example, the power module 1 of the present embodiment has the upper diode 71 having a forward threshold voltage lower than the forward threshold voltage of the body diode 11a of the upper switching element 11, and the lower diode 72 having a forward threshold voltage lower than the forward threshold voltage of the body diode 12a of the lower switching element 12. Therefore, for example, when the lower switching element 12 is changed from the on state to the off state, even if the drain-source voltage Vdsu of the upper switching element 11 drops to the negative side as illustrated in FIG. 28, if the drain-source voltage Vdsu reaches the forward threshold voltage of the upper diode 71, the drain-source voltage Vdsu stops dropping. Therefore, since the period during which the gate-source voltage Vgs1 fluctuates is shorter than that of the power module of the comparative example, the surge voltage generated at the gate-source voltage Vgs1 is reduced.

Simulation Result

Figure 29:
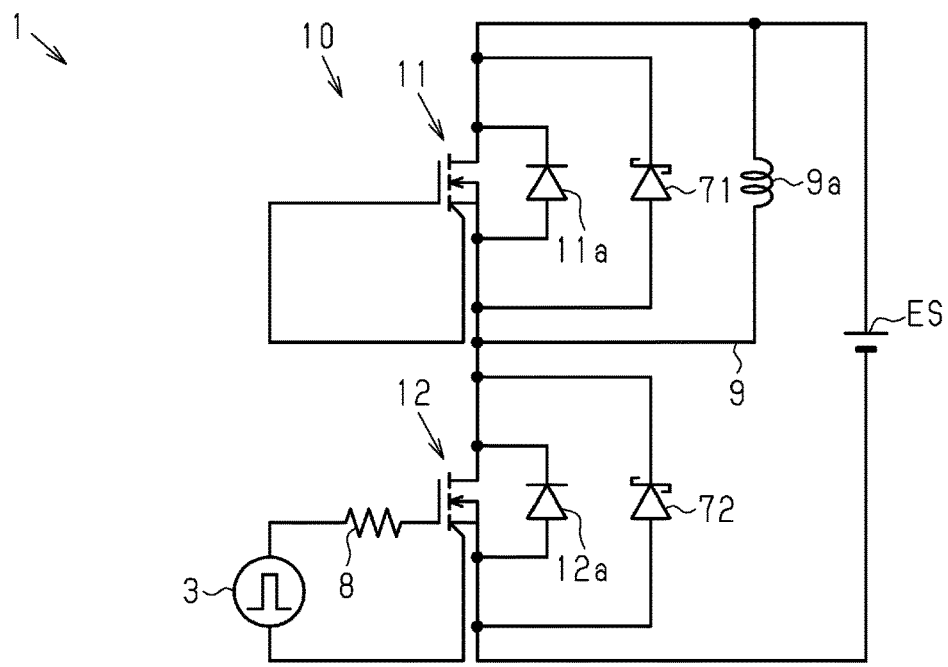
FIG. 29 is a circuit diagram for simulating the power module of the second embodiment.

Simulations of the relationship between generation of the surge voltage on the negative side and switching loss in a case where the upper switching element 11 is maintained in the off state and the lower switching element 12 is driven in the power modules 1 of the comparative example and the present embodiment have been carried out based on schematic circuit configurations illustrated in FIGS. 7 and 29. FIG. 7 illustrates a schematic circuit configuration of the power module of the comparative example, and FIG. 29 illustrates a schematic circuit configuration of the power module 1 of the present embodiment.

In the circuit configuration of FIG. 29, the cathode of the upper diode 71 is electrically connected to the drain of the upper switching element 11, and the anode of the upper diode 71 is electrically connected to the source of the upper switching element 11. The cathode of the lower diode 72 is electrically connected to the drain of the lower switching element 12 and the anode of the lower diode 72 is electrically connected to the source of the lower switching element 12. In addition, the source and the gate of the upper switching element 11 are short-circuited, and the lower gate drive circuit 3 is electrically connected to the gate of the lower switching element 12. A gate resistor 8 is provided between the gate of the lower switching element 12 and the lower gate drive circuit 3. The positive terminal of the power supply ES is electrically connected to the drain of the upper switching element 11 and the negative terminal of the power supply ES is electrically connected to the source of the lower switching element 12. The circuit configuration of FIG. 29 has the wiring 9 connecting the section between the positive terminal of the power supply ES and the drain of the upper switching element 11 and the section between the source of the upper switching element 11 and the drain of the lower switching element 12. The wiring 9 has an inductor load 9a.

In the power module of the comparative example, simulations in cases where the value of the gate resistor 8 was changed to 2 Ω, 3 Ω, 4Ω, and 5Ω were carried out. Here, a case where the value of the gate resistor 8 is 2Ω in the circuit configuration of the power module of the comparative example is defined as a reference condition.

Figure 30:
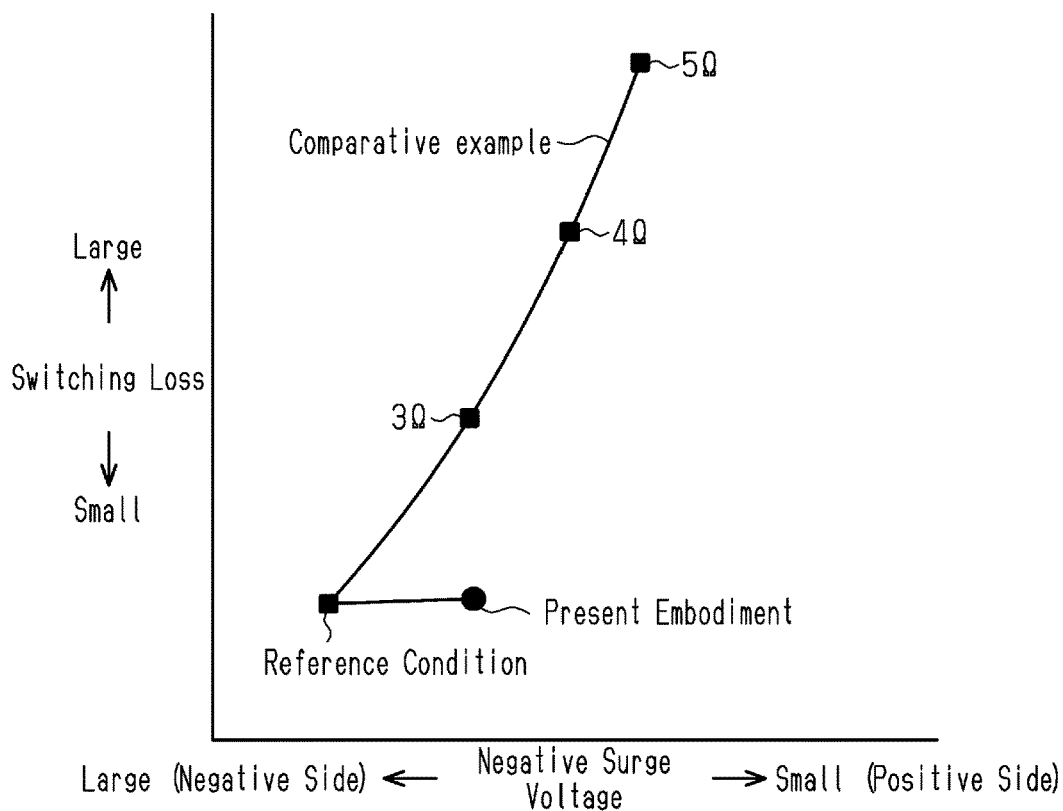
FIG. 30 is a graph illustrating simulation results of the power module of the comparative example of FIG. 7 and the power module of FIG. 29, and illustrating the relationship between the negative surge voltage and switching loss.

As illustrated in FIG. 30, in the power module of the comparative example, an increase in the value of the gate resistor 8 decreases the switching speed of the lower switching element 12 (changing rate of the drain-source voltage Vds1), and thus the absolute value of the negative surge voltage decreases. In contrast, increasing the gate resistor 8 rapidly increases switching loss.

In contrast, in the power module 1 of the present embodiment, the upper diode 71 makes the absolute value of the negative surge voltage smaller than the reference condition. In contrast, in the power module 1 of the present embodiment, even though the switching loss is greater than the reference condition, the switching loss becomes smaller as compared with the case of an increase in the value of the gate resistor 8 as in the power module of the comparative example.

According to the present embodiment, the following advantages can be obtained.

(2-1) The power module 1 has the upper diode 71 having a forward threshold voltage lower than the forward threshold voltage of the body diode 11a of the upper switching element 11, and the lower diode 72 having a forward threshold voltage lower than the forward threshold voltage of the body diode 12a of the lower switching element 12. According to this configuration, for example, when the lower switching element 12 changes from the on state to the off state, even if the drain-source voltage Vdsu of the upper switching element 11 decreases to the negative side, a decrease in drain-source voltage Vdsu of the upper switching element 11 stops at the forward threshold voltage of the upper diode 71. In addition, for example, when the upper switching element 11 changes from the on state to the off state, even if the drain-source voltage Vds1 of the lower switching element 12 decreases to the negative side, a decrease in the drain-source voltage Vds1 of the lower switching element 12 stops at the forward threshold voltage of the lower diode 72. In this manner, since the fluctuation period of the drain-source voltage Vds is shortened, the fluctuation period of the gate-source voltage Vgs is shortened. Therefore, fluctuation of the gate-source voltage Vgs can be reduced.

Furthermore, the tolerable DC rated current of the upper diode 71 is less than the tolerable DC rated current of the upper switching element 11, and the tolerable DC rated current of the lower diode 72 is lower than the tolerable DC rated current of the lower switching element 12. Therefore, it is possible to reduce the chip area of the upper diode 71 and the chip area of the lower diode 72. Therefore, it is possible to reduce the size of the power module 1.

(2-2) The number of upper diodes 71 is smaller than the number of upper switching elements 11, and the number of lower diodes 72 is smaller than the number of lower switching elements 12. According to this configuration, it is possible to reduce the number elements of the power module 1 and to reduce the size of the power module 1 as compared with a case where the number of upper diodes 71 is equal to or larger than the number of upper switching elements 11 and in a case where the number of lower diodes 72 is equal to or larger than the number of lower switching elements 12.

(2-3) The substrate 80 of the power module 1 has the graphite substrate 82. The graphite substrate 82 has the first substrate 82A in which the plurality of upper switching elements 11 and the plurality of upper diodes 71 are arranged spaced apart from one another in the second direction Y, and the second substrate 82B in which the plurality of lower switching elements 12 and the plurality of lower diodes 72 are arranged spaced apart from one another in the second direction Y. The first substrate 82A is configured such that thermal conductivity of the first substrate 82A in the second direction Y is lower than thermal conductivity of the first substrate 82A in the first direction X. The second substrate 82B is configured such that thermal conductivity of the second substrate 82B in the second direction Y is lower than thermal conductivity of the second substrate 82B in the first direction X. According to this configuration, heat of the plurality of upper switching elements 11 is less likely to be transmitted to the plurality of upper diodes 71, and heat of the plurality of lower switching elements 12 is less likely to be transmitted to the plurality of lower diodes 72. Therefore, it is possible to limits changes in the forward threshold value caused by temperature changes of the upper diode 71 and the lower diode 72.

(2-4) The back-surface metal layer 82b is provided on the back surface of the first substrate 82A, and the front-surface metal layer 82c is provided on the front surface of the first substrate 82A. The back-surface metal layer 82b and the front-surface metal layer 82c are formed of the same material. According to this configuration, the thermal conductivity rate of the front surface of the first substrate 82A and the thermal conductivity rate of the back surface of the first substrate 82A are the same. Accordingly, when the first substrate 82A is heated, the extension amount of the front surface of the first substrate 82A and the extension amount of the back surface of the first substrate 82A are substantially the same. This limits warpage of the first substrate 82A caused by a difference between the thermal conductivity rate of the front surface of the first substrate 82A and the thermal conductivity rate of the back surface of the first substrate 82A. In addition, the back-surface metal layer 82b is provided on the back surface of the second substrate 82B, and the front-surface metal layer 82c is provided on the front-surface of the second substrate 82B. In the same manner as the first substrate 82A, this configuration limits warpage of the second substrate 82B caused by a difference between the thermal conductivity rate of the front surface of the second substrate 82B and the thermal conductivity rate of the back surface of the second substrate 82B.

(2-5) The upper diode 71 is provided as a separate chip from the upper switching element 11, and is arranged with a space between itself and the upper switching element 11. The lower diode 72 is provided as a separate chip from the lower switching element 12 and is arranged with a space between itself and the lower switching element 12. According to this configuration, the upper diode 71 is not affected by heat from the upper switching element 11, and the lower diode 72 is not affected by heat from the lower switching element 12.

(2-6) A configuration is employed in which the inductance of the upper diode wire 91 is smaller than the inductance of the upper power wire 44. The inductance of the lower diode wire 92 is smaller than the inductance of the lower power wire 46. According to such a configuration, since a current more easily flows to the upper diode wire 91 having inductance lower than that of the upper power wire 44, a current easily flows to the upper diode 71 than to the body diode 11a of the upper switching element 11. Since current flows more easily to the lower diode wire 92 having an inductance lower than the lower power wire 46, current flows more easily to the lower diode 72 than to the body diode 12a of the lower switching element 12.

(2-7) The plurality of upper switching elements 11 and the plurality of upper diodes 71 are arranged so as to be adjacent to the connecting portions 84a to 84e of the second input terminal member 84 in the second direction Y. That is, the upper power wire 44 of the upper switching element 11 and the lower power wire 46 of the lower switching element 12 are adjacent in the second direction Y. The upper diode wire 91 of the upper diode 71 and the lower diode wire 92 of the lower diode 72 are adjacent to each other in the second direction Y. According to this configuration, in a case where the upper switching element 11 and the lower switching element 12 turn on and off in a complementary manner, the direction of a current flowing through the upper power wire 44 and the direction of a current flowing through the lower power wire 46 are opposite. As a result, since the magnetic field generated around the upper power wire 44 and the magnetic field generated around the lower power wire 46 cancel each other, noise of the upper power wire 44 and the lower power wire 46 can be reduced. In addition, in a case where the upper switching element 11 and the lower switching element 12 turn on and off in complementary manner, the direction of a current flowing through the upper diode wire 91 and the direction of a current flowing through the lower diode wire 92 are opposite. As a result, since the magnetic field generated around the upper diode wire 91 and the magnetic field generated in the lower diode wire 92 cancel each other, noise of the upper diode wire 91 and the lower diode wire 92 can be reduced.

In particular, since the upper power wire 44 and the lower power wire 46 are parallel to each other, it is possible to effectively cancel the magnetic field generated around the upper power wire 44 and the magnetic field generated around the lower power wire 46. In addition, since the upper diode wire 91 and the lower diode wire 92 are parallel to each other, it is possible to effectively cancel the magnetic field generated around the upper diode wire 91 and the magnetic field generated around the lower diode wire 92.

(2-8) The back-surface metal layer 81b is provided on the back surface of the main body portion 81a of the ceramic substrate 81, and the front-surface metal layer 81c is provided on the front surface of the main body portion 81a. The back-surface metal layer 81b and the front-surface metal layer 81c are formed of the same material. According to this configuration, the thermal conductivity rate of the front surface of the main body portion 81a of the ceramic substrate 81 and the thermal conductivity rate of the back surface of the main body portion 81a are the same. As a result, when the ceramic substrate 81 is heated, the extension amount of the front-surface of the ceramic substrate 81 and the extension amount of the back surface of the ceramic substrate 81 are substantially the same. This limits warping of the ceramic substrate 81 caused by the difference between the thermal conductivity rate of the front surface of the ceramic substrate 81 and the thermal conductivity rate of the back surface of the ceramic substrate 81.

Third Embodiment

With reference to FIG. 31 to FIG. 35, a power module 1 of a third embodiment will now be described. Compared with the power module 1 of the second embodiment, the power module 1 of the present embodiment is different in that an upper switching element and an upper diode are formed on the same chip, and a lower switching element and a lower diode are formed on the same chip The power module 1 includes an upper MIS transistor 130 having the upper switching element and the upper diode formed on the same chip, and a lower MIS transistor 131 having the lower switching element and the lower diode formed on the same chip. Each of the MIS transistors 130, 131 is a trench gate type DMISFET (double implanted metal insulator semiconductor field effect transistor) in which silicon carbide (SiC) is employed. The upper MIS transistor 130 and the lower MIS transistor 131 have identical structures. Therefore, in the following description, the structure of the upper MIS transistor 130 will be described, and the description of the structure of the lower MIS transistor 131 will be omitted. The configurations of the upper MIS transistor 130 and the lower MIS transistor 131 are not limited to the configurations illustrated in FIGS. 31 and 32, and various modifications are possible.

The upper MIS transistor 130 is, for example, in the form of a chip having a square shape in a plan view as illustrated in FIG. 31A. In the upper MIS transistor 130, each of the lengths in the vertical and horizontal directions on the paper surface of FIG. 31A is about several millimeters.

On the front surface of the upper MIS transistor 130, a source pad 132 is formed. The source pad 132 is formed so as to cover most of the front surface of the upper MIS transistor 130. A removed region 133 is formed near the center of one side of the source pad 132. The removed region 133 is a region where the source pad 132 is not formed.

In the removed region 133, a gate pad 134 is arranged. A space is provided between the gate pad 134 and the source pad 132. The gate pad 134 and the source pad 132 are electrically insulated from each other.

As illustrated in FIG. 32, the upper MIS transistor 130 has an $n^+$-type SiC substrate 140. The SiC substrate 140 functions as the drain of the upper MIS transistor 130, the surface 140A (upper surface) that is a Si surface, and the back surface 140B (lower surface) that is a C surface.

On the front surface 140A of the SiC substrate 140, an $n^-$-type epitaxial layer 141 having a concentration lower than that of the SiC substrate 140 is laminated. The epitaxial layer 141 as a semiconductor layer is formed on the SiC substrate 140 by so-called epitaxial growth. The epitaxial layer 141 formed on the front surface 140A which is the Si surface is grown with the Si surface as a growth main surface. Therefore, the surface 141A of the epitaxial layer 141 formed by growth is a Si surface in the same manner as the surface 140A of the SiC substrate 140.

As illustrated in FIG. 31A, in the upper MIS transistor 130, an active region 142 arranged in the center portion of the epitaxial layer 141 in a plan view and functioning as the upper MIS transistor 130 and an outer peripheral region 143 surrounding the active region 142 are formed.

In the active region 142, gate trenches 144 are formed in a lattice shape in the epitaxial layer 141 (see FIG. 31B). These gate trenches 144 partitions the epitaxial layer 141 into a plurality of quadrangular (square) cells 145.

The plurality of cells 145 includes a Schottky cell 146 and a pn diode cell 147 having a relatively smaller planar area than that of the Schottky cell 146. For example, the Schottky cell 146 has the area corresponding to the area of four pn diode cells 147, and the length of one side of the Schottky cell 146 is equal to twice the length of one side of the pn diode cell 147.

One cell group is formed by one Schottky cell 146 and a plurality of pn diode cells 147 (twelve pn diode cells 147 in the present embodiment) surrounding the Schottky cell 146. Such cell groups are arranged in a matrix. Here, the pn diode cells 147 of the adjacent cell groups are shared. That is, a pn diode cell 147 surrounding the Schottky cell 146 of a predetermined cell group is also used as a pn diode cell 147 surrounding the Schottky cell 146 of the cell group adjacent to the predetermined cell group.

As illustrated in FIG. 32, as elements shared by the Schottky cell 146 and the pn diode cell 147, the epitaxial layer 141 has an $n^+$-type source region 148, a p-type body region 149, and a drift region 150 in this order from the surface 141A toward the back surface 141B.

The drift region 150 is an $n^-$-type region in which the state after the epitaxial growth is maintained as it is, is integrally connected at bottom portions of all the cells 145, and is shared among the cells 145. That is, the gate trench 144 defines each cell 145 such that the source region 148 and the body region 149 are exposed on a side surface 144A, and the deepest portion that is located in the middle of the drift region 150. The gate trench 144 includes linear portions 151 linearly extending in the row direction and the column direction along the four side surfaces of each cell 145 between the adjacent cells 145, and an intersecting portion 152 where the linear portion 151 extending in the row direction intersects the linear portion 151 extending in the column direction.

On the inner surface of the gate trench 144, a gate insulating film 153 made of an oxide film $SiO_2$ or a high-k material (SiN, $Al_2O_3$, AlON or the like) is formed so as to cover the entirety thereof. A portion of the gate insulating film 153 on the bottom surface 144B of the gate trench 144 is thicker than a portion on the side surface 144A of the gate trench 144. Then, the inside of the gate insulating film 153 in the gate trench 144 is filled with polysilicon so that a gate electrode 154 is buried in the gate trench 144.

In this manner, in each Schottky cell 146 and each pn diode cell 147, a vertical-type MIS transistor structure is configured in which the source region 148 and the drift region 150 are arranged so as to be spaced apart from each other via the body region 149 in the vertical direction perpendicular to the front surface 141A of the epitaxial layer 141.

In the center portion of the Schottky cell 146, a first source trench 155 having a square shape in a plan view is formed, the first source trench 155 extending from the surface 141A of the epitaxial layer 141 and reaching the drift region 150 through the source region 148 and the body region 149. The depth of the first source trench 155 is equal to the depth of the gate trench 144.

In the first source trench 155, a p-type first withstand voltage holding region 156 is formed. The first withstand voltage holding region 156 is formed into a ring shape extending from a ring-shaped edge portion 155C formed by intersecting the bottom surface 155A and a side surface 155B of the first source trench 155 and surrounding the periphery of the bottom surface 155A to a body region 149 exposed to the side surface 155B of the first source trench 155. As a result, a square Schottky region 157 having a square shape in a plan view and formed by part of the drift region 150 is formed in the central portion of the bottom surface 155A of the first source trench 155 surrounded by the first withstand voltage holding region 156.

The Schottky region 157 has the area to which a depletion layer generated from a pn junction portion (body diode 158) between the Schottky region 157 and the first withstand voltage holding region 156 is not connected.

In contrast, in the center portion of the pn diode cell 147, a second source trench 159 is formed extending from the surface 141A of the epitaxial layer 141 and reaching the drift region 150 through the source region 148 and the body region 149. The depth of the second source trench 159 is equal to the depth of the gate trench 144. The area of the second source trench 159 is smaller than the area of the Schottky region 157.

In the second source trench 159, a p-type second withstand voltage holding region 160 is formed. The second withstand voltage holding region 160 is formed over the entire surface of a bottom surface 159A of the second source trench 159, and is formed into a container shape extending from the ring-shaped edge portion 159C formed by intersecting the bottom surface 159A and a side surface 159B of the second source trench 159 and surrounding the periphery of the bottom surface 159A to the body region 149 exposed to the side surface 159B of the second source trench 159.

In the second source trench 159, a $p^+$-type bottom portion body contact region 161 is formed on a front-surface layer portion of the second withstand voltage holding region 160 at the center portion of the bottom surface 159A of the second source trench 159. By bringing the bottom portion body contact region 161 into ohmic contact, it is possible to bring the bottom portion body contact region 161 into contact with (electrically connected to) the body region 149 of the pn diode cell 147 through the second withstand voltage holding region 160.

Since the second withstand voltage holding region 160 is formed in the second source trench 159, the pn diode cell 147 is configured by a pn junction between the second withstand voltage holding region 160 and the drift region 150, and incorporates a body diode 162 having a bottom portion body contact region 161 as a contact on the anode side and including a SiC substrate 140 as a contact on the cathode side.

In addition, a third withstand voltage holding region 163 (relay region) is formed at each intersecting portion 152 of the gate trench 144 defining the plurality of cells 145. The third withstand voltage holding region 163 is formed over the entire surface of the bottom surface 144B of the gate trench 144 in the intersecting portion 152 and is formed to extend from the bottom surface 144B to an edge portion 144C of the gate trench 144 formed under each corner portion of each cell 145 exposed to the intersecting portion 152 and the body region 149 immediately above the edge portion 144C. That is, the third withstand voltage holding region 163 is formed in a square shape slightly larger than the intersecting portion 152 of the gate trench 144 in a plan view, and each corner thereof enters each corner portion of each cell 145 facing the intersecting portion 152. In addition, impurity concentration of the third withstand voltage holding region 163 is higher than impurity concentration of the body region 149 and impurity concentration of the drift region 150.

By using the third withstand voltage holding region 163 as a relay, it is possible to contact (be electrically connected to) the first withstand voltage holding region 156 of the Schottky cell 146 via the bottom portion body contact region 161 to the second withstand voltage holding region 160, the body region 149 of the pn diode cell 147, the third withstand voltage holding region 163, and the body region 149 of the Schottky cell 146.

As illustrated in FIG. 31A, in the outer peripheral region 143, a plurality of p-type guard rings 164 (four in the present embodiment) are formed in a front-surface layer portion of the epitaxial layer 141 so as to surround the active region 142 at an interval from the active region 142. The guard rings 164 can be formed by an ion implantation step that is the same as the step of forming the p-type body region 149. Each guard ring 164 is formed in a rectangular ring shape along the outer periphery of the upper MIS transistor 130 in a plan view.

As illustrated in FIG. 32, on the epitaxial layer 141, an interlayer insulating film 165 made of an oxide film $SiO_2$ or a high-k material (SiN, $Al_2O_3$, AlON or the like) is laminated so as to cover the gate electrode 154. Contact holes 166, 167 having a larger diameter than the first source trench 155 and the second source trench 159 are formed in the interlayer insulating film 165 and the gate insulating film 153.

On the interlayer insulating film 165, a source electrode 168 is formed. The source electrode 168 collectively enters all of the first source trench 155 and the second source trench 159 through the contact holes 166, 167.

In the Schottky cell 146, the source electrode 168 contacts the Schottky region 157, the first withstand voltage holding region 156, and the source region 148 in this order from the bottom side of the first source trench 155. In addition, the source electrode 168 is in contact with the bottom portion body contact region 161, the second withstand voltage holding region 160, and the source region 148 in this order from the bottom side of the second source trench 159 in the pn diode cell 147. That is, the source electrode 168 is wiring shared by all of the cells 145.

The interlayer insulating film 165 is formed on the source electrode 168, and the source electrode 168 is electrically connected to the source pad 132 via the interlayer insulating film 165. In contrast, the gate pad 134 is electrically connected to the gate electrode 154 via gate wiring (not illustrated) led onto the interlayer insulating film 165.

The source electrode 168 has a polysilicon layer 169, an intermediate layer 170, and a metal layer 171 in this order from the contact side of the epitaxial layer 141.

As the polysilicon layer 169, impurity-doped doped polysilicon is used. As the impurity of the polysilicon layer 169, an n-type impurity such as nitrogen (N), phosphorus (P), or arsenic (As) or a p-type impurity such as aluminum (Al) or boron (B) can be used.

The polysilicon layer 169 is formed so as to cover the entire surface of the cell 145 exposed in the contact holes 166, 167. The polysilicon layer 169 is formed to entirely cover the Schottky region 157, the first withstand voltage holding region 156, and the source region 148 in the first source trench 155, and all of the bottom portion body contact region 161, the second withstand voltage holding region 160, and the source region 148 in the second source trench 159.

The polysilicon layer 169 forms Schottky junction with the source region 148 in the Schottky cell 146. As a result, the polysilicon layer 169 forms heterojunction with the Schottky region 157 (for example, height of the junction barrier is 1 to 1.5 eV) with a smaller junction barrier than the diffusion potential (for example, 2.8 to 3.2 eV) of the body diode 172 (for example, a diode formed by pn junction between the body region 149 and the drift region 150) built in each of the Schottky cell 146 and the pn diode cell 147. As a result, in the Schottky cell 146, a heterojunction diode 172 is formed between the source electrode 168 and the Schottky region 157. In addition, the polysilicon layer 169 forms ohmic contact between the bottom portion body contact region 161 and the source region 148 in the pn diode cell 147.

The intermediate layer 170 is a metal layer laminated on the polysilicon layer 169. The metal layer 171 is the outermost layer of the source electrode 168.

An example of a combination of the polysilicon layer 169, the intermediate layer 170, and the metal layer 171 is a laminated structure (polysilicon/Ti/Al) in which polysilicon (polysilicon layer 169), titanium (intermediate layer 170), and aluminum metal layer 171) are laminated in this order. In addition, it is preferable that the metal layer 171 has a molybdenum layer (Mo layer). Since molybdenum has a high melting point, by containing a molybdenum layer in the metal layer 171, melting damage of the metal layer 171 caused by heat generated when a large current flows through the source electrode 168 can be limited.

On the back surface 140B of the SiC substrate 140, a drain electrode 174 is formed so as to cover the entire back surface 140B. The drain electrode 174 is shared by all of the cells 145. As the drain electrode 174, for example, a laminated structure (Ti/Ni/Au/Ag) in which titanium (Ti), nickel (Ni), gold (Au), and silver (Ag) are laminated in this order from the SiC substrate 140 side can be used.

Figure 33:
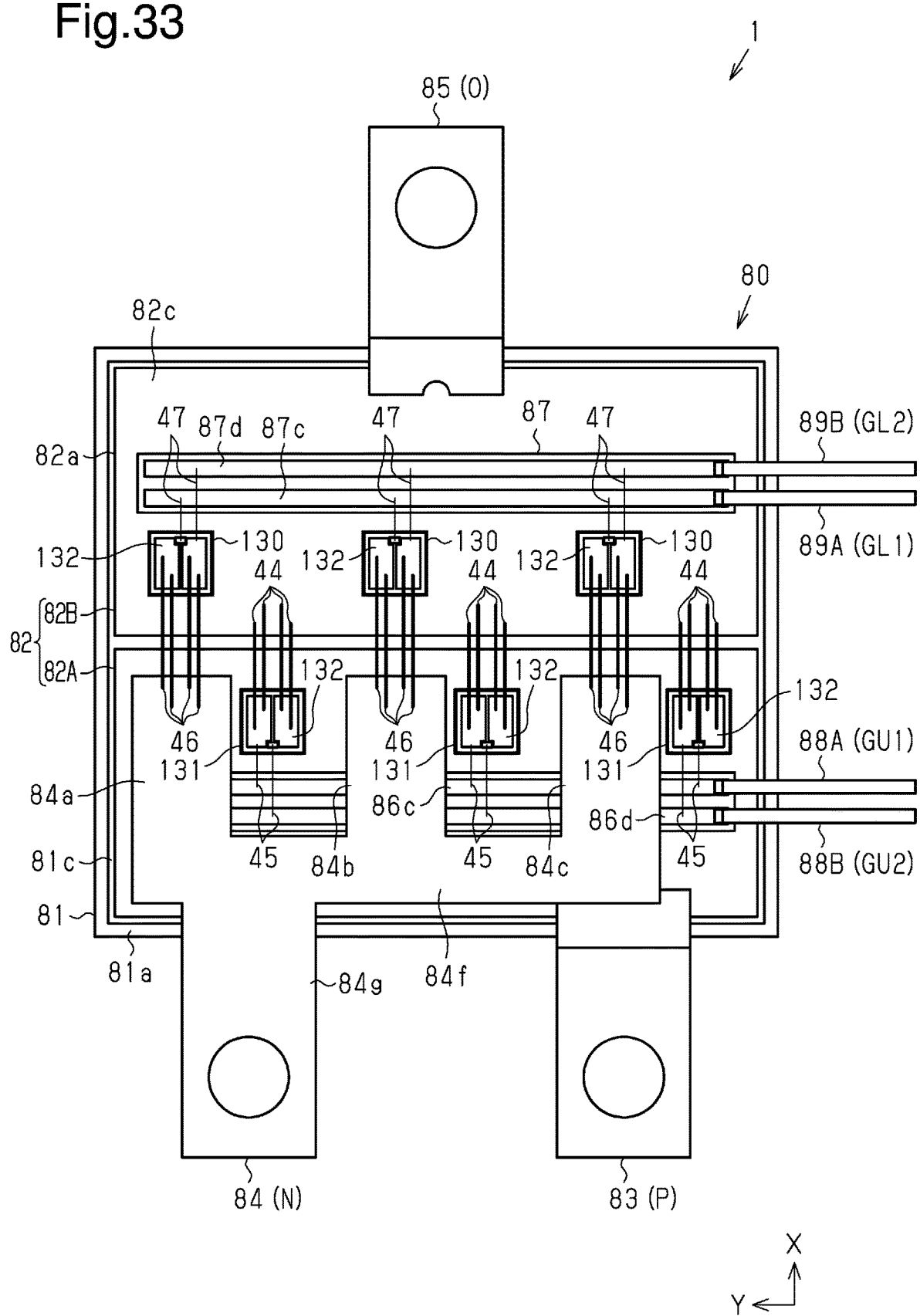
FIG. 33 is a plan view illustrating the internal configuration of the power module.

As illustrated in FIG. 33, in the power module 1, the plurality of upper MIS transistors 130 (three upper MIS transistors 130 in the present embodiment) are mounted on the first substrate 82A and the plurality of lower MIS transistors 131 (three lower MIS transistors 131 in the present embodiment) are mounted on the second substrate 82B.

In the power module 1 of the present embodiment, the position of the upper signal substrate 86 on the first substrate 82A, the position of the lower signal substrate 87 on the second substrate 82B, the positions of the input terminal members 83, 84 on the first substrate 82A and the positions of the output terminal members 85 on the first substrate 82A are the same as those in the power module 1 of the second embodiment. In contrast, in the power module 1 of the present embodiment, the shape of the second input terminal member 84 is different from that of the second input terminal member 84 of the power module 1 of the second embodiment.

The second input terminal member 84 of the present embodiment has three connecting portions, that is, a first connecting portion 84*a*, a second connecting portion 84*b*, and a third connecting portion 84*c*. That is, the second input terminal member 84 of the present embodiment does not have a fourth connecting portion 84*d* and a fifth connecting portion 84*e*. Accordingly, the length of the coupling portion 84*f* of the second input terminal member 84 in the second direction Y of the present embodiment is shorter than the length of the coupling portion 84*f* of the second input terminal member 84 in the second direction Y of the second embodiment. In the present embodiment, the distance between the first connecting portion 84*a* and the second connecting portion 84*b* in the second direction Y and the distance between the second connecting portion 84*b* and the third connecting portion 84*c* in the second direction Y are greater than the chip size in the second direction Y of the upper MIS transistor 130, respectively.

The three upper MIS transistors 130 are arranged spaced apart from one another in the second direction Y on the first substrate 82A. Each of the upper MIS transistors 130 is arranged on a portion of the first substrate 82A closer to the second substrate 82B than the upper signal substrate 86. In other words, each upper MIS transistor 130 is arranged at an end portion of the first substrate 82A on the second substrate 82B side. One of the three upper MIS transistors 130 is positioned between the first connecting portion 84*a* and the second connecting portion 84*b* of the second input terminal member 84 in the second direction Y. The upper MIS transistor 130 is arranged closer to the first connecting portion 84*a* than to the second connecting portion 84*b* in the second direction Y. Another of the three upper MIS transistors 130 is located between the second connecting portion 84*b* and the third connecting portion 84*c* of the second input terminal member 84 in the second direction Y. The upper MIS transistor 130 is arranged closer to the second connecting portion 84*b* than to the third connecting portion 84*c* in the second direction Y. The remaining one of the three upper MIS transistors 130 is positioned so as to be adjacent to the third connecting portion 84*c* on the side opposite to the second connecting portion 84*b* in the second direction Y with respect to the third connecting portion 84*c*.

Three lower MIS transistors 131 are arranged at intervals in the second direction Y on the second substrate 82B. Each lower MIS transistor 131 is arranged on a portion of the second substrate 82B on a first substrate 82A side with respect to the lower signal substrate 87. In other words, each lower MIS transistor 131 is arranged at an end portion of the second substrate 82B on a first substrate 82A side. One of the three lower MIS transistors 131 is arranged to face the first connecting portion 84*a* of the second input terminal member 84 in the first direction X. Another one of the three lower MIS transistors 131 is arranged to face the second connecting portion 84*b* of the second input terminal member 84 in the first direction X. The remaining one of the three lower MIS transistors 131 is arranged to face the third connecting portion 84*c* of the second input terminal member 84 in the first direction X.

The three upper MIS transistors 130 are connected in parallel to one another. Three lower MIS transistors 131 are connected in parallel with one another. The connection modes of the transistors 130, 131 by the power wires 44, 46 and the control wires 45, 47 are identical to connection modes of the upper switching element 11 and the lower switching element 12 by the power wires 44, 46 and the control wires 45, 47 of the second embodiment.

Simulation Result

Figure 34:
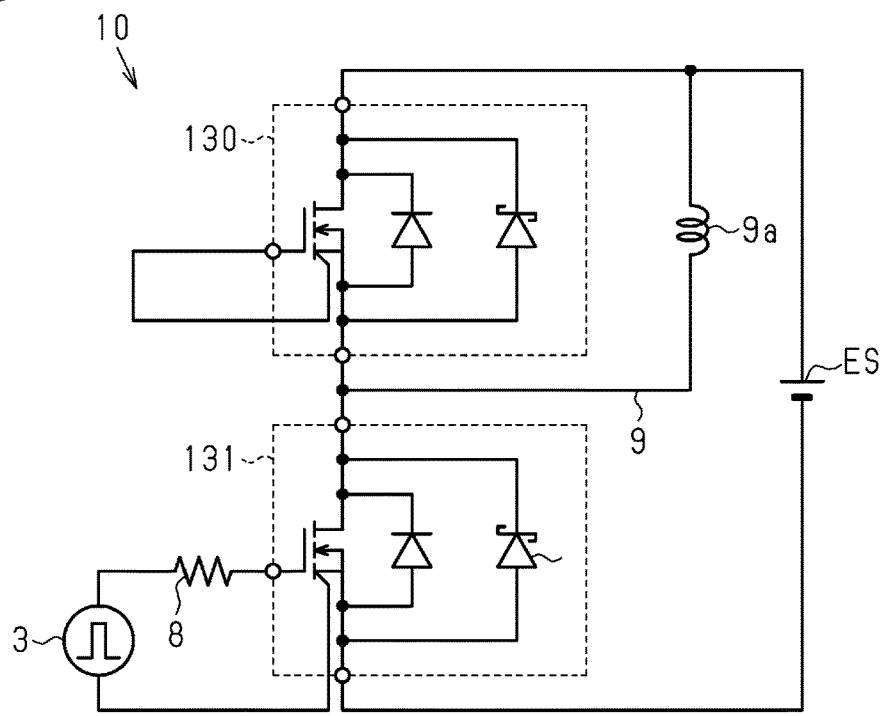
FIG. 34 is a circuit diagram for simulating the power module according to the third embodiment.

Simulations on the relationship between generation of the negative surge voltage and switching loss in a case where the upper switching element 11 (upper MIS transistor 130) is maintained in the off state and the lower switching element 12 (lower MIS transistor 131) is driven in the power modules 1 of the comparative example and the present embodiment have been carried out based on schematic circuit configurations illustrated in FIGS. 7 and 34. FIG. 7 illustrates the schematic circuit configuration of the power module of the comparative example, and FIG. 34 illustrates a schematic circuit configuration of the power module 1 of the present embodiment.

In the circuit configuration of FIG. 34, the source and the gate of the upper MIS transistor 130 are short-circuited, and the lower gate drive circuit 3 is electrically connected to the gate of the lower MIS transistor 131. The gate resistor 8 is provided between the gate of the lower MIS transistor 131 and the lower gate drive circuit 3. The positive terminal of the power supply ES is electrically connected to the drain of the upper MIS transistor 130 and the negative terminal of the power supply ES is electrically connected to the source of the lower MIS transistor 131. The circuit configuration of FIG. 34 has wiring 9 that connects the positive terminal of the power supply ES and the drain of the upper MIS transistor 130 and connects the source of the upper MIS transistor 130 and the drain of the lower MIS transistor 131. The wiring 9 has an inductor load 9a.

In the power module of the comparative example, simulations in cases where the value of the gate resistor 8 was changed to 2 Ω, 3 Ω, 4Ω, and 5Ω were carried out. Here, a case where the value of the gate resistor 8 is 2Ω in the circuit configuration of the power module of the comparative example is defined as a reference condition.

Figure 35:
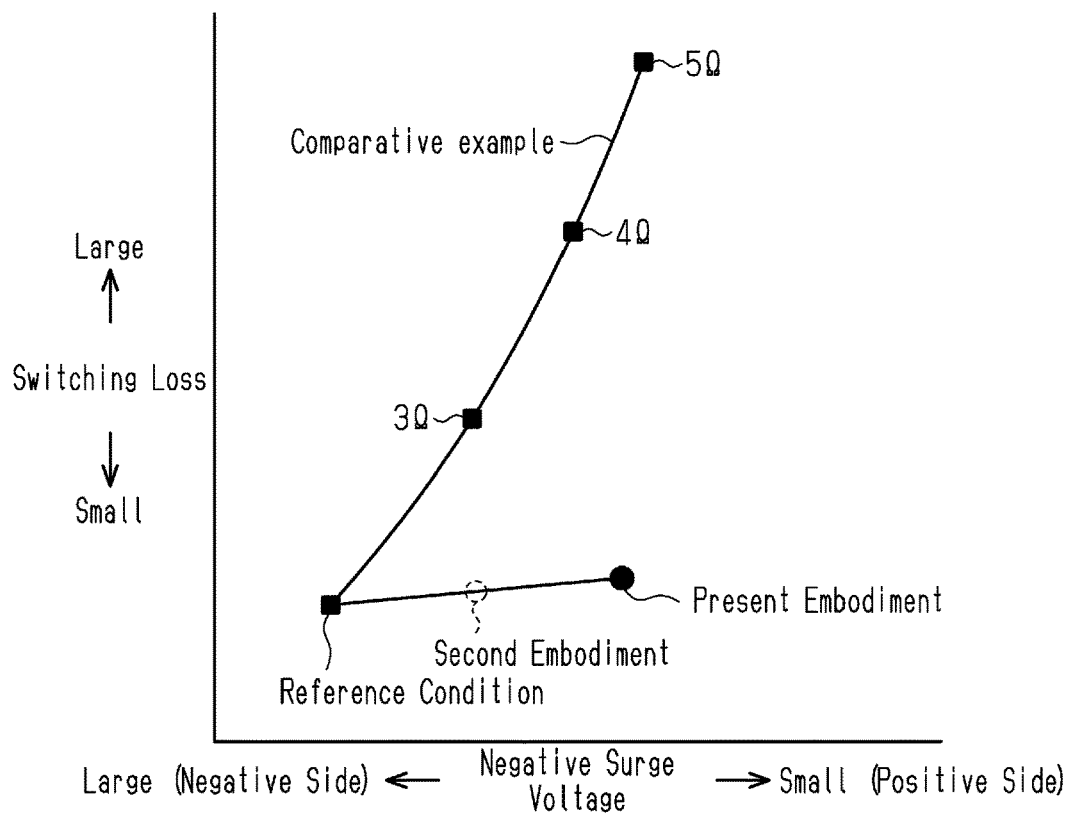
FIG. 35 is a graph illustrating simulation results of the power module of the comparative example of FIG. 7 and the power module of FIG. 34, and illustrating the relationship between the negative surge voltage and switching loss.

As illustrated in FIG. 35, in the power module of the comparative example, an increase in the value of the gate resistor 8 decreases the switching speed of the lower switching element 12 (changing rate of the drain-source voltage Vds1), and thus the absolute value of the negative surge voltage decreases. In contrast, an increase in the value of the gate resistor 8 rapidly increases switching loss.

As illustrated in FIG. 35, in the power module 1 of the present embodiment, the absolute value of the negative surge voltage becomes smaller than the reference condition. In addition, in the power module 1 of the present embodiment, the absolute value of the negative surge voltage is smaller than that of the power module 1 of the third embodiment. This is considered because, by using the upper MIS transistor 130 in which the upper switching element 11 and the upper diode 71 are formed of the same chip, the upper diode wire 91 connected to the upper diode 71 can be omitted and the surge voltage caused by the inductance of the upper diode wire 91 disappeared. In contrast, even though the switching loss increases as the capacitance of the upper capacitor 13 and the lower capacitor 14 increase, the switching loss becomes smaller as compared with the case of an increase in the value of the gate resistor 8 as in the power module of the comparative example.

According to the present embodiment, in addition to advantages (2-1) and (2-4) of the second embodiment, the following advantages can be obtained.

(3-1) The power module 1 has the upper MIS transistor 130 in which the upper switching element 11 and the upper diode 71 are formed of the same chip, and a lower MIS transistor 131 in which the lower switching element 12 and the lower diode 72 are formed of the same chip. According to this configuration, since the upper diode wire 91 and the lower diode wire 92 can be omitted, it is possible to prevent the upper MIS transistor 130 and the lower MIS transistor 131 from being influenced by inductance of the upper diode wire 91 and inductance of the lower diode wire 92. Therefore, it is possible to effectively limit fluctuation caused by the surge voltage of the gate-source voltage Vgsu of the upper MIS transistor 130 and the gate-source voltage Vgs1 of the lower MIS transistor 131.

In addition, as compared with a configuration in which the upper switching element 11 and the upper diode 71 are provided as individual chips and the lower switching element 12 and the lower diode 72 are provided as individual chips, it is possible to reduce the number of elements of the power module 1 to reduce the size of the power module 1.

(3-2) The upper MIS transistors 130 are arranged spaced apart in the second direction Y of the first substrate 82A, and the lower MIS transistors 131 are arranged 82B spaced apart in the second direction Y of the second substrate. The first substrate 82A is configured such that thermal conductivity of the first substrate 82A in the second direction Y is lower than thermal conductivity of the first substrate 82A in the first direction X. The second substrate 82B is configured such that thermal conductivity of the second substrate 82B in the second direction Y is lower than thermal conductivity of the second substrate 82B in the first direction X. According to this configuration, heat of the upper MIS transistor 130 is hardly transmitted to the upper MIS transistor 130 adjacent to this upper MIS transistor 130, and heat of the lower MIS transistor 131 is hardly transmitted to the lower MIS transistor 131 adjacent to this lower MIS transistor 131. Therefore, the temperatures of the upper MIS transistor 130 and the lower MIS transistor 131 are not excessively increased.

(3-3) The upper MIS transistors 130 are arranged so as to be adjacent to the connecting portions 84a to 84c of the second input terminal member 84 in the second direction Y. That is, the upper power wire 44 of the upper MIS transistor 130 and the lower power wire 46 of the lower MIS transistor 131 are adjacent to each other in the second direction Y. According to this configuration, in a case where the upper MIS transistor 130 and the lower MIS transistor 131 are turn on and off in a complementary manner, the direction of a current flowing through the upper power wire 44 and the direction of a current flowing through the lower power wire 46 are opposite. As a result, since the magnetic field generated around the upper power wire 44 and the magnetic field generated around the lower power wire 46 cancel each other, noise of the upper power wire 44 and the lower power wire 46 can be reduced. In particular, since the upper power wire 44 and the lower power wire 46 are parallel to each other, it is possible to effectively cancel the magnetic field generated around the upper power wire 44 and the magnetic field generated around the lower power wire 46.

Fourth Embodiment

With reference to FIG. 36 to FIG. 39, the power module 1 of a fourth embodiment will now be described. The power module 1 of the present embodiment is different from the power module 1 of the first embodiment in that the upper diode 71 and the lower diode 72 of the power module 1 of the second embodiment are added. In the following description, same reference characters are given to components that correspond to those of the power module 1 of the first embodiment. Such components will not be described.

Figure 36:
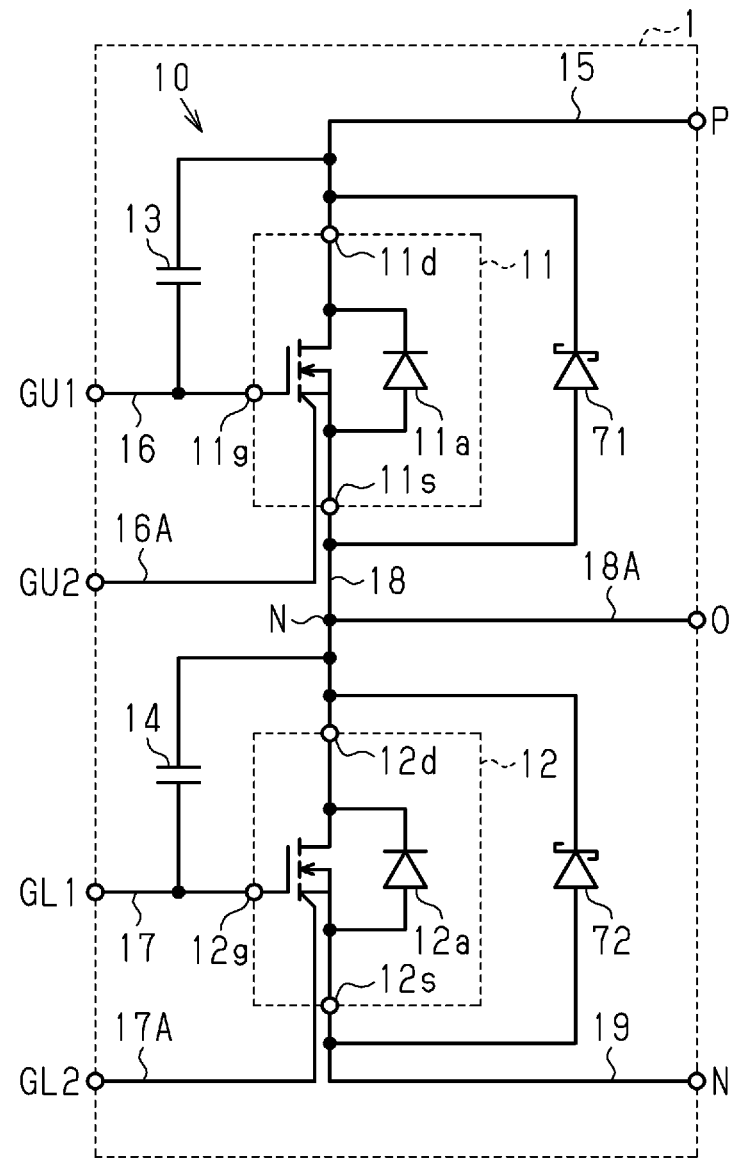
FIG. 36 is a schematic circuit diagram of a power module according to a fourth embodiment.
Figure 37:
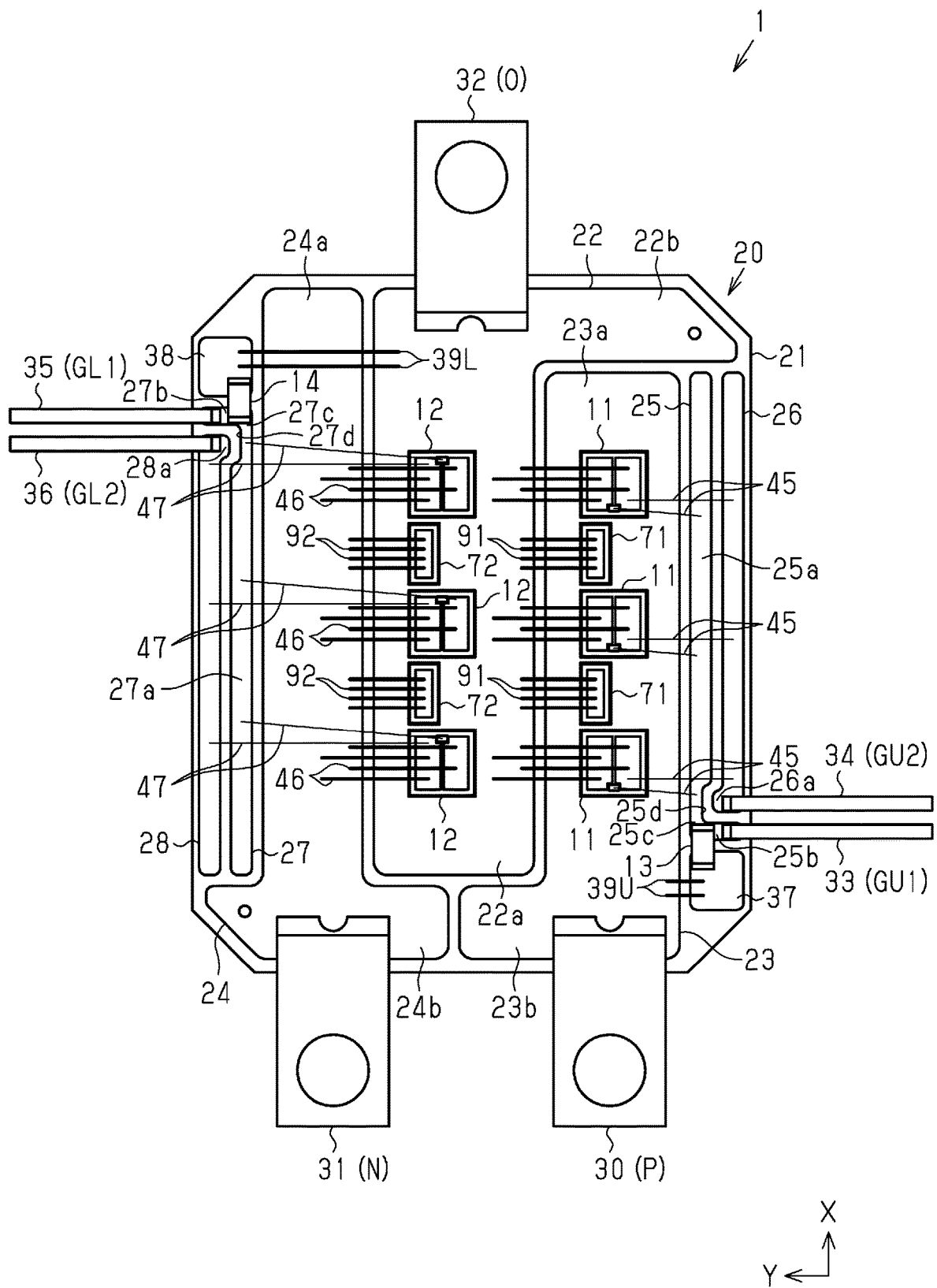
FIG. 37 is a plan view illustrating the internal configuration of the power module.

As illustrated in FIGS. 36 and 37, the upper diode 71 is provided separately from an upper switching element 11, and the lower diode 72 is provided separately from a lower switching element 12. As illustrated in FIG. 36, the cathode of the upper diode 71 is electrically connected to first wiring 15 connecting a drain terminal 11d of the upper switching element 11 and a first input terminal P. More specifically, the cathode of the upper diode 71 is electrically connected to the portion of the first wiring 15 between the drain terminal 11d of the upper switching element 11 and a first terminal of the upper capacitor 13. The anode of the upper diode 71 is electrically connected to a portion of fourth wiring 18 connecting a source terminal 11s of the upper switching element 11 and a drain terminal 12d of the lower switching element 12, the portion being located closer to an upper switching element 11 than a node N. The cathode of the lower diode 72 is electrically connected to a portion of the fourth wiring 18 closer to a lower switching element 12 than the node N. More specifically, the cathode of the lower diode 72 is electrically connected to a portion of the fourth wiring 18 between the drain terminal 12d of the lower switching element 12 and a first terminal of a lower capacitor 14. The anode of the lower diode 72 is electrically connected to fifth wiring 19 connecting the source terminal 12s of the lower switching element 12 and a second input terminal N. In the present embodiment, a Schottky barrier diode is used as each of the upper diode 71 and the lower diode 72. The forward threshold voltages of the upper diode 71 and the lower diode 72 are lower than the forward threshold voltages of the body diode 11a of the upper switching element 11 and the body diode 12a of the lower switching element 12, respectively.

The number of each of the upper switching elements 11 and the lower switching elements 12 can be freely changed. For example, the number of each of the upper switching elements 11 and the lower switching elements 12 is set so that on-resistance thereof becomes on-resistance set in advance. In a case where a plurality of upper switching elements 11 is provided, the plurality of upper switching elements 11 is connected in parallel to each other. That is, the drain terminals 11d of the plurality of upper switching elements 11 are connected to each other, the source terminals 11s of the plurality of upper switching elements 11 are connected to each other, and the gate terminals 11g of the plurality of upper switching elements 11 are connected to each other. In addition, in a case where a plurality of lower switching elements 12 is provided, the plurality of lower switching elements 12 is connected in parallel to each other. That is, the drain terminals 12d of the plurality of lower switching elements 12 are connected to each other, the source terminals 12s of the plurality of lower switching elements 12 are connected to each other, and the gate terminals 12g of the plurality of lower switching elements 12 are connected to each other. In the present embodiment, three upper switching elements 11 are provided, and three lower switching elements 12 are provided.

In addition, the number of each of the upper diodes 71 and the lower diodes 72 can be freely changed. For example, the number of each of the upper diodes 71 and the lower diodes 72 is set based on magnitude of a reflux current flowing while avoiding the upper switching element 11 and the lower switching element 12. In a case where a plurality of upper diodes 71 is provided, the plurality of upper diodes 71 is connected in parallel to each other. That is, the anodes of the plurality of upper diodes 71 are connected to each other, and the cathodes of the plurality of upper diodes 71 are connected to each other. The cathodes of the plurality of upper diodes 71 are connected to the first wiring 15 and the anodes of the plurality of upper diodes 71 are connected to a portion of the fourth wiring 18 closer to an upper switching element 11 than the node N. In a case where a plurality of lower diodes 72 is provided, the plurality of lower diodes 72 is connected in parallel to each other. That is, the anodes of the plurality of lower diodes 72 are connected to each other, and the cathodes of the plurality of lower diodes 72 are connected to each other. The cathodes of the plurality of lower diodes 72 are connected to a portion of the fourth wiring 18 on the lower switching element 12 side with respect to the node N, and the anodes of the plurality of lower diodes 72 are connected to the fifth wiring 19. In the present embodiment, two upper diodes 71 are provided, and two lower diodes 72 are provided.

In the power module 1, the tolerable DC rated current of the upper diode 71 is less than the tolerable DC rated current of the upper switching element 11, and the tolerable DC rated current of the lower diode 72 is less than the tolerable DC rated current of the lower switching element 12. Here, the DC rated current is an absolute maximum rated DC current. In the case where a plurality of upper diodes 71 and a plurality of upper switching elements 11 are provided, the power module 1 is configured such that the sum of the DC rated currents of the plurality of upper diodes 71 is less than the sum of the DC rated currents of the plurality of upper switching elements 11. In addition, in a case where a plurality of lower diodes 72 and a plurality of lower switching elements 12 are provided, the power module 1 is configured such that the sum of the DC rated currents of the plurality of lower diodes 72 is less than the sum of the DC rated currents of the plurality of lower switching elements 12.

In one example, the power module 1 is configured such that the number of upper diodes 71 is smaller than the number of upper switching elements 11 and the number of lower diodes 72 is smaller than the number of lower switching elements 12. As described above, in the present embodiment, as illustrated in FIG. 19, the power module 1 includes three upper switching elements 11, three lower switching elements 12, two upper diodes 71, and two lower diodes 72. In addition, for example, the tolerable DC rated current of one upper diode 71 may be less than the tolerable DC rated current of one upper switching element 11. In addition, the tolerable DC rated current of one lower diode 72 may be less than the tolerable DC rated current of one lower switching element 12. In this case, the number of upper switching elements 11 and the number of upper diodes 71 may be equal to each other. In addition, the number of lower switching elements 12 and the number of lower diodes 72 may be equal to each other.

Three upper switching elements 11 and two upper diodes 71 are respectively mounted on a first input wiring portion 23 by soldering or the like. The three upper switching elements 11 and the two upper diodes 71 are alternately arranged along the first direction X.

The upper capacitor 13 is positioned closer to a first input terminal member 30 than the upper switching element 11 closest to the first input terminal member 30 side among the three upper switching elements 11 in the first direction X. The upper capacitor 13 is connected to a portion of a first upper control wiring portion 25 closer to a first upper control terminal member 33 than a portion to which an upper control wire 45 is connected to a gate electrode 42 of the upper switching element 11 closest to the first input terminal member 30 among the three upper switching elements 11.

The three lower switching elements 12 and the two lower diodes 72 are respectively mounted on an output wiring portion 22 by soldering or the like. The three lower switching elements 12 and the two lower diodes 72 are alternately arranged along the first direction X. In the first direction X, the positions of the three lower switching elements 12 are the same as the positions of the three upper switching elements 11. In the first direction X, the positions of the two lower diodes 72 are equal to the positions of the two upper diodes 71.

The lower capacitor 14 is positioned closer to the second input terminal member 31 than the lower switching element 12 closest to the second input terminal member 31 among the three lower switching elements 12 in the first direction X. The lower capacitor 14 is connected to a portion of a first lower control wiring portion 27 closer to a first lower control terminal member 35 than a portion to which the lower control wire 47 connected to the gate electrode 42 of the lower switching element 12 closest to the second input terminal member 31 side among the three lower switching elements 12.

Connection modes of the switching elements 11, 12 by the power wires 44, 46 and by the control wires 45, 47 are identical to connection modes of the switching elements 11, 12 by the power wires 44, 46 and by the control wires 45, 47 of the first embodiment. Connection modes of the diode wires 91, 92 of the diodes 71, 72 are identical to connection modes of the diode wires 91, 92 of the diodes 71, 72 of the second embodiment, respectively. The wire diameter of the upper diode wire 91 of the present embodiment is equal to the wire diameter of the upper power wire 44. It is preferable that the four upper diode wires 91 are configured such that the inductance is smaller than the inductance of the four upper power wires 44. In one example, as illustrated in FIG. 37, the length of each of the four upper diode wires 91 is shorter than the length of each of the four upper power wires 44, and the length of each of the four lower diode wires 92 is shorter than the length of each of the four lower power wires 46. As an example of a configuration in which the inductance of each of the diode wires 91, 92 is smaller than the inductance of each of the power wires 44, 46, a configuration may be employed in which the wire diameter of each of the diode wires 91, 92 is greater than the wire diameter of each of the power wires 44, 46. Each power connecting member may be a lead frame of CIC (Cu/Inver/Cu), for example.

According to the present embodiment, advantages (1-1) to (1-9) of the first embodiment and advantages (2-1), (2-2), (2-5), and (2-6) of the second embodiment can be obtained. In addition, in the present embodiment, the upper MIS transistor 130 may be used in lieu of the upper switching element 11 and the upper diode 71, and the lower MIS transistor 131 may be used in lieu of the lower switching element 12 and the lower diode 72. In this case, advantage (3-1) of the third embodiment is obtained.

Simulation Result

Figure 38:
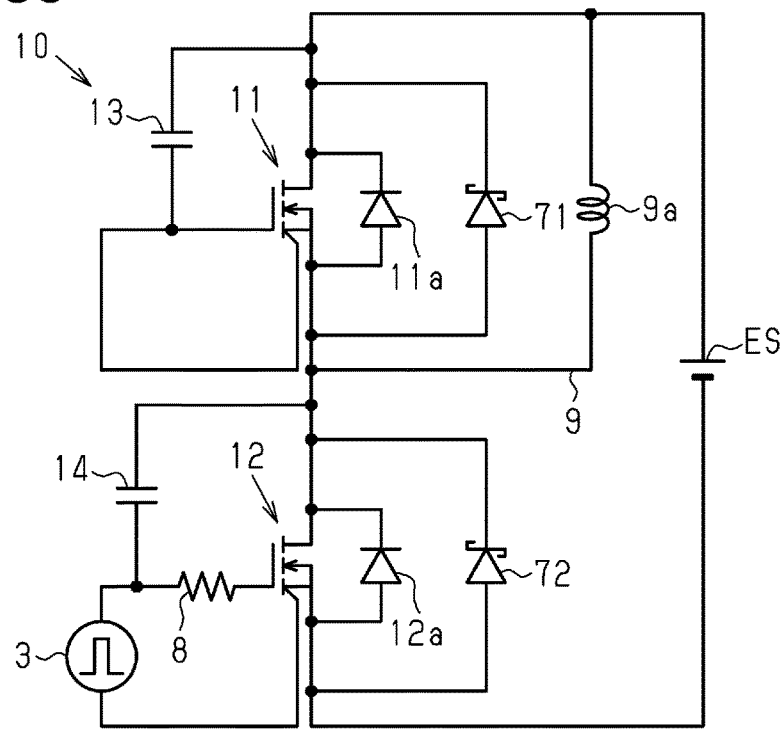
FIG. 38 is a circuit diagram for simulating the power module according to the fourth embodiment.

Simulations on the relationship between generation of the surge voltage on the negative side and switching loss in a case where the upper switching element 11 is maintained in the off state and the lower switching element 12 is driven in the power modules 1 of the comparative example and the present embodiment have been carried out based on schematic circuit configurations illustrated in FIGS. 7 and 38.

FIG. 7 illustrates the schematic circuit configuration of the power module of the comparative example, and FIG. 38 illustrates a schematic circuit configuration of the power module 1 of the present embodiment.

In the circuit configuration of FIG. 38, the cathode of the upper diode 71 and the first terminal of the upper capacitor 13 are electrically connected to the drain of the upper switching element 11, the anode of the upper diode 71 is electrically connected to the source of the upper switching element 11, and the second terminal of the upper capacitor 13 is electrically connected to the gate terminal of the upper switching element 11. The source and the gate of the upper switching element 11 are short-circuited.

The cathode of the lower diode 72 and the first terminal of the lower capacitor 14 are electrically connected to the drain of the lower switching element 12, the anode of the lower diode 72 is electrically connected to the source of the lower switching element 12, and the second terminal of the lower capacitor 14 is electrically connected to the gate of the lower switching element 12. In addition, the lower gate drive circuit 3 is electrically connected to the gate of the lower switching element 12. A gate resistor 8 is provided between the gate of the lower switching element 12 and the lower gate drive circuit 3. The positive terminal of the power supply ES is electrically connected to the drain of the upper switching element 11 and the negative terminal of the power supply ES is electrically connected to the source of the lower switching element 12. The circuit configuration of FIG. 38 has the wiring 9 connecting a section between the positive terminal of the power supply ES and the drain of the upper switching element 11 and a section between the source of the upper switching element 11 and the drain of the lower switching element 12. The wiring 9 has an inductor load 9a.

In the power module of the comparative example, simulations in cases where the value of the gate resistor 8 was changed to 2 Ω, 3 Ω, 4Ω, and 5Ω were carried out. Here, a case where the value of the gate resistor 8 is 2Ω in the circuit configuration of the power module of the comparative example is defined as a reference condition.

Figure 39:
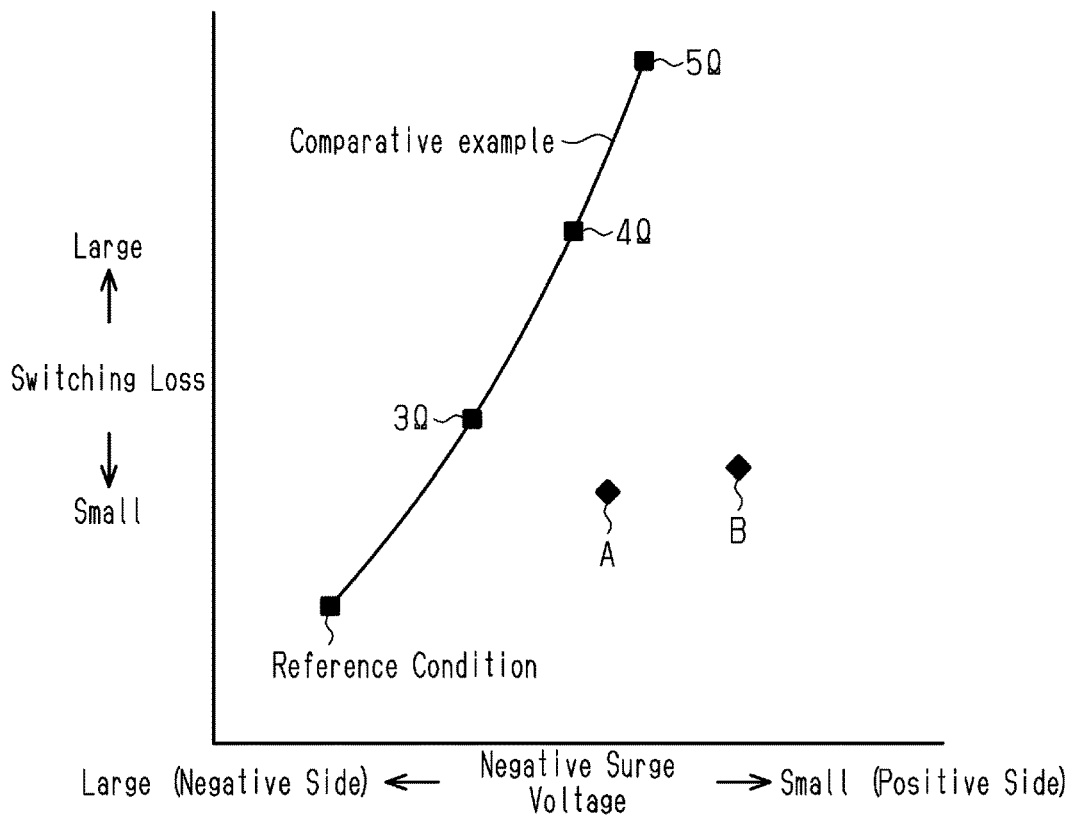
FIG. 39 is a graph illustrating simulation results of the power module of the comparative example of FIG. 7 and the power module of FIG. 38, and illustrating the relationship between the negative surge voltage and switching loss.

As illustrated in FIG. 39, in the power module of the comparative example, an increase in the value of the gate resistor 8 decreases the switching speed of the lower switching element 12 (changing rate of the drain-source voltage Vds1), and thus the absolute value of the negative surge voltage decreases. In contrast, an increase in the value of the gate resistor 8 rapidly increases switching loss.

Simulations on a case where capacitance of the upper capacitor 13 and the lower capacitor 14 were 150 pF were carried out in the power module 1 of the present embodiment. The result is point A in FIG. 39.

As indicated by point A in FIG. 39, in the power module 1 of the present embodiment, the upper capacitor 13, the lower capacitor 14, the upper diode 71, and the lower diode 72 make the absolute value of the negative surge voltage smaller than the reference condition. In contrast, even though the switching loss becomes greater, the switching loss becomes smaller as compared with the case of an increase in the value of the gate resistor 8 as in the power module of the comparative example.

In addition, in the power module 1 of the present embodiment, simulation in a case where the upper MIS transistor 130 is used in lieu of the upper switching element 11 and the upper diode 71, and the lower MIS transistor 131 is used in lieu of the lower switching element 12 and the lower diode 72 was carried out. The result is point B in FIG. 39.

As indicated by point B in FIG. 39, in the power module 1 of the present embodiment, the absolute value of the negative surge voltage with respect to point A becomes small. In contrast, even though the switching loss becomes greater, the switching loss becomes smaller as compared with the case of an increase in the value of the gate resistor 8 as in the power module of the comparative example.

Modified Example

The description of each of the above embodiments is merely an example of a mode that the semiconductor device and the power module according to the present invention can take, and is not intended to limit the mode. The semiconductor device and the power module according to the present invention may be, for example, the following modified examples in addition to the embodiments described above, and may take a mode in which at least two modified examples not mutually contradictory are combined.

The semiconductor device 10 of the power module 1 of the first embodiment and the substrate 80 of the power module 1 of the second embodiment may be combined. In this case, the upper capacitor 13 is provided between a portion where the upper control wire 45 connected to the upper switching element 11 closest to the first upper control terminal member 88A is connected to the first upper control wiring portion 86c and a portion where the first upper control terminal member 88A is connected to the first upper control wiring portion 86c. A lower capacitor 14 is provided between a portion where a lower control wire 47 connected to a lower switching element 12 closest to a first lower control terminal member 89A is connected to a first lower control wiring portion 87c and a portion where a first lower control terminal member 89A is connected to a first lower control wiring portion 87c. In addition, in this case, a second input terminal member 84 may not have a first connecting portion 84a, a second connecting portion 84b, a third connecting portion 84c, a fourth connecting portion 84d, and a fifth connecting portion 84e, in the same manner as the second input terminal member 84 illustrated in FIG. 33.

The semiconductor device 10 of the power module 1 of the second embodiment and the substrate 20 of the power module 1 of the first embodiment may be combined. In this case, for example, the configuration may be obtained by omitting the upper capacitor 13 and the lower capacitor 14 from the configuration of the power module 1 of the fourth embodiment illustrated in FIG. 37. At least one of the upper island portion 37 and the upper connecting wire 39U, and the lower island portion 38 and the lower connecting wire 39L may be omitted.

The power module 1 of the fourth embodiment and the power module 1 of the third embodiment may be combined. That is, in the power module 1 of the fourth embodiment, the upper switching element 11 and the upper diode 71 may be formed on the same chip, and the lower switching element 12 and the lower diode 72 may be formed on the same chip.

In the second and third embodiments, the first upper control terminal member 88A and the second upper control terminal member 88B connected to the upper signal substrate 86 are connected to a first connecting portion 84a side of the second input terminal member 84 in the second direction Y. In addition, the first lower control terminal member 89A and the second lower control terminal member 89B connected to the lower signal substrate 87 may be connected to the first connecting portion 84a side of the second input terminal member 84 in the second direction Y.

In the first and fourth embodiments, the manner of electrical connection between the lower capacitor 14 and the output wiring portion 22 using the lower island portion 38 can be freely changed. For example, the connection mode may be changed as illustrated in FIGS. 40 and 41.

Figure 40:
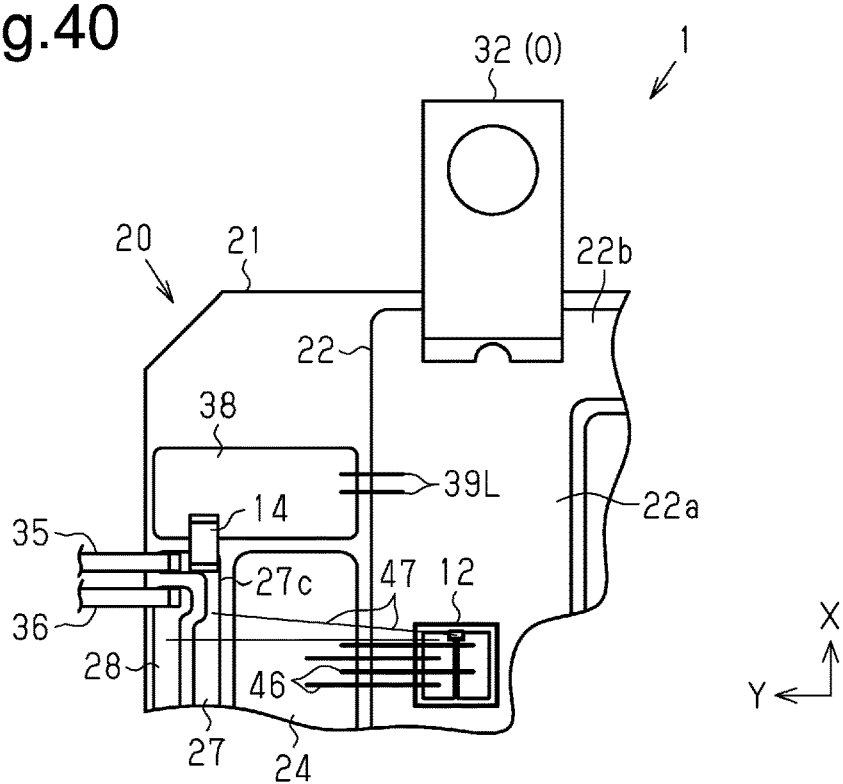
FIG. 40 is a plan view of a lower island portion of a power module and a periphery thereof according to a modified example.

As illustrated in FIG. 40, the lower island portion 38 extends in the second direction Y so as to cover the second input wiring portion 24 from the first direction X. In the second direction Y, the lower island portion 38 is provided so as to be adjacent to the output wiring portion 22. As a result, the lower connecting wire 39L that electrically connects the lower island portion 38 and the output wiring portion 22 does not extend across the second input wiring portion 24. That is, the length of the lower connecting wire 39L can be shortened.

Figure 41:
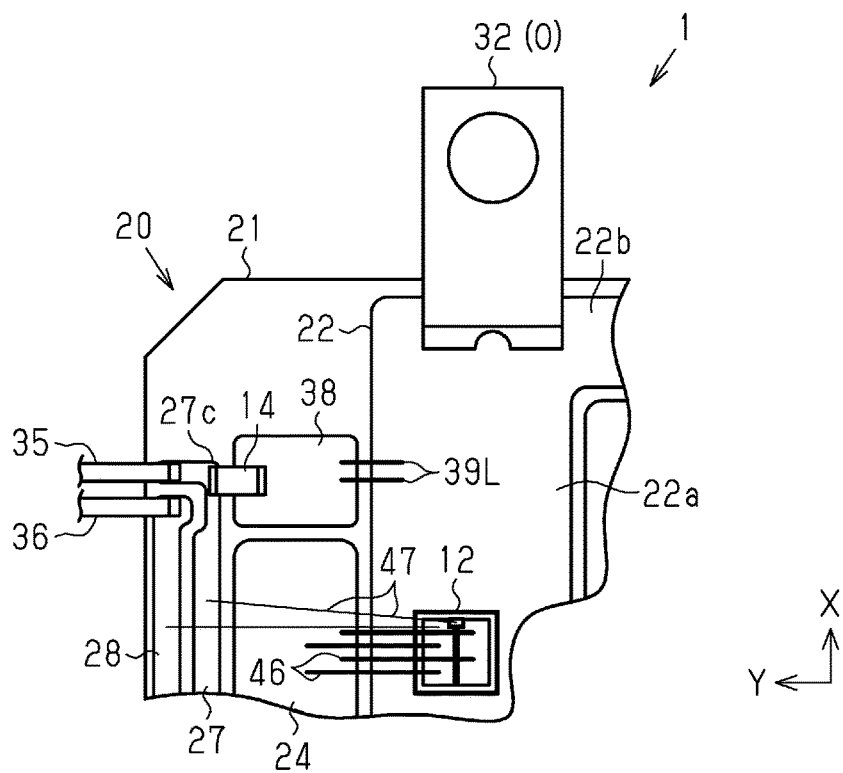
FIG. 41 is a plan view of a lower island portion of a power module and a periphery thereof according to a modified example.

As illustrated in FIG. 41, the lower island portion 38 is provided so as to face the second input wiring portion 24 in the first direction X. The lower island portion 38 is provided so as to be adjacent to the output wiring portion 22 in the second direction Y. In addition, the lower island portion 38 is provided so as to be adjacent to the bent portion 27c of the first lower control wiring portion 27 in the second direction Y. In this case, the lower capacitor 14 is arranged so that the arrangement direction of the first terminal and the second terminal is in the direction along the second direction Y.

In the first and fourth embodiments, the upper island portion 37 may be omitted. In this case, the first terminal of the upper capacitor 13 is directly connected to the bent portion 25c of the first upper control wiring portion 25, and the second terminal of the upper capacitor 13 is directly connected to the first input wiring portion 23.

In the first and fourth embodiments, the lower island portion 38 may be omitted. In this case, the length of the first portion 24a of the second input wiring portion 24 in the first direction X is shortened, and part of the output wiring portion 22 is extended in the second direction Y so as to cover the first portion 24a from the first direction X. As a result, part of the output wiring portion 22 faces the bent portion 27c of the first lower control wiring portion 27 in the second direction Y, with a gap in between in the second direction Y. The first terminal of the lower capacitor 14 is directly connected to the bent portion 27c and the second terminal of the lower capacitor 14 is directly connected to part of the output wiring portion 22.

In the first and fourth embodiments, the length of the first portion 22a of the output wiring portion 22 in the first direction X and the length of the first portion 23a of the first input wiring portion 23 in the first direction X can be freely changed. For example, in the first embodiment, the length of the first portion 22a of the output wiring portion 22 in the first direction X may be set according to the number of lower switching elements 12 mounted on the output wiring portion 22, and the length of the first portion 23a of the first input wiring portion 23 in the first direction X may be set according to the number of upper switching elements 11 mounted on the first input wiring portion 23. For example, in a case where there is one upper switching element 11 and one lower switching element 12, the length of the first portion 22a of the output wiring portion 22 in the first direction X and the length of the first portion 23a of the first input wiring portion 23 in the first direction X can be shortened. Thereby, it is possible to reduce the size of the power module 1 in the first direction X. In addition, in the fourth embodiment, the length of the first portion 22a of the output wiring portion 22 in the first direction X may be set according to the number of lower switching elements 12 and the number of lower diodes 72 mounted on the output wiring portion 22. In addition, the length of the first portion 23a of the first input wiring portion 23 in the first direction X may be set according to the number of upper switching elements 11 and the number of upper diodes 71 mounted on the first input wiring portion 23.

Figure 42:
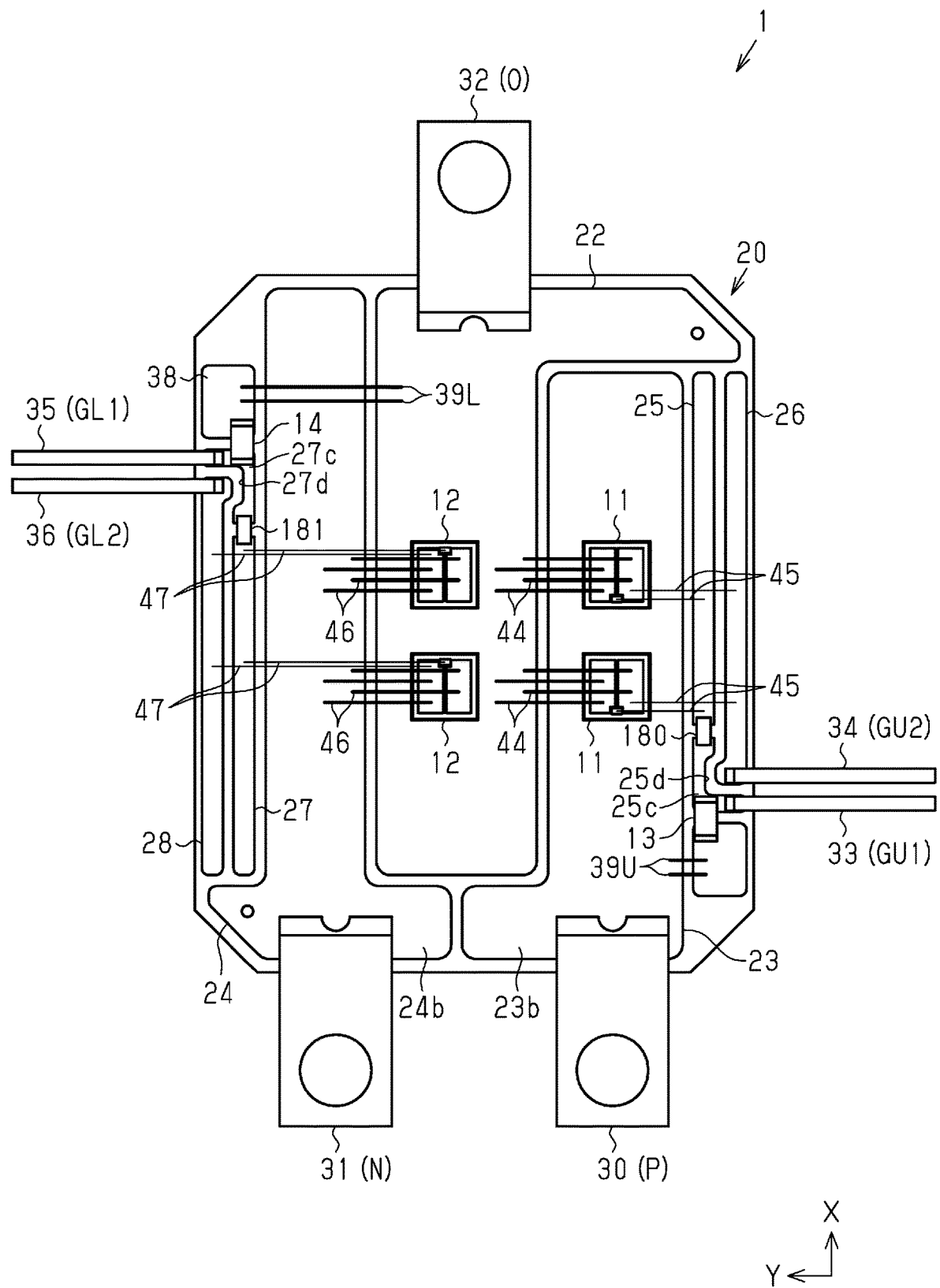
FIG. 42 is a plan view illustrating the internal configuration of a power module according to a modified example.

In the first embodiment, as illustrated in FIG. 42, the power module 1 may include a gate resistor 180 which is an example of an upper control resistor electrically connected to the gate terminal 11g (see FIG. 1) of the upper switching element 11, and a gate resistor 181 which is an example of a lower control resistor electrically connected to the gate terminal 12g (see FIG. 1) of the lower switching element 12. The gate resistor 180 is provided separately from the upper switching element 11. The gate resistor 181 is provided separately from the lower switching element 12. In the first upper control wiring portion 25, the gate resistor 180 mounted on a portion between a portion to which the upper control wire 45 connected to the gate electrode 42 (see FIG. 5A) of the upper switching element 11 is connected and the bent portion 25c. As a result, a first terminal (first upper resistor terminal) of the gate resistor 180 is electrically connected to the gate terminal 11g of the upper switching element 11, and a second terminal (second upper resistor terminal) of the gate resistor 180 is electrically connected to the first terminal of the upper capacitor 13. In the first lower control wiring portion 27, the gate resistor 181 is mounted on a portion between a portion to which the lower control wire 47 connected to the gate electrode 42 of the lower switching element 12 is connected and the bent portion 27c. As a result, the first terminal (first lower resistor terminal) of the gate resistor 181 is electrically connected to the gate terminal 12g of the lower switching element 12, and the second terminal (second lower resistor terminal) of the gate resistor 181 is electrically connected to the first terminal of the lower capacitor 14. According to this configuration, it is possible to adjust the upper switching element 11 and the lower switching element 12 to have appropriate operation speed by changing the resistance values of the gate resistors 180, 181.

In each embodiment, the configurations of the upper switching element 11 and the lower switching element 12 can be freely changed. For example, the upper switching element 11 and the lower switching element 12 may be configured as illustrated in FIG. 43. In the following description, since the upper switching element 11 and the lower switching element 12 have identical structures, the configuration of the upper switching element 11 will be described and the description of the configuration of the lower switching element 12 will be omitted.

Figure 43A:
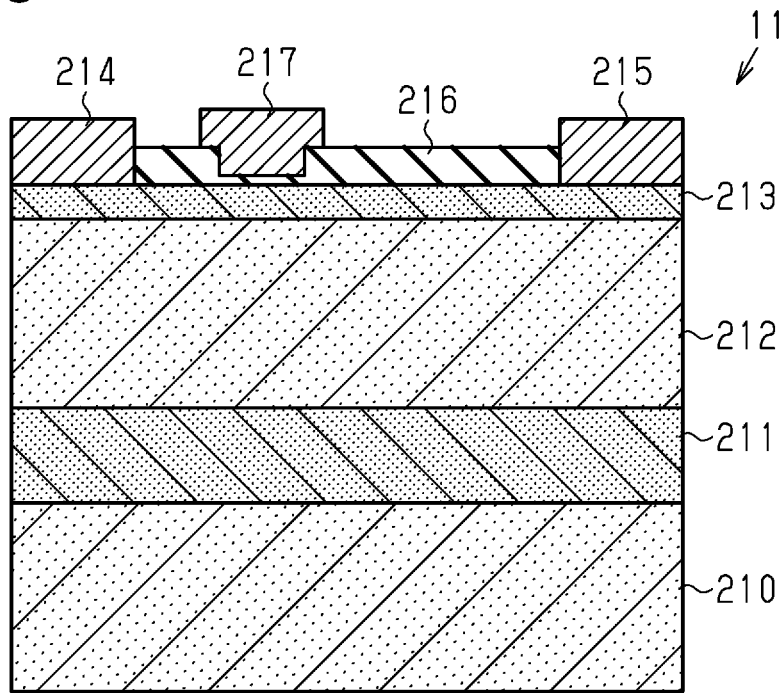
FIGS. 43A and 43B are cross-sectional views of a switching element according to a modified example.
Figure 43B:
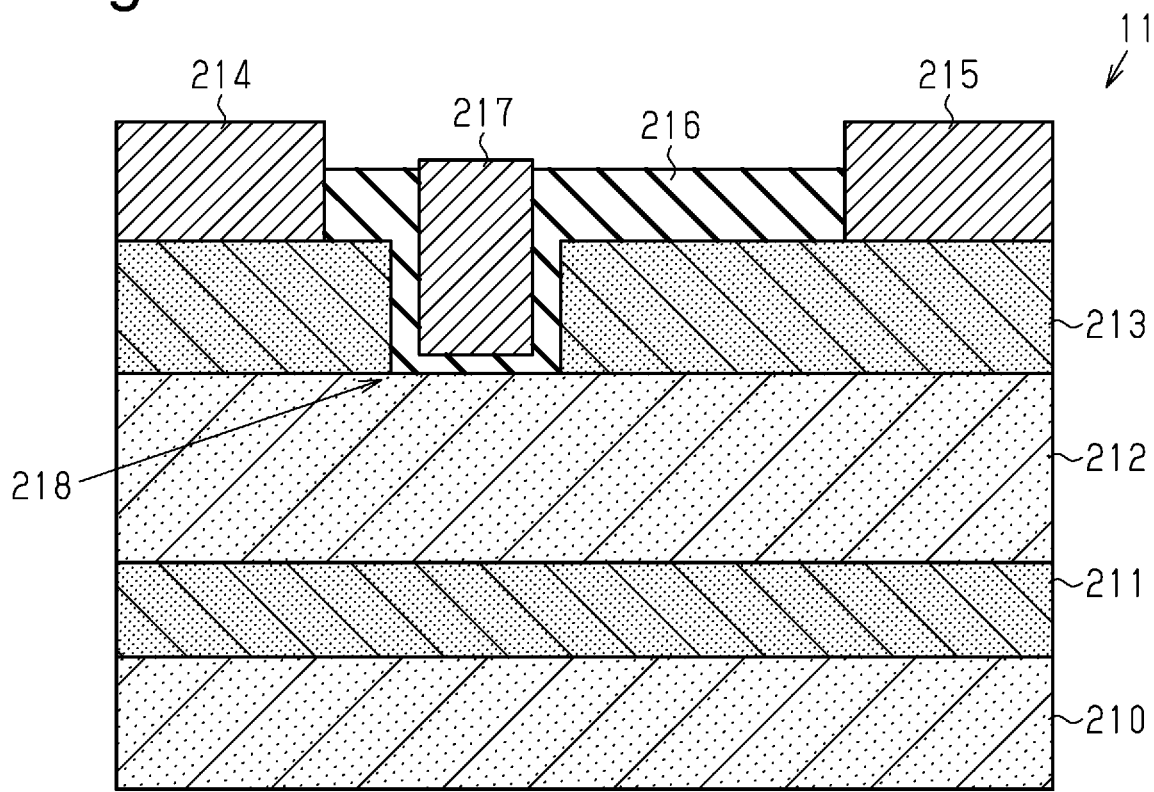

As illustrated in FIGS. 43A, 43B, the upper switching element 11 may be a transistor made of a nitride semiconductor such as HEMT (high electron mobility transistor) of gallium nitride (GaN). As the nitride semiconductor, aluminum gallium nitride (AlGaN), indium gallium nitride (InGaN), or the like may be used.

The upper switching element 11 illustrated in FIG. 43A has a buffer layer 211 formed on, for example, a silicon substrate (Si substrate 210) and made of gallium nitride (GaN) or the like, a channel layer 212 formed on the buffer layer 211 and made of a non-doped GaN layer, and an electron supply layer 213 formed on the channel layer 212 and made of a non-doped AlGaN layer. Further, on the electron supply layer 213, a source electrode 214, a drain electrode 215, and an insulating layer 216 are formed. In addition, on the electron supply layer 213, a gate electrode 217 is formed with an insulating layer 216 in between.

In the upper switching element 11 as described above, since the electron supply layer 213 made of non-doped AlGaN forms a heterojunction on the front surface of the channel layer 212 made of non-doped GaN, at the interface of the joined portion, two-dimensional electron gas (2DEG: two dimensional electron gas) is generated. Therefore, electrons in the 2DEG layer become carriers, and the channel layer 212 is conductive.

In the upper switching element 11 illustrated in FIG. 43B, a trench groove 218 is formed in the electron supply layer 213 made of non-doped AlGaN with respect to the configuration of the upper switching element 11 in FIG. 43A. An insulating layer 216 is formed on the side surface and the bottom surface of the trench groove 218. The side surface and the bottom surface of the insulating layer 216 are filled with the gate electrode 217. The remaining configuration is identical to the configuration of the upper switching element 11 in FIG. 43A.

In the upper switching element 11 of FIG. 43B, the gate electrode 217 is formed in the trench groove 218 formed in the electron supply layer 213 made of non-doped AlGaN with the insulating layer 216 in between. Thus, normally-off characteristics of the 2DEG layer at the interface between the channel layer 212 and the electron supply layer 213 on the lower side of the gate electrode 217 is achieved.

In each of the embodiments, in the upper gate drive circuit 2, the upper switching element 11 may perform synchronous rectification when the lower switching element 12 is on/off driven. In the lower gate drive circuit 3, the lower switching element 12 may perform synchronous rectification when the upper switching element 11 is on/off driven. In other words, in each embodiment, the respective gate drive circuits 2, 3 control the upper switching element 11 and the lower switching element 12 so that the upper switching element 11 and the lower switching element 12 turn on and off in a complementary manner. A configuration including the power module 1 and each of the gate drive circuits 2, 3 may be referred to as a power drive circuit in some cases. The power drive circuit may have a configuration in which each of the gate drive circuits 2, 3 is incorporated in the power module 1.

Circuit to which Power Module 1 is Applied

Figure 44:
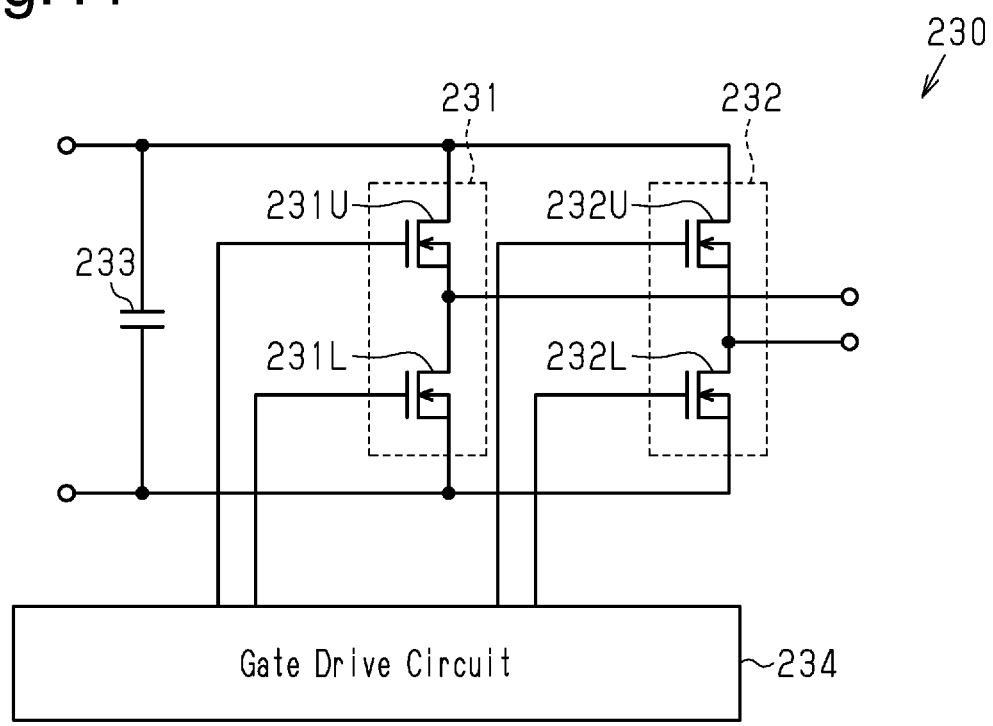
FIG. 44 is a schematic circuit diagram of a full-bridge type inverter to which the power module is applied.
Figure 45:
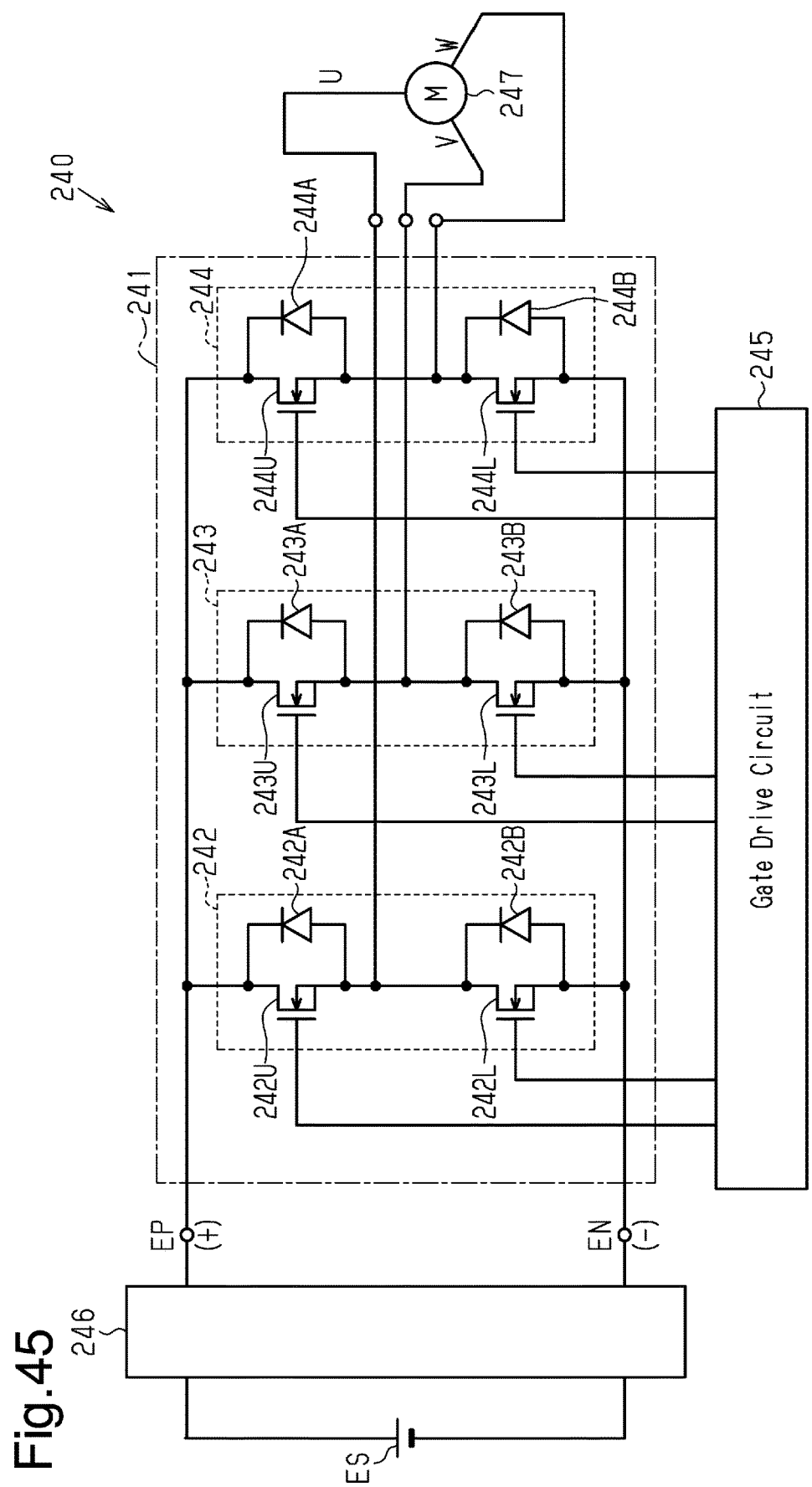
FIG. 45 is a schematic circuit diagram of a three-phase AC inverter to which the power module is applied.

With reference to FIGS. 44 and 45, a circuit to which the power module 1 is applied will be described by way of example.

A full-bridge type inverter circuit (hereinafter simply referred to as "inverter circuit 230") illustrated in FIG. 44 can be applied to the power module 1. The inverter circuit 230 includes a first inverter unit 231, a second inverter unit 232, an input capacitor 233, and a gate drive circuit 234. The inverter circuit 230 is used for driving, for example, a two-phase AC motor (not illustrated) and a power supply circuit.

The first inverter unit 231 includes an upper switching element 231U and a lower switching element 231L. The source terminal of the upper switching element 231U and the drain terminal of the lower switching element 231L are electrically connected. The first inverter unit 231 is connected in parallel with the input capacitor 233. More specifically, the drain terminal of the upper switching element 231U is electrically connected to the first terminal of the input capacitor 233, and the source terminal of the lower switching element 231L is electrically connected to the second terminal of the input capacitor 233.

The second inverter unit 232 includes an upper switching element 232U and a lower switching element 232L. The source terminal of the upper switching element 232U and the drain terminal of the lower switching element 232L are electrically connected. The second inverter unit 232 is connected in parallel to the first inverter unit 231. More specifically, the drain terminal of the upper switching element 232U is electrically connected to the drain terminal of the upper switching element 231U, and the source terminal of the lower switching element 232L is electrically connected to the source terminal of the lower switching element 231L.

The gate drive circuit 234 is electrically connected to the gate terminals of the switching elements 231U, 231L, 232U, and 232L, respectively. The gate drive circuit 234 controls turning on and off of the switching elements 231U, 231L, 232U, 232L.

In the inverter circuit 230 described above, the power module 1 can be applied to at least one of the first inverter unit 231 and the second inverter unit 232. In a case where the power module 1 is applied to the first inverter unit 231, the first terminal and the second terminal of the input capacitor 233 are electrically connected to the first input terminal P and the second input terminal N of the power module 1, respectively, and the gate drive circuit 234 is electrically connected to the first upper control terminal GU1 and the first lower control terminal GL1. In a case where the power module 1 is applied to the second inverter unit 232, the drain terminal of the upper switching element 231U and the source terminal of the lower switching element 231L are electrically connected to the first input terminal P and the second input terminal N, respectively and the gate drive circuit 234 is electrically connected to the first upper control terminal GU1 and the first lower control terminal GL1.

A three-phase AC inverter circuit (hereinafter simply referred to as "three-phase inverter circuit 240") illustrated in FIG. 45 can also be applied to the power module 1.

The three-phase inverter circuit 240 controls a power drive unit 241 electrically connected to the U-phase, V-phase, and W-phase coils of a three-phase AC motor (hereinafter simply referred to as "motor 247"), a gate drive circuit 245 for controlling the power drive unit 241, and a converter unit 246 connected to the power drive unit 241 and a power supply ES. The converter unit 246 has a positive power terminal EP and a negative power terminal EN.

The power drive unit 241 controls electric power to be supplied to the U-phase, V-phase, and W-phase coils of the motor 247. The power drive unit 241 includes a U-phase inverter unit 242, a V-phase inverter unit 243, and a W-phase inverter unit 244. The U-phase inverter unit 242, the V-phase inverter unit 243, and the W-phase inverter unit 244 are connected in parallel to each other between the positive power terminal EP and the negative power terminal EN.

The U-phase inverter unit 242 includes an upper switching element 242U and a lower switching element 242L. The drain terminal of the upper switching element 242U is electrically connected to the positive power terminal EP. The source terminal of the upper switching element 242U and the drain terminal of the lower switching element 242L are electrically connected. The source terminal of the lower switching element 242L is connected to the negative power terminal EN. A snubber diode 242A is connected in anti-parallel to the upper switching element 242U, and a snubber diode 242B is connected anti-parallel to the lower switching element 242L. More specifically, the anode of the snubber diode 242A is electrically connected to the source terminal of the upper switching element 242U, and the cathode of the snubber diode 242A is electrically connected to the drain terminal of the upper switching element 242U. The anode of the snubber diode 242B is electrically connected to the source terminal of the lower switching element 242L and the cathode of the snubber diode 242B is electrically connected to the drain terminal of the lower switching element 242L.

The V-phase inverter unit 243 includes an upper switching element 243U and a lower switching element 243L. The drain terminal of the upper switching element 243U is electrically connected to the positive power terminal EP. The source terminal of the upper switching element 243U and the drain terminal of the lower switching element 243L are electrically connected. The source terminal of the lower switching element 243L is connected to the negative power terminal EN. The snubber diode 243A is connected in anti-parallel to the upper switching element 243U, and the snubber diode 243B is connected in anti-parallel to the lower switching element 243L. More specifically, the anode of the snubber diode 243A is electrically connected to the source terminal of the upper switching element 243U, and the cathode of the snubber diode 243A is electrically connected to the drain terminal of the upper switching element 243U. The anode of the snubber diode 243B is electrically connected to the source terminal of the lower switching element 243L and the cathode of the snubber diode 243B is electrically connected to the drain terminal of the lower switching element 243L.

The W-phase inverter unit 244 includes an upper switching element 244U and a lower switching element 244L. The drain terminal of the upper switching element 244U is electrically connected to the positive power terminal EP. The source terminal of the upper switching element 244U and the drain terminal of the lower switching element 244L are electrically connected. The source terminal of the lower switching element 244L is connected to the negative power terminal EN. A snubber diode 244A is connected in anti-parallel to the upper switching element 244U, and a snubber diode 244B is connected in anti-parallel to the lower switching element 244L. More specifically, the anode of the snubber diode 244A is electrically connected to the source terminal of the upper switching element 244U, and the cathode of the snubber diode 244A is electrically connected to the drain terminal of the upper switching element 244U. The anode of the snubber diode 244B is electrically connected to the source terminal of the lower switching element 244L and the cathode of the snubber diode 244B is electrically connected to the drain terminal of the lower switching element 244L.

The gate drive circuit 245 is electrically connected to the gate terminals of the switching elements 242U, 242L, 243U, 243L, 244U, 244L. The gate drive circuit 245 controls turning on and off of the switching elements 242U, 242L, 243U, 243L, 244U, 244L.

In the three-phase inverter circuit 240 described above, the power module 1 can be applied to at least one of the U-phase inverter unit 242, the V-phase inverter unit 243, and the W-phase inverter unit 244. In a case where the power module 1 is applied to the U-phase inverter unit 242, the positive power terminal EP and the negative power terminal EN are electrically connected to the first input terminal P and the second input terminal N of the power module 1, respectively, and the gate drive circuit 245 is electrically connected to the first upper control terminal GU1 and the first lower control terminal GL1. The output terminal O of the power module 1 is electrically connected to a U-phase coil of the motor 247. In addition, a case where the power module 1 is applied to the V-phase inverter unit 243 and a case where the power module 1 is applied to the W-phase inverter unit 244 are similar to the case where the power module 1 is applied to the U-phase inverter unit 242. The output terminal O of the power module 1 constituting the V-phase inverter unit 243 is electrically connected to the V-phase coil of the motor 247. The output terminal O of the power module 1 configuring the W-phase inverter unit 244 is electrically connected to the W-phase coil of the motor 247. The power module 1 is not limited to an inverter circuit, and may be applied to a converter circuit.

Additional Concept

Next, technical ideas that can be grasped from each of the embodiments and each of the above modified examples will be described.

Additional Concept A1

A power drive circuit including: an upper switching element formed by a wide-gap semiconductor and including a first upper terminal, a second upper terminal, and an upper control terminal; a lower switching element formed by a wide-gap semiconductor and including a first lower terminal, a second lower terminal, and a lower control terminal; an upper diode formed by a wide-gap semiconductor and including an anode connected to the second upper terminal and a cathode connected to the first upper terminal; a lower diode formed by a wide-gap semiconductor and including an anode connected to the second lower terminal and a cathode connected to the first lower terminal; and a control drive circuit electrically connected to the upper control terminal of the upper switching element and the lower control terminal of the lower switching element and controlling the upper switching element and the lower switching element, wherein a forward threshold voltage of the upper diode is lower than a forward threshold voltage of a body diode of the upper switching element and a forward threshold voltage of the lower diode is lower than a forward threshold voltage of a body diode of the lower switching element, and the control drive circuit causes the upper switching element and the lower switching element to perform synchronous rectification.

Additional Concept A2

The power drive circuit according to additional concept A1, wherein a tolerable DC rated current of the upper diode is less than a tolerable DC rated current of the upper switching element, and the tolerable DC rated current of the lower diode is less than the tolerable DC rated current of the lower switching element.

Additional Concept B1

A control method of a power module including: an upper switching element formed by a wide-gap semiconductor and including a first upper terminal, a second upper terminal, and an upper control terminal; a lower switching element formed by a wide-gap semiconductor and including a first lower terminal, a second lower terminal, and a lower control terminal; an upper diode formed by a wide-gap semiconductor and including an anode connected to the second upper terminal and a cathode connected to the first upper terminal; a lower diode formed by a wide-gap semiconductor and including an anode connected to the second lower terminal and a cathode connected to the first lower terminal; and a control drive circuit electrically connected to the upper control terminal of the upper switching element and the lower control terminal of the lower switching element and controlling the upper switching element and the lower switching element, the control method synchronously rectifying the upper switching element and the lower switching element so that a forward threshold voltage of the upper diode is lower than a forward threshold voltage of the body diode of the upper switching element and a forward threshold voltage of the lower diode is lower than a forward threshold voltage of a body diode of the lower switching element.

DESCRIPTION OF REFERENCE CHARACTERS 1) power module, 10) semiconductor device, 11) upper switching element, 11a) body diode, 11d) drain terminal (first upper terminal), 11s) source terminal (second upper terminal), 11g) gate terminal (upper control terminal), 12) lower switching element, 12a) body diode, 12d) drain terminal (first lower terminal), 12s) source terminal (second lower terminal), 12g) gate terminal (lower control terminal), 13) upper capacitor, 14) lower capacitor, 20) substrate, 21) ceramic substrate (supporting substrate), 22) output wiring portion, 23) first input wiring portion, 24) second input wiring portion, 25) first upper control wiring portion (upper control wiring portion), 26) second upper control wiring portion, 27) first lower control wiring portion (lower control wiring portion), 28) second lower control wiring portion, 30) first input terminal member, 31) second input terminal member, 32) output terminal member, 33) first upper control terminal member, 34) second upper control terminal member, 35) first lower control terminal member, 36) second lower control terminal member, 37) upper island portion, 38) lower island portion, 39U) upper connecting wire, 39L) lower connecting wire, 40) encapsulation resin, 44) upper power wire (upper power connecting member), 45) upper control wire (upper control connecting member), 46) lower power wire (lower power connecting member), 47) lower control wire (lower control connecting member), 71) upper diode, 72) lower diode, 80) substrate, 81) ceramic substrate (supporting substrate), 81a) main body portion, 81b) back-surface metal layer (first back-surface side metal layer, second back-surface side metal layer), 81c) front-surface metal layer (first front-surface side metal layer, second front-surface side metal layer), 82) graphite substrate, 82A) first substrate, 82B) second substrate, 82a) main body portion, 82b) back-surface metal layer, 82c) front-surface metal layer, 83) first input terminal member, 84) second input terminal member (input terminal member), 84a) first connecting portion, 84b) second connecting portion, 84c) third connecting portion, 84d) fourth connecting portion, 84e) fifth connecting portion, 85) output terminal member, 88A) first upper control terminal member, 88B) second upper control terminal member, 89A) first lower control terminal member, 89B) second lower control terminal member, 90) encapsulation resin, 91) upper diode wire (upper diode connecting member), 92) lower diode wire (lower diode connecting member), 130) upper MIS transistor (upper switching element), 131) lower MIS transistor (lower switching element), 180) gate resistor (upper control resistor), 181) gate resistor (lower control resistor), GU2) second upper control terminal, GL2) second lower control terminal

The invention claimed is:
1. A semiconductor device comprising:
an upper switching element formed by a wide-gap semiconductor and including a first upper terminal, a second upper terminal, and an upper control terminal;
a lower switching element formed by a wide-gap semiconductor and including a first lower terminal, a second lower terminal, and a lower control terminal;
an upper capacitor provided between the first upper terminal and the upper control terminal separately from the upper switching element; and
a lower capacitor provided between the first lower terminal and the lower control terminal separately from the lower switching element, wherein
the second upper terminal and the first lower terminal are electrically connected, the upper capacitor is configured to increase in capacitance in a case where a voltage between the first upper terminal and the second upper terminal becomes a positive value, and the lower capacitor is configured to increase in capacitance in a case where a voltage between the first lower terminal and the second lower terminal becomes a positive value.

2. The semiconductor device according to claim 1, further comprising:

an upper control resistor provided separately from the upper switching element and electrically connected to the upper control terminal; and a lower control resistor provided separately from the lower switching element and electrically connected to the lower control terminal, wherein a first terminal of the upper control resistor is connected to the upper control terminal, and a second terminal of the upper control resistor is connected to the upper capacitor, and a first terminal of the lower control resistor is connected to the lower control terminal, and a second terminal of the lower control resistor is connected to the lower capacitor.

3. The semiconductor device according to claim 2, wherein a plurality of the upper switching elements and a plurality of the lower switching elements are provided, the upper switching elements are connected in parallel to each other, the lower switching elements are connected in parallel to each other, upper control terminals of the upper switching elements are connected to each other, lower control terminals of the lower switching elements are connected to each other, the upper capacitor connects first upper terminals shared by the upper switching elements and the upper control terminals shared by the upper switching elements, and the lower capacitor connects first lower terminals shared by the lower switching elements and the lower control terminals shared by the lower switching elements.

4. The semiconductor device according to claim 1, further comprising:

an upper diode having an anode connected to the second upper terminal and a cathode connected to the first upper terminal; and a lower diode having an anode connected to the second lower terminal and a cathode connected to the first lower terminal.

5. The semiconductor device according to claim 4, wherein a forward threshold voltage of the upper diode is lower than a forward threshold voltage of a body diode of the upper switching element, and a forward threshold voltage of the lower diode is lower than a forward threshold voltage of a body diode of the lower switching element.

6. The semiconductor device according to claim 5, wherein a tolerable DC rated current of the upper diode is less than a tolerable DC rated current of the body diode of the upper switching element, and a tolerable DC rated current of the lower diode is less than a tolerable DC rated current of the body diode of the lower switching element.

7. The semiconductor device according to claim 1 further comprising:

a second upper control terminal provided separately from the upper control terminal and electrically connected to the second upper terminal; and a second lower control terminal provided separately from the lower control terminal and electrically connected to the second lower terminal.

8. The semiconductor device according to claim 1, wherein each of the upper switching element and the lower switching element is a SiC MOSFET.

9. A power module comprising:

a substrate;

an upper switching element mounted on the substrate, formed by a wide-gap semiconductor, and including a first upper terminal, a second upper terminal, and an upper control terminal;

a lower switching element mounted on the substrate, formed by a wide-gap semiconductor, and including a first lower terminal, a second lower terminal, and a lower control terminal;

an upper capacitor provided between the first upper terminal and the upper control terminal separately from the upper switching element;

a lower capacitor provided between the first lower terminal and the lower control terminal separately from the lower switching element; and an encapsulation resin encapsulating the upper switching element, the lower switching element, the upper capacitor, and the lower capacitor, wherein the second upper terminal and the first lower terminal are electrically connected, the upper capacitor is configured to increase in capacitance in a case where a voltage between the first upper terminal and the second upper terminal becomes a positive value, and the lower capacitor is configured to increase in capacitance in a case where a voltage between the first lower terminal and the second lower terminal becomes a positive value.

10. The power module according to claim 9, wherein:

the substrate includes an output wiring portion, a first input wiring portion serving as a positive side, a second input wiring portion serving as a negative side, an upper control wiring portion, and a lower control wiring portion;

the upper switching element is mounted on the first input wiring portion, the second upper terminal and the output wiring portion are electrically connected by an upper power connecting member, and the upper control terminal and the upper control wiring portion are connected by an upper control connecting member;

the lower switching element is mounted on the output wiring portion, the first upper terminal and the second input wiring portion are electrically connected by a lower power connecting member, and the lower control terminal and the lower control wiring portion are connected by a lower control connecting member;

the upper capacitor is electrically connected to the first input wiring portion and the upper control wiring portion; and the lower capacitor is electrically connected to the output wiring portion and the lower control wiring portion.

11. The power module according to claim 10, wherein a plurality of the upper switching elements and a plurality of the lower switching elements are provided, the upper switching elements are mounted on the first input wiring portion so as to be connected in parallel, the lower switching elements are mounted on the output wiring portion so as to be connected in parallel, the second upper terminal of each of the upper switching elements is electrically connected to the output wiring portion by the upper power connecting member, the second lower terminal of each of the lower switching elements is electrically connected to the second input wiring portion by the lower power connecting member, the upper control terminal of each of the upper switching elements is electrically connected to the upper control wiring portion by the upper control connecting member, and the lower control terminal of each of the lower switching elements is electrically connected to the lower control wiring portion by the lower control connecting member.

12. The power module according to claim 11, wherein:

the substrate includes a supporting substrate provided with the output wiring portion, the first input wiring portion, the second input wiring portion, the upper control wiring portion, and the lower control wiring portion;

a terminal member protruding from the supporting substrate is attached to each of the output wiring portion, the first input wiring portion, the second input wiring portion, the upper control wiring portion, and the lower control wiring portion;

the output wiring portion is arranged so as to be sandwiched between the first input wiring portion and the second input wiring portion in a second direction orthogonal to a first direction in a plan view of the power module;

the upper control wiring portion is arranged on a side of the first input wiring portion opposite to the output wiring portion, and the lower control wiring portion is arranged on a side of the second input wiring portion opposite to the output wiring portion;

the upper switching elements are mounted on the first input wiring portion spaced apart from each other in the first direction; and the lower switching elements are mounted on the output wiring portion spaced apart from each other in the first direction.

13. The power module according to claim 9, wherein each of the upper switching element and the lower switching element is a SiC MOSFET.

14. A power module comprising:

an upper switching element formed by a wide-gap semiconductor and including a first upper terminal, a second upper terminal, and an upper control terminal;

a lower switching element formed by a wide-gap semiconductor and including a first lower terminal, a second lower terminal, and a lower control terminal;

an upper diode formed by a wide-gap semiconductor and including an anode connected to the second upper terminal and a cathode connected to the first upper terminal;

a lower diode formed by a wide-gap semiconductor and including an anode connected to the second lower terminal and a cathode connected to the first lower terminal; and a substrate on which the upper switching element, the lower switching element, the upper diode, and the lower diode are mounted, wherein a forward threshold voltage of the upper diode is lower than a forward threshold voltage of a body diode of the upper switching element, and a tolerable DC rated current of the upper diode is less than a tolerable DC rated current of the body diode of the upper switching element, and a forward threshold voltage of the lower diode is lower than a forward threshold voltage of a body diode of the lower switching element, and a tolerable DC rated current of the lower diode is less than a tolerable DC rated current of the body diode of the lower switching element.

15. The power module according to claim 14, wherein:

a plurality of the upper switching elements, a plurality of the lower switching elements, a plurality of the upper diodes, and a plurality of the lower diodes are provided;

the upper diodes are smaller in number than the upper switching elements; and the lower diodes are smaller in number than the lower switching elements.

16. The power module according to claim 15, wherein the substrate includes a graphite substrate.

17. The power module according to claim 16, wherein:

the graphite substrate includes a first substrate on which the upper switching elements and the upper diodes are mounted and a second substrate on which the lower switching elements and the lower diodes are mounted;

the first substrate and the second substrate are arranged next to each other in a first direction of the power module;

the first substrate and the second substrate are formed to be rectangular so that a second direction orthogonal to the first direction is a longitudinal direction in a plan view of the power module;

the upper switching elements and the upper diodes are mounted on the first substrate spaced apart from each other in the second direction;

the lower switching elements and the lower diodes are mounted on the second substrate spaced apart from each other in the second direction;

the first substrate is configured so that thermal conductivity of the first substrate in the second direction is lower than thermal conductivity of the first substrate in the first direction; and the second substrate is configured so that thermal conductivity of the second substrate in the second direction is lower than thermal conductivity of the second substrate in the first direction.

18. The power module according to claim 17, wherein the upper switching element is connected to the substrate by an upper power connecting member, the lower switching element is connected to the substrate by a lower power connecting member, the upper diode is connected to the substrate by an upper diode connecting member, the lower diode is connected to the substrate by a lower diode connecting member, inductance of the upper diode connecting member is smaller than inductance of the upper power connecting member, and inductance of the lower diode connecting member is smaller than inductance of the lower power connecting member.

19. The power module according to claim 18, wherein the upper diode connecting members and the upper power connecting members are equal in number, a length of the upper diode connecting member is shorter than a length of the upper power connecting member,
the lower diode connecting members and the lower power connecting members are equal in number, and
a length of the lower diode connecting member is shorter than a length of the lower power connecting member.

20. The power module according to claim 17, wherein
the upper switching elements and the lower switching elements are alternately arranged in the second direction,
the power module further comprising an input terminal member facing the first substrate spaced apart in a thickness direction of the power module, wherein
the input terminal member includes a plurality of connecting portions,
the connecting portions are arranged between the upper switching elements in the second direction facing lower switching elements in the first direction,
a second upper terminal of each of the upper switching elements is electrically connected to the second substrate by an upper power connecting member, and
a second lower terminal of each of the lower switching elements is electrically connected to the connecting portion facing the lower switching element in the first direction by a lower power connecting member.

21. The power module according to claim 20, wherein
the upper diodes and the lower diodes are alternately arranged in the second direction,
the connecting portions are arranged between the upper diodes in the second direction facing the lower diodes in the first direction,
an anode of each of the upper diodes is electrically connected to the second substrate by an upper diode connecting member, and
an anode of each of the lower diodes is electrically connected to the connection portions facing the lower diode in the first direction by a lower diode connecting member.

22. The power module according to claim 21, wherein
the upper switching elements and the upper diodes are alternately arranged in the second direction, and
the lower switching elements and the lower diodes are alternately arranged in the second direction.

23. The power module according to claim 14, wherein
the upper diode is incorporated in the upper switching element, and
the lower diode is incorporated in the lower switching element.

24. The power module according to claim 23, wherein
a plurality of the upper switching elements and a plurality of the lower switching elements are provided,
the substrate includes a graphite substrate,
the graphite substrate includes a first substrate on which the upper switching elements are mounted and a second substrate on which the lower switching elements are mounted,
the first substrate and the second substrate are arranged next to each other in a first direction of the power module,
the first substrate and the second substrate are formed to be rectangular so that a second direction orthogonal to the first direction is a longitudinal direction in a plan view of the power module,
the upper switching elements are mounted on the first substrate spaced apart from each other in the second direction,
the lower switching elements are mounted on the second substrate spaced apart in the second direction,
the first substrate is configured so that thermal conductivity of the first substrate in the second direction is lower than thermal conductivity of the first substrate in the first direction, and
the second substrate is configured so that thermal conductivity of the second substrate in the second direction is lower than thermal conductivity of the second substrate in the first direction.

25. The power module according to claim 24, wherein
a first front-surface side metal layer is provided on a front surface of the first substrate on which the upper switching elements and the upper diodes are arranged,
a first back-surface side metal layer is provided on a back surface of the first substrate opposite to the front surface of the first substrate,
a second front-surface side metal layer is provided on a front surface of the second substrate on which the lower switching elements and the lower diodes are arranged, and
a second back-surface side metal layer is provided on a back surface of the second substrate opposite to the front surface of the second substrate.

26. The power module according to claim 24, wherein
a plurality of the upper switching elements and a plurality of the lower switching elements are provided,
the upper switching elements and the lower switching elements are alternately arranged in the second direction,
the power module further comprising an input terminal member spaced apart from and facing the first substrate in a thickness direction of the power module,
the input terminal member includes a plurality of connecting portions,
the connecting portions are arranged between the upper switching elements in the second direction facing the lower switching elements in the first direction,
the second upper terminal of each of the upper switching elements is electrically connected to the second substrate by an upper power connecting member, and
the second lower terminal of each of the lower switching elements is electrically connected to the connecting portion facing the lower switching element in the first direction by a lower power connecting member.

27. A power module comprising:
a switching element formed by a wide-gap semiconductor and including a first terminal, a second terminal, and a control terminal;
a diode formed by a wide-gap semiconductor and including an anode connected to the second terminal and a cathode connected to the first terminal; and
a substrate on which the switching element and the diode are mounted,
wherein a forward threshold voltage of the diode is lower than a forward threshold voltage of a body diode of the switching element, and a tolerable DC rated current of the diode is less than a tolerable DC rated current of the body diode of the switching element.

* * * * *